(12) United States Patent
Boutin et al.

(10) Patent No.: US 7,441,225 B2
(45) Date of Patent: Oct. 21, 2008

(54) METHOD AND DEVICE FOR SYNTHESISING AN ELECTRICAL ARCHITECTURE

(75) Inventors: Samuel Boutin, Magny les Hameaux (FR); Christophe Dang Van Nhan, Villejuif (FR)

(73) Assignee: Renault S.A.S., Boulogne Billancourt (FR)

(*) Notice: Subject to any disclaimer, the term of this patent is extended or adjusted under 35 U.S.C. 154(b) by 387 days.

(21) Appl. No.: 10/532,105

(22) PCT Filed: Oct. 21, 2003

(86) PCT No.: PCT/FR03/03107

§ 371 (c)(1),
(2), (4) Date: Oct. 12, 2005

(87) PCT Pub. No.: WO2004/038617

PCT Pub. Date: May 6, 2004

(65) Prior Publication Data

US 2006/0143587 A1    Jun. 29, 2006

(30) Foreign Application Priority Data

Oct. 21, 2002    (FR)    ................................... 02 13112

(51) Int. Cl.
G06F 17/50    (2006.01)
(52) U.S. Cl. ........................ 716/18; 703/1; 703/7; 703/8
(58) Field of Classification Search ............. 716/12–15, 716/18; 703/1, 7, 8, 13, 14
See application file for complete search history.

(56) References Cited

U.S. PATENT DOCUMENTS 5,452,218 A    9/1995    Tucker et al.

(Continued)

FOREIGN PATENT DOCUMENTS

EP    0 696 775    2/1996

(Continued)

OTHER PUBLICATIONS

Alibozek, Tim. "Smart software builds a better harness", Machine Design, vol. 70, No. 8, pp. 89-92, XP001092826 1998.

(Continued)

*Primary Examiner*—Thuan Do
*Assistant Examiner*—Nghia M Doan
(74) *Attorney, Agent, or Firm*—Oblon, Spivak, McClelland, Maier & Neustadt, P.C.

(57) ABSTRACT

A method of synthesizing an electrical or electronic architecture of at least one part of a product including electrical wires and electrical and electronic components, such as sensors, actuators, and computing devices. In the method: the geometry of the product, which is divided into different zones, is represented two-dimensionally; routing points for the routing of the electrical wires are positioned in the different zones; connection points are positioned between the different zones; electrical and electronic components are positioned in the zones; a routing is synthesized according to the geometry of the different zones and the positions of the routing points, the connection points, and the components; the routing is assessed and, using the result of the assessment, the positions of the routing points, connection points, and/or electrical and electronic components are altered; and the synthesis and assessment are repeated.

36 Claims, 19 Drawing Sheets

Figure 1:
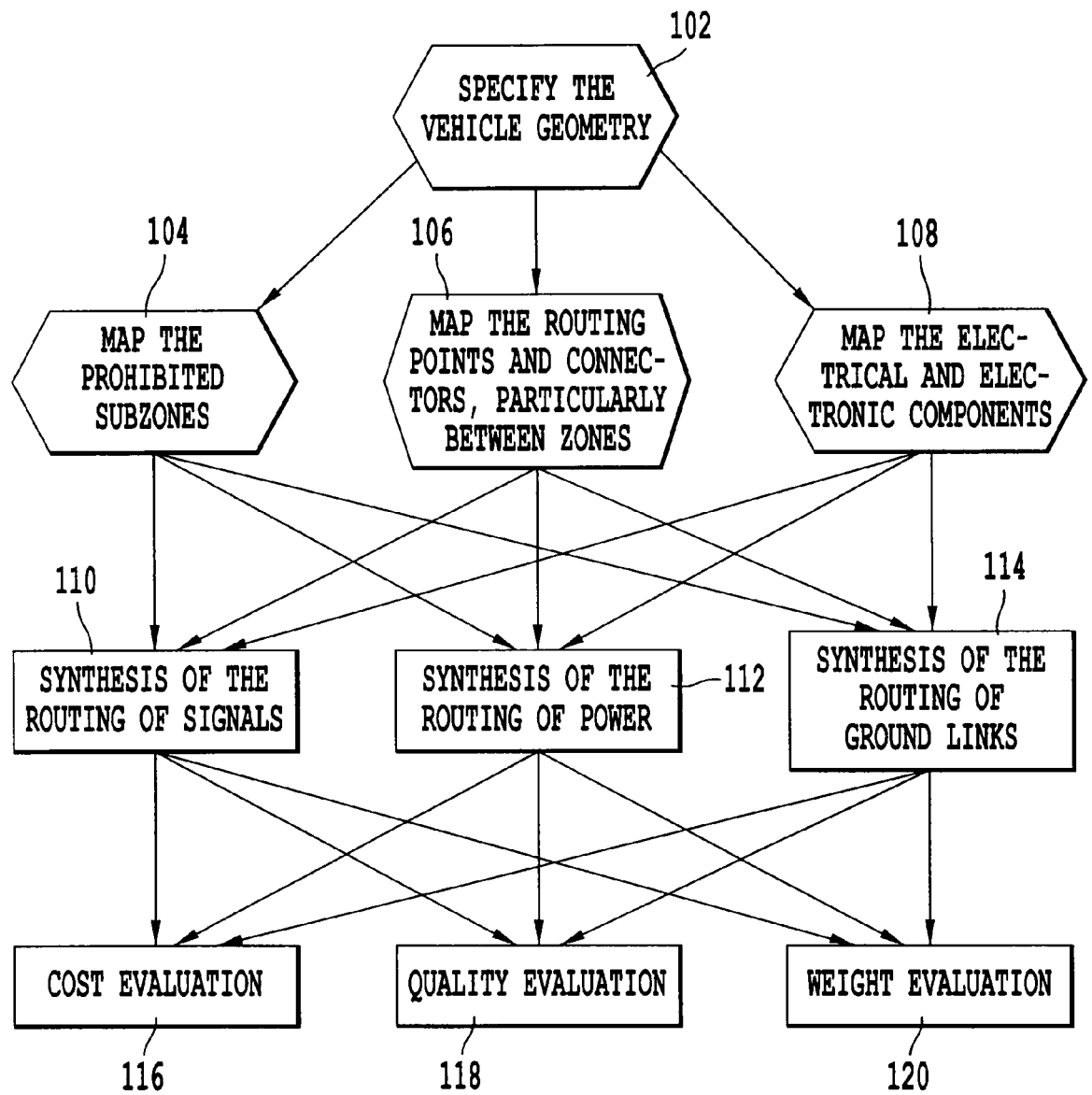

U.S. PATENT DOCUMENTS 5,740,341 A * 4/1998 Oota et al. .................. 345/420
6,457,165 B1 * 9/2002 Ishikawa et al. .............. 716/12
7,107,197 B1 * 9/2006 Shropshire ................... 703/13
7,200,537 B2 * 4/2007 Ozaki ............................ 703/7

FOREIGN PATENT DOCUMENTS

FR        2 775 806        9/1999
WO        02/059801        8/2002

OTHER PUBLICATIONS

Moretti, Gabe. "Cable and harness EDA enables advanced electrical-system design", EDN Electrical Design News, vol. 46, No. 7, pp. 103-104, 106, 108, 110, XP008011655 2001.

* cited by examiner

METHOD AND DEVICE FOR SYNTHESISING AN ELECTRICAL ARCHITECTURE

The present invention relates to a method and a device for synthesizing an electrical architecture and to the applications of this method to a vehicle.

The routing of electrical wires in a product such as a vehicle can be represented in two or three dimensions by means of commercial tools. In this case, the user must trace each wire from one contact or pin of one connector to another. When means of touching up the routing exist, they are rudimentary. European Patent 0696775A1 describes a method for designing a 3-D cabling by starting from a 2-D logical representation already containing a cabling topology, the cables extending from one connector another being already represented. This 2-D topology is a prerequisite.

The objective of the present invention is in particular to make possible the routing of all or some of the wires of an electrical-electronic architecture, even if the product geometry is not yet known precisely, although it is known how to divide it into zones that, for example, can be assembled during manufacture of the said product. The present invention also envisions remedying these disadvantages in order to gain time during synthesis and during evaluation of electrical and electronic architectures.

To this end, the present invention envisions, according to a first aspect, a method for synthesizing an electrical and electronic architecture of at least part of a product comprising electrical wires and electrical and electronic components such as sensors, actuators and calculators, characterized in that it comprises the following steps:
- the geometry of the product, divided into different zones, is represented in two dimensions;
- routing points for routing of electrical wires are mapped into the different zones;
- connecting points are mapped between the different zones;
- the electrical and electronic components are mapped into the zones;
- a routing synthesis is undertaken as a function of the geometry of the different zones and of the positions of the routing points, of the connecting points and of the components;
- an evaluation of this routing is undertaken and depending on the result of this evaluation
- the sites of the routing points, of connecting points and/or of electrical and electronic components are modified and the steps of synthesis and evaluation are repeated.

In the present invention, a 2-D topology is a result of the method. Also, according to the present invention, the pathways are generated automatically. By virtue of these provisions, the routing is optimized by iteration.

According to particular characteristics, at least one connecting point corresponds, in the product, to one connector and/or at least one routing point corresponds, in the product, to one connector.

By virtue of these provisions, the connectors are taken into account and dimensioned.

According to particular characteristics, there are defined in the interior of the said zones prohibited subzones into which there must not be mapped any wire, component or connector and, in the course of the synthesis step, wires are not allowed to pass through a prohibited subzone. By virtue of these provisions, the representation is more faithful and takes into consideration the space requirement of certain product zones.

According to particular characteristics, before the electrical and electronic components are mapped, at least one of the following choices is made:
- choice of electronic control units,
- choice of communication networks,
- choice of sensors and actuators,
- choice of fuse and relay boxes,
- choice of an electrical and electronic architecture.

According to particular characteristics, before the routing synthesis is undertaken, characteristics are specified for the electrical and electronic components.

According to particular characteristics, after synthesis of the routing, the cabling composed of the synthesized routing and of connectors is visually displayed.

By virtue of these provisions, the mapping of the routing points can be perfected by simplifying the geometry of the strands.

According to particular characteristics, the method contains a step of validation of one routing among those evaluated, and calculation of a technical specification is undertaken for the cabling composed of the validated synthesized routing and of connectors, and subsequently there is undertaken the calculation of the technical specification, the calculation of a cabling cost and/or the calculation of a quality measure, for example by estimation of the number of breakdowns per million and per year of the cabling.

By virtue of these provisions, the designer can compare different architecture solutions and transmit the specification of the adopted architecture to the development and perfecting team.

According to particular characteristics, the product is a vehicle and the different zones of the vehicle contain at least one of the following zones:
- the zone of the front face,
- the zone of the hood,
- the zone of the instrument panel,
- the zone of the roof,
- the zone of the trunk and tailgate, above and below the foregoing zones,
- the zone of the right front fender and of the left front fender,
- the zone of the right front door and of the left front door,
- the zone of the right column and of the left column,
- the zone of the right rear door and of the left rear door,
- the zone of the right rear fender and of the left rear fender, between the zone of the instrument panel and those of the right front fender and of the left front fender, the zones of the right front column and of the left front column, between the zone of the trunk and those of the right rear fender and of the left rear fender, the zones of the right rear column and of the left rear column,
- a zone above the floorboard and
- a zone below the floorboard.

By virtue of these provisions, the method can be applied to a motor vehicle.

According to a second aspect, the present invention envisions a system architecture design tool, characterized in that it comprises a plurality of screens, each containing:
- a hierarchical description of the system, at least one of the levels of the hierarchy representing services offered to users, and
- when an element of the hierarchical description is selected, a synthetic view of at least part of the interface of this element with the rest of the system.

By virtue of these provisions, the user of the design tool directly takes into account the services offered to clients by accessing them in the said screens and observing synthetic views associated with these services. It is recalled here that the services represent functions that benefit a system user, such as the operator of a vehicle having the said system on board. Services are defined by what the user wants (such as activation of the air conditioning, of windshield wipers) or by what is proposed to him (such as passive safety, especially in the case of accidents). They are also defined by sensors and/or actuators that they activate. They each correspond to a sensor/software/actuator hardware implementation, wherein the sensor can be hardware (instrument-panel sensors or pedals, for example). Starting from services, the design tool makes it possible to determine system specifications, interfaces and the composition of the system elements and their communication with the other elements of the system.

According to particular characteristics, the tool contains a selection means known as a "tab" and a hierarchical description, selection of each tab causing a different screen of the tool to appear. By virtue of these provisions, switching from one screen to the other is particularly easy.

According to particular characteristics, for at least one screen, the hierarchical description represents, at a first level of hierarchy, a plurality of services and, at a second level of hierarchy, a plurality of use cases for each service.

By virtue of these provisions, each service is defined by its use cases. For example, the "windshield wiper" service can be defined by use cases of intermittent wiping, of slow wiping and of fast wiping.

According to particular characteristics, for at least one said screen, each use case comprises an initial context or situation of the system, a user's request to the system and a response of the system corresponding to a change of its state.

According to particular characteristics, in at least one screen, states and associated state transitions are defined for each use case of a service.

By virtue of each of these provisions, the use cases are formalized and in direct relationship with the system situations and states and the system user's requests that define the transitions between states.

According to particular characteristics, with at least one screen, the states that function in modes transverse to common services are grouped in "phases", each state is associated with one phase of the system, the set of formalized use cases representing all the responses or absences of response of the system in all phases, these in total representing all combinations of the modes of operation of the vehicle.

By virtue of these provisions, the states are arranged in a hierarchy, thus permitting better readability, because each phase then each phase transition can be considered separately.

According to particular characteristics, each phase is composed of a set of combinations of modes of operation of the vehicle, the modes being transverse to the services and outside the direct control of the services, such as a mode representing an available energy level and/or a type of system user and/or an accident or non-accident condition of a vehicle.

By virtue of these provisions, the definition of phases is normalized and implemented easily, and on the other hand it permits easy reading, because the states are arranged in a hierarchy.

According to particular characteristics, for at least one screen, the hierarchical description represents a plurality of services at a first level of hierarchy and of phases of the service at a second level of hierarchy.

By virtue of these provisions, the description of services is detailed for each of the phases of the system, thus simplifying the work of the tool user.

According to particular characteristics, for at least one screen, the hierarchical description represents a plurality of services at a first level of hierarchy and of states of the service at a second level of hierarchy.

By virtue of these provisions, the description of services is attached to states of the system, thus simplifying the work of the tool user.

According to particular characteristics, within the hierarchical description, a hierarchical level in a given state describes the elementary operations.

By virtue of these provisions, the elementary operations effected by the system are accessible in the hierarchical description and can be edited by the tool user.

According to particular characteristics, for at least one screen, a user can effect mapping of elementary operations onto components represented in a synthetic view.

By virtue of these provisions, the functional aspects of the system can be installed on the hardware components of this system.

According to particular characteristics, the tool contains, for at least one screen, a synthetic view representing an envelope of a component and each elementary operation that the said component controls or instructs.

By virtue of these provisions, the tool user can study the functioning of each component and the specifications that derive from it.

According to particular characteristics, the tool contains, for at least one screen, a synthetic view representing an envelope of a service and each elementary operation that the said service comprises.

By virtue of these provisions, the tool user can study the functioning of each service and the specifications that derive from it.

According to particular characteristics, for at least one screen, at a first level of hierarchy, the hierarchical description represents the calculators of the system and, at a second level of hierarchy, elementary operations electronically monitored or controlled by each calculator.

By virtue of these provisions, the tool user can study the functioning of each calculator and the specifications that derive from it.

According to particular characteristics, for at least one screen, a synthetic view represents, for each calculator, the services that are mapped at least partly onto the said calculator.

By virtue of these provisions, the tool user can study the relationships between the services and the calculators.

According to particular characteristics, for at least one screen, a synthetic view represents, for each calculator, the modes in which the said calculator must function.

By virtue of these provisions, the tool user can study the relationships between the modes and the calculators.

According to particular characteristics, for at least one screen, a synthetic view represents at least one network and the components connected to it.

By virtue of these provisions, the tool user can study the functioning of each network.

According to particular characteristics, for at least one screen, at a first level of hierarchy, the hierarchical description represents the calculators of the system and, at a second level of hierarchy, for each calculator, the data frames being transported on the buses to which the calculator and/or the electronic components (sensors, actuators) directly connected to the calculator are connected.

By virtue of these provisions, the tool user can study each calculator and the interactions that it has with other elements of the system, especially the buses to which it is connected.

According to particular characteristics, for at least one screen, the hierarchical description represents the frames at a first level of hierarchy and, at a second level of hierarchy, for each frame, the data contained in the frames.

By virtue of these provisions, the tool user can detail the electronic messaging system used and establish the relationships between the frames and the data that they contain.

According to particular characteristics, for at least one screen, a synthetic view represents components and/or networks and a projection of a service onto the said components and/or networks.

By virtue of these provisions, the tool user can separately study each service in terms of hardware installation.

According to particular characteristics, for at least one screen, a hierarchical level describes, for each elementary operation, the input and output interface data flows and, for each data flow, the driver and the component and/or the elementary operation with which the data flow is exchanged.

By virtue of these provisions, the toot user can study the detail of implementation of an elementary operation in terms of data flows, drivers and/or components.

According to particular characteristics, for at least one screen, the hierarchical description represents, at a first level of hierarchy, a plurality of services and, at a second level of hierarchy, a plurality of service variants, for each service.

By virtue of these provisions, the tool makes it possible to process different service variants in the design of the architecture of a system.

According to particular characteristics, for at least one screen, the hierarchical description represents, at a first level of hierarchy, a plurality of electronic components and, at a second level of hierarchy, a plurality of variants of electronic components, for each electronic component.

By virtue of these provisions, the tool makes it possible to process different component variants, for example different components of different equipment manufacturers, in the design of the architecture of a system.

According to particular characteristics, for at least one synthetic view, a selection of an element of the synthetic view with a pointing device gives access to a representation of the functioning of the said element.

By virtue of these provisions, the tool user can study the functioning of different elements represented in the synthetic view.

According to particular characteristics, for a use case, given partial or complete mapping of the services, there is automatically identified the set of elementary operations in the architecture as well as the set of data exchanged (frames, sensors, actuators) corresponding to execution of the use case.

By virtue of these provisions, if an error is observed during an integration test, or in other words for a given use case, the components likely to be the origin of the defect can be found.

According to particular characteristics, for a use case, if a performance constraint is imposed on the said use case, there is automatically identified the set of elementary operations in the architecture, the set of frames exchanged, the set of sensors necessary and/or the set of actuators activated, in such a manner as to assign respectively thereto the specific constraints of delay of execution, of delay of transmission or of delay of activation and/or to validate the constraints already imposed.

By virtue of these provisions, it will be possible to decide the constraints of refreshment of the different data exchanged by the elementary operations to which the performance constraint is applied.

According to a third aspect, the present invention envisions a system architecture design tool, characterized in that it is provided, for objects, hardware components and/or services offered to the client, a graphic representation known as "envelope", which contains:

a contour representing the said object,
representations of other objects with which the said object communicates, and
representations of data exchanged with the said other objects.

By virtue of these provisions, the tool user has at his disposal a synthetic view of the interaction of the object with other objects of the system.

According to particular characteristics, when the said envelope represents a hardware component, data representations are effected for a service.

By virtue of these provisions, each hardware-component/service pair can be studied separately.

According to a fourth aspect, the present invention envisions a tool for representation of the system comprising electronic components, each connected to at least one bus, characterized in that it contains, for each bus, a representation of components that are connected directly thereto and, for components directly connected to at least two buses, for each of these buses, associated with the said component, an identifier of each other bus to which the said component is directly connected.

By virtue of these provisions, the tool user has at his disposal a three-dimensional view, without complexity of representation, each bus being represented in two dimensions and the links between the buses being represented according to a third dimension, by virtue of the identifiers.

According to particular characteristics, the said identifier is a graphical element, for example a patch with a color identical to that of the bus in the said representation.

By virtue of these provisions, visual display of the relationships between the buses is easy, by virtue of the visual display of the graphical element.

According to a fifth aspect, the present invention envisions a method for design of a specification of a hardware and software system, characterized in that it comprises:

a step of definition of services and, for each service, use cases;
a step of association of each use case with at least one departure state of the system, a user request and, for each departure state, an arrival state of the system;
a step of definition of operations, in the course of which, for each state, there is defined a set of elementary operations corresponding to the system response during arrival in the said state;
a step of specification of system architecture defining electronic control units and networks;
a step of mapping of elementary operations onto calculators;
and at least one of the following steps:
a step of identification of data flows circulating on the said networks as a function of the said mapping; and
a step of identification of the specification of the calculator interfaces as a function of the said mapping.

By virtue of these provisions, this method makes it possible to start from services offered to the system user, to determine the functioning of the system then to install the elementary operations implementing the services on calculators and to identify the consequences of the installation in terms of data flows and/or in terms of interface specification.

According to particular characteristics, the mapping step comprises, for each service, a choice among a plurality of mapping modes comprising in particular:

mapping of the service onto a single calculator,
master-slave mapping, in which a supplementary elementary operation of control of the single service activates, depending on the state of the service in which the system finds itself, the elementary operations of the service, this supplementary elementary operation being mapped onto one of the calculators, distributed mapping, in which the elementary operations are distributed over at least two calculators and, onto each of the said calculators, a supplementary elementary operation of control of the service is mapped and activates, depending on the state of the service in which the system finds itself, the elementary operations of the service mapped onto the said calculators.

By virtue of these provisions, the mapping of each service can be effected onto one or more components, with corresponding elementary control operations.

According to particular characteristics, the supplementary elementary operations are generated automatically with:

as inputs, all data necessary for calculation of the transitions of the control automaton of the service whose states are the states of the service and the transitions are the transformations, via an elementary operation, of the user's requests and as output, a datum representing the state in which the service finds itself.

By virtue of these provisions, the work of the tool user is greatly simplified.

According to particular characteristics, in the course of the step of identification of data flows, a state of each data flow is determined relative to a given electronic messaging system:

"free" data, to be mapped into frames, data already mapped into a frame and circulating on the network, and such that they are produced in the calculators in which the frame is produced and consumed in the calculators in which the frame is consumed, and unused frame sites.

By virtue of these provisions, the data and the frames can be organized and, during design of the system, the work remaining to be done to cover the entirety of data exchanges by the different frames can be measured.

According to particular characteristics, given a use case, a performance constraint is imposed on the use case as well as on certain of the elementary operations executed in the arrival state of the use case, the tool then automatically synthesizes the list of those executions of elementary operations, executions of drivers, writes and reads in the frames, taking into account of information by sensors and actuators, and frame transfer to a network that are implemented following mapping of the said elementary operations, and the designer can validate that this performance constraint is satisfied for a mapping of the said elementary operations or can specify requirements of delay of execution and/or of response time to satisfy this performance constraint.

By virtue of these provisions, it is possible to ensure that the system will indeed have the expected performances and in particular it is possible to perfect the performance requirements for the diverse components of the system According to particular characteristics, if, for a service having at least two variants, the said variants have shared elementary operations, then the said elementary operations are mapped onto the same calculators or calculator variants.

For example, variants of access to the vehicle, one by key, the other keyless, will share the elementary operations of locking and unlocking By virtue of these provisions, it is possible simultaneously to manage the diversity of services during the mapping step, because there is no need to effect the mapping of an elementary operation several times if it is shared among several service variants.

According to a sixth aspect, the present invention envisions a tool for design of a cabling plan, characterized in that it comprises a plurality of screens, each containing:

a hierarchical description of the hardware components to be mapped a two-dimensional representation of the zones on which the components are mapped.

According to particular characteristics, the two-dimensional representation of the zones on which the components are mapped comprises a global view of all of the zones as well as a means for adding or removing zones.

According to particular characteristics, when a zone is selected in the global view of all zones, a local view of the zone appears, in which local view geometric characteristics of the zone can be specified, for example by clicking and dragging contour points of the zone.

By virtue of these provisions, the zone specification can be faithful to the part that it represents.

According to particular characteristics, it is possible to edit on the local view of a zone routing points, connecting points, prohibited subzones and/or ground points by clicking and dragging an icon of the tool.

By virtue of these provisions, the designer can specify preferential points of passage for routing of wires, which make it possible to form strands, preferential points of passage from one zone to another and prohibited subzones in which, for mechanical or space-requirement reasons, for example, no wire can pass the locations of the zone that can be used as ground.

According to particular characteristics, a routing point or a connecting point between zones can be transformed to a connector by clicking on an attribute of the said routing or connecting point.

By virtue of these provisions, it is possible to specify the siting of connectors, which will make it possible to divide the wires and strands into parts that are sufficiently small or practical for assembly.

According to particular characteristics, it is possible to specify the siting of different electronic components, the fuse and relay boxes, the electronic control units, the sensors and the actuators, particularly by clicking and dragging a representation of the said components in a hierarchical list.

By virtue of these provisions, the designer can specify the site at which these components will be mapped onto different zones of the product According to particular characteristics, the routing of different sensors and actuators up to the different fuse and relay boxes and electronic control units is automatically synthesized.

By virtue of these provisions, it is possible to visually display the cabling and to perfect the positioning of routing and connecting points in order to reduce the lengths and shapes of strands "by sight".

According to particular characteristics, for each sensor and each actuator, there being specified data pins associated with drivers (hardware and software), themselves associated with data, power pins corresponding to the supply and ground pins, the routing of wires corresponding to these wires to the electronic control units or to the fuse and relay boxes for the data, to the fuse and relay boxes for the power wires and to the closest grounds respectively is automatically synthesized.

By virtue of these provisions, there are evaluated the number of connector pins and connectors of electronic control units and fuse and relay boxes, as well as the size of the different strands.

According to particular characteristics, if a sensor or an actuator is connected to a calculator in the system architecture design tool, then, in the course of synthesis of the routing, the data pins of the said sensor or of the said actuator are connected to the said calculator.

By virtue of these provisions, the requirements of linking of a sensor or of an actuator to a calculator, for example for contractual reasons with a supplier, are taken into account in the design of the electrical and electronic architecture.

According to particular characteristics, given a cost function of the connectors, for example based on a nomogram that shows an estimate of the price of the connectors as a function of the number of data, power and ground connections, or based for example on a mean price assigned to each connection of a data, current or ground wire, given an evaluation of the cost of the electronic components, sensors, actuators, electronic control units or fuse and relay boxes given a function of the cost of the wires based for example on their length and type, taking for example a mean linear weight for the power and ground wires, a mean linear weight for the data wires, and a cost per unit mass of the component in which the said wires are manufactured, there is automatically calculated a cost of an electrical and electronic architecture as a function of at least one of the said functions and evaluations.

By virtue of these provisions, it is possible to compare the respective costs of two architectures in order to choose the less expensive.

According to particular characteristics, given a mean cost for the software and hardware drivers of the different drivers and given a cost of implementation of an elementary operation, there is automatically estimated a cost of an electronic control unit or of a fuse and relay box, then of a complete electrical and electronic architecture.

By virtue of these provisions, the cost estimate is automatic starting from any mapping whatsoever executed in the system architecture design tool of a plurality of services for which estimates were made.

According to particular characteristics, given a synthesized routing and given measures of quality for the connectors and the portions of wire of different zones, there is automatically estimated a measure of quality of an electrical and electronic architecture.

By virtue of these provisions, it is possible to evaluate the respective quality of two electrical architectures.

According to particular characteristics, given a measure of quality of the different calculators, sensors and actuators mapped into the different zones, there is automatically estimated the quality of an electrical and electronic architecture.

By virtue of these provisions, it is possible to evaluate the respective quality of two electrical and electronic architectures.

According to particular characteristics, given a measure of quality for each type of inputs/outputs and for each type of wire (power, ground, data), given a measure of quality for execution of an instruction on a calculator, for access to random-access memory and for access to flash memory, there is automatically calculated a measure of quality for execution of an elementary operation and for execution of a set of elementary operations on a calculator.

By virtue of these provisions, the quality of functioning of the calculators in the quality evaluation of an electrical and electronic architecture is precisely taken into account.

According to particular characteristics, there is automatically determined, in each zone, routing points that are candidates for grouping the power and ground wires into splices, and there is automatically chosen that which minimizes the wire length in the said zone.

By virtue of these provisions, the cabling length is optimized and the size of the connectors is minimized.

According to particular characteristics, splices are taken into account in the cost and quality evaluations.

By virtue of these provisions, these evaluations are of better quality

According to a seventh aspect, the present invention envisions a tool for synthesis of an economically optimal routing, characterized in that:

the different configurations of service variants and of calculator variants being specified and the percentage occurrence of these configurations being known, the sum of the proportions of the configurations being equal to one, the cost characteristics of the components being known and weighted as a function of their respective installation proportions, the partial or complete mapping of service variants onto the calculator variants being executed, there is automatically synthesized an economically optimal routing such that, for each sensor and each actuator, the valid routings are identified, the routing cost of the said valid routings is evaluated for each configuration, and the valid routing that minimizes the mean, weighted by the installation proportions of each configuration and the routing costs for each configuration is chosen.

By virtue of these provisions, it is possible to compare the respective costs of two candidate architectures for a product plan by integrating a mix of product lines and options.

According to particular characteristics, the routing of optimal quality is synthesized, characterized in that the foregoing steps are repeated, the criterion for minimization being a measure of quality preferentially expressed in breakdowns per million.

By virtue of these provisions, it is possible to compare the respective measures of quality of two candidate architectures for a produced plan.

According to particular characteristics, the routing of optimal weight is synthesized, characterized in that the foregoing steps are repeated, the criterion for minimization being a measure of quality preferentially expressed in breakdowns per million.

By virtue of these provisions, it is possible to compare the respective weights of two candidate architectures for a produced plan.

According to particular characteristics, there is automatically calculated a cost of assembly of the electrical and electronic architecture as a function of a cost of assembly of a strand on a zone, of a cost of assembly of a connector on a zone boundary or on a zone, of a cost of assembly of a calculator on a zone, of a cost of assembly of a sensor or actuator on a zone and of a cost of connection of a connector between zones or in a zone.

By virtue of these provisions, it is possible to compare the respective assembly costs of two architectures.

According to particular characteristics, there is synthesized the optimal routing for all configurations, by repeating the foregoing steps, the criterion for minimization being a cost composed of:

the estimated recurrent cost of parts, an estimate of the quality cost in anticipation of the cost of repair per zone, this cost being increased by a constant cost depending on the zone and its ease of access, an estimate of the cost of the weight, taking into account mechanical wear and consumption related to an increase of the weight of the vehicle, and/or an estimate of the cost of assembly.

By virtue of these provisions, it is possible to execute an architecture that optimizes the cost relative to a produced plan, and not only relative to a single product variant, and taking all aspects of the design into account.

All operations of the method can be executed by means of a computer.

The method according to the invention can be applied to the synthesis of the electrical architecture of a newly created product. The method according to the invention can also be applied to the synthesis of an electrical architecture that has been modified relative to a previous architecture.

Figure 2:
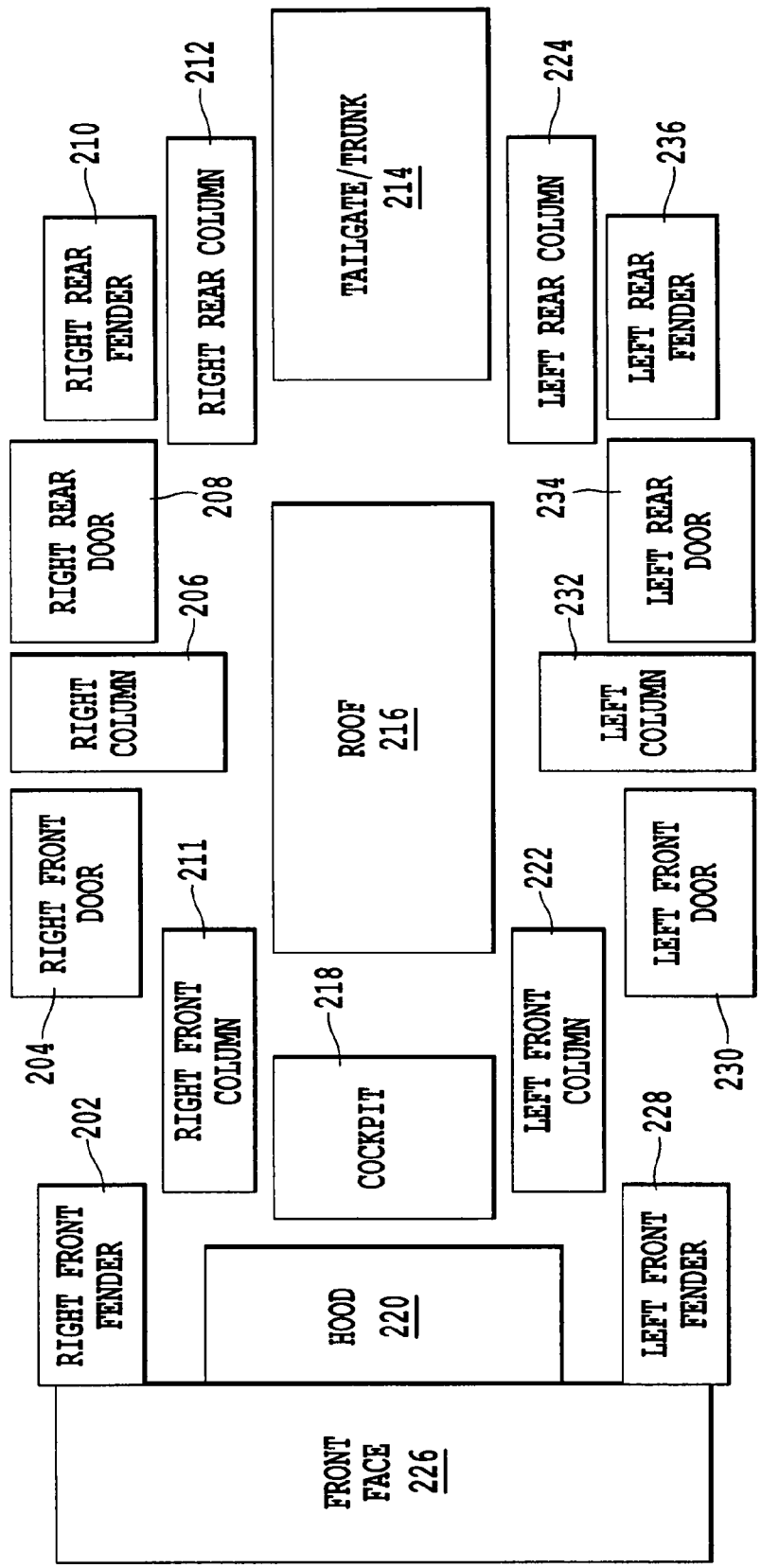
Figure 2:
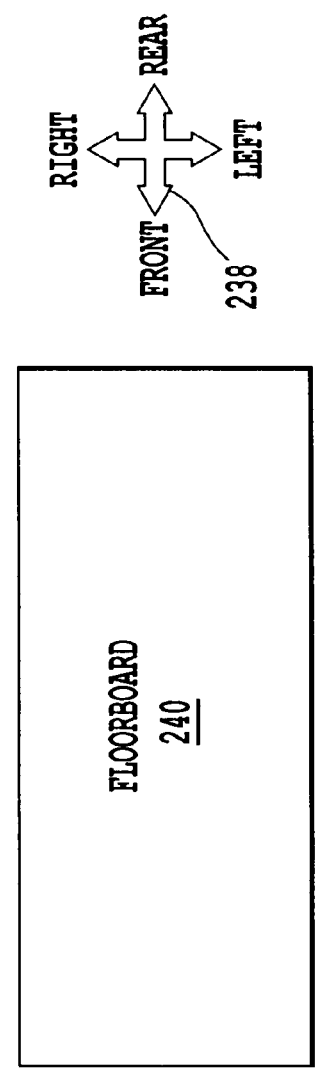
Figure 3:
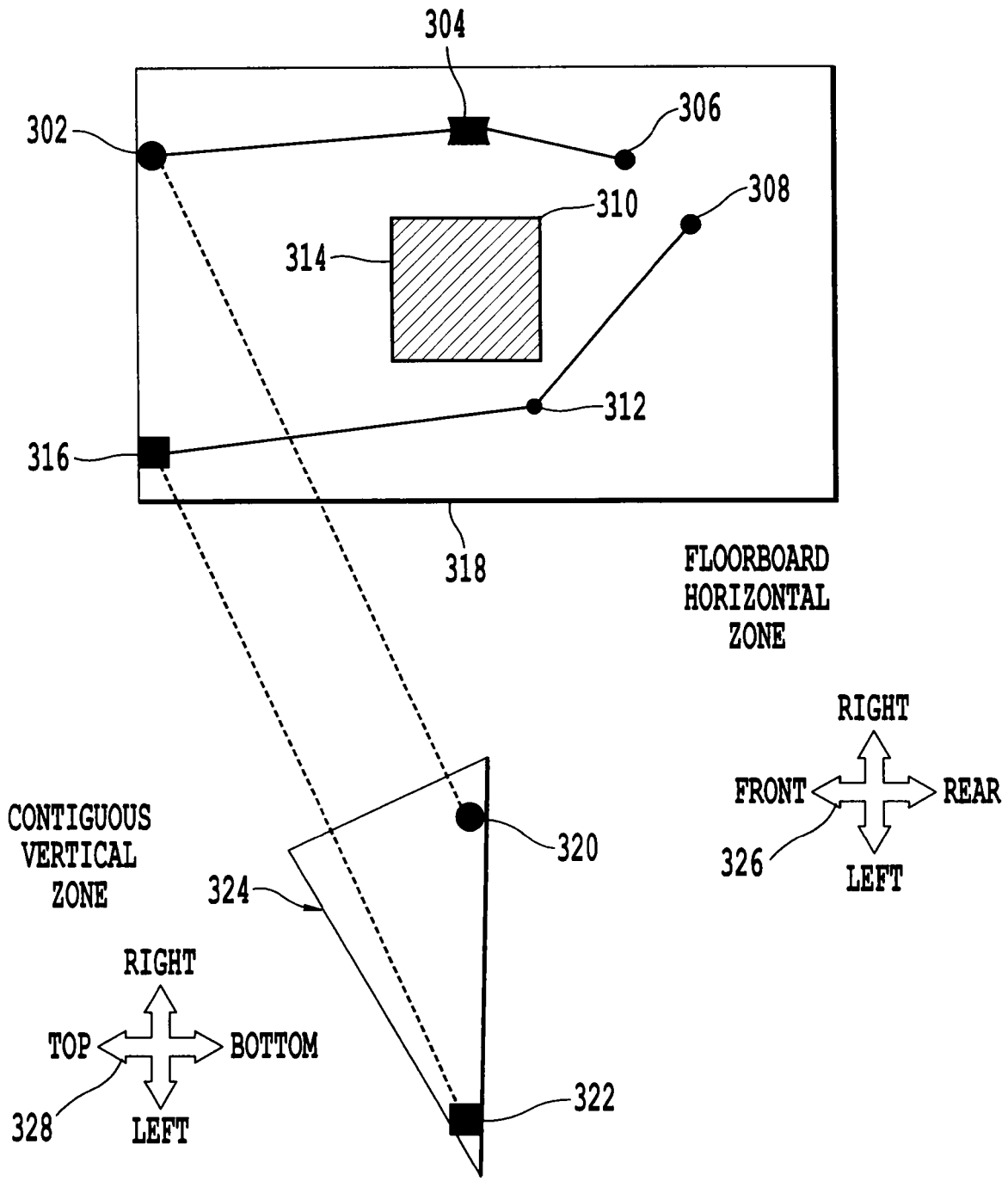
Figure 4:
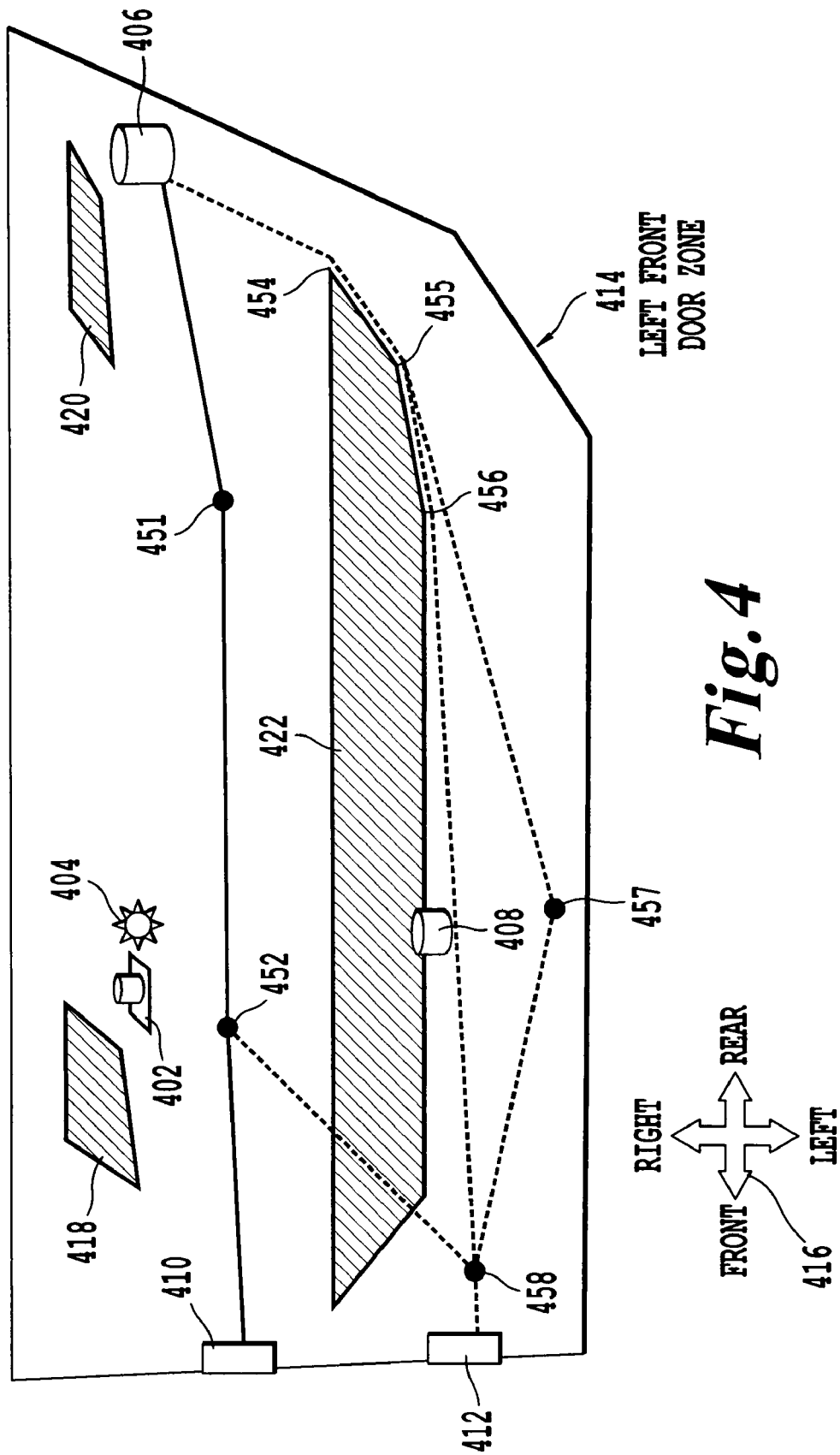
Figure 5:
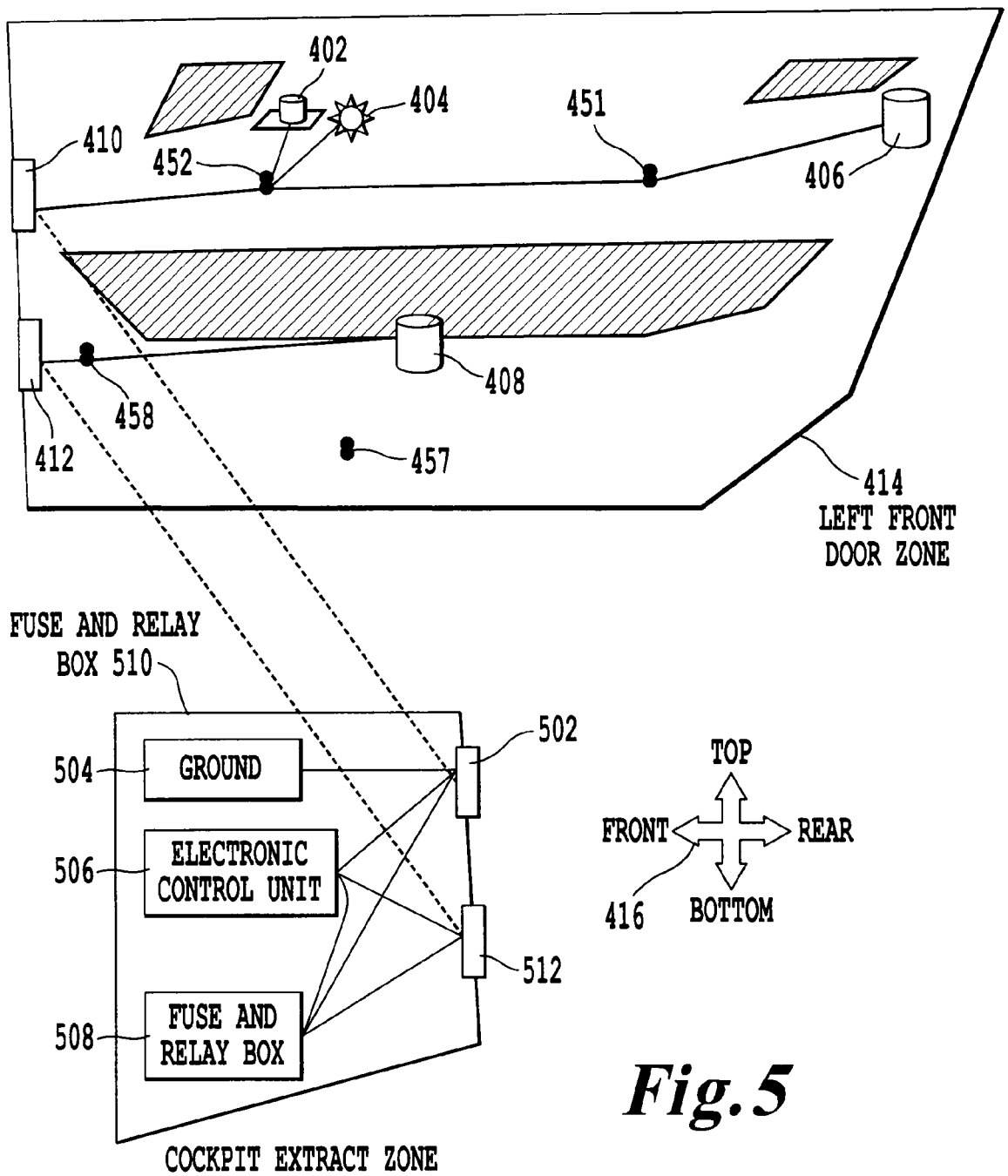
Figure 15:
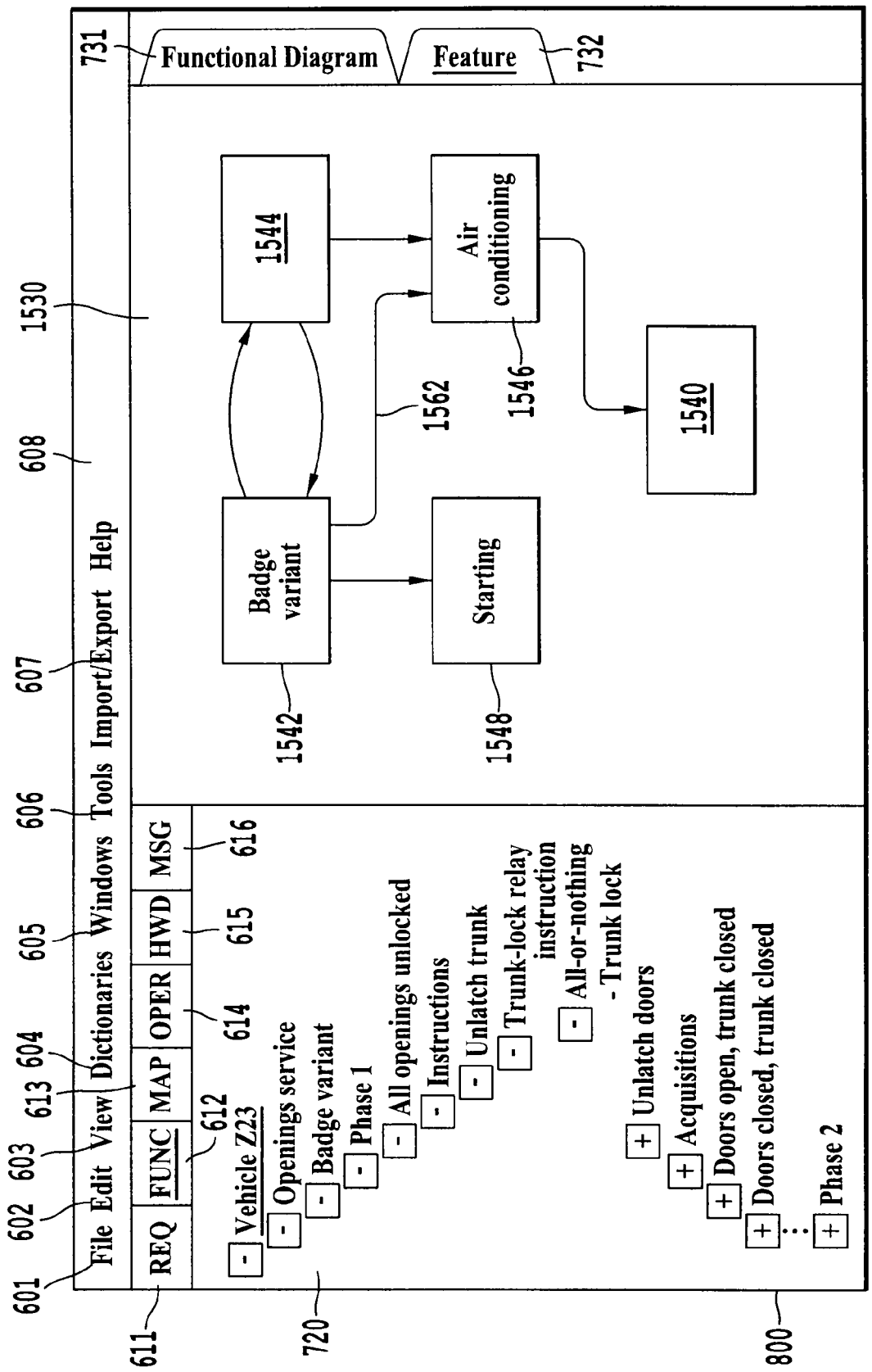
Figure 16:
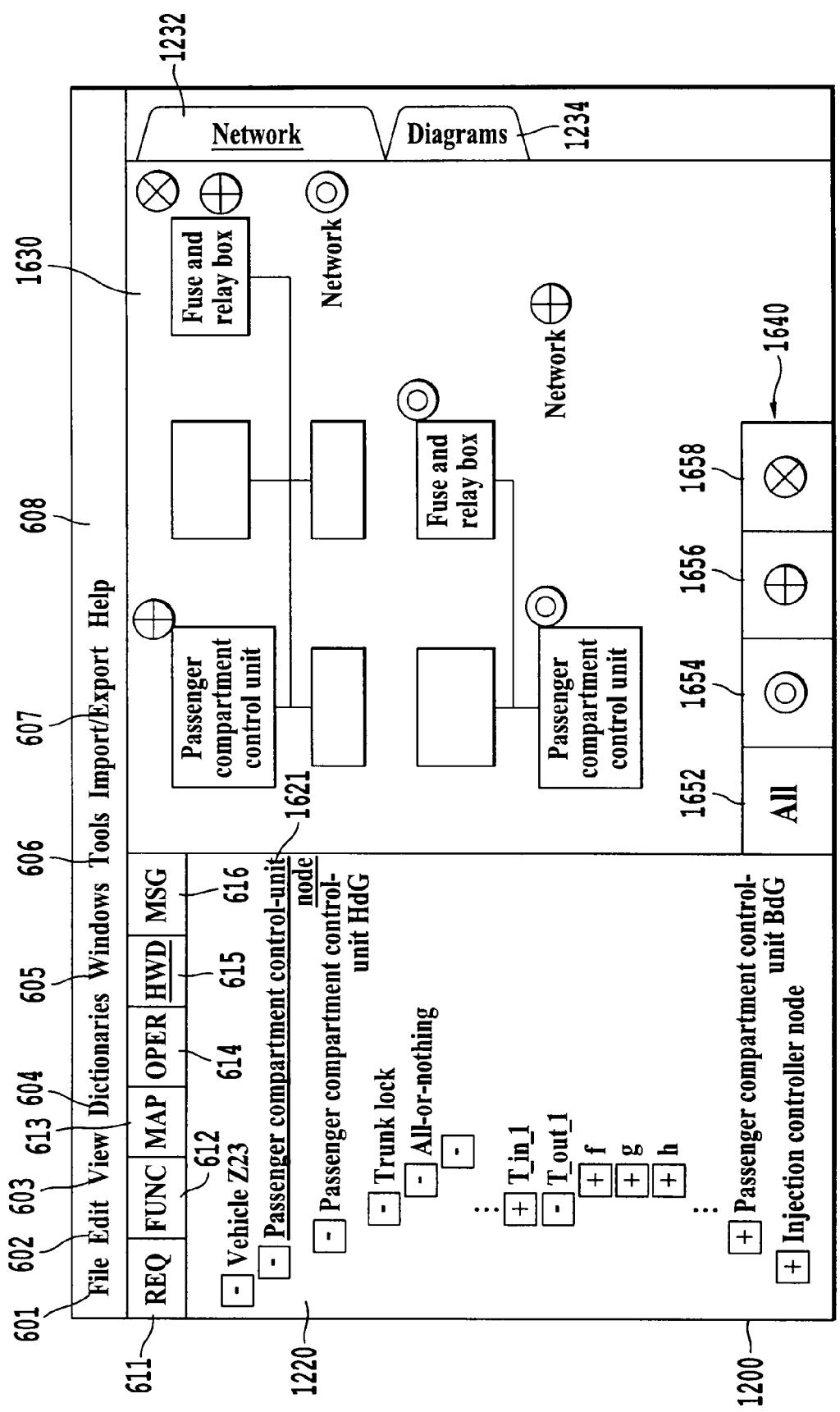
Figure 17:
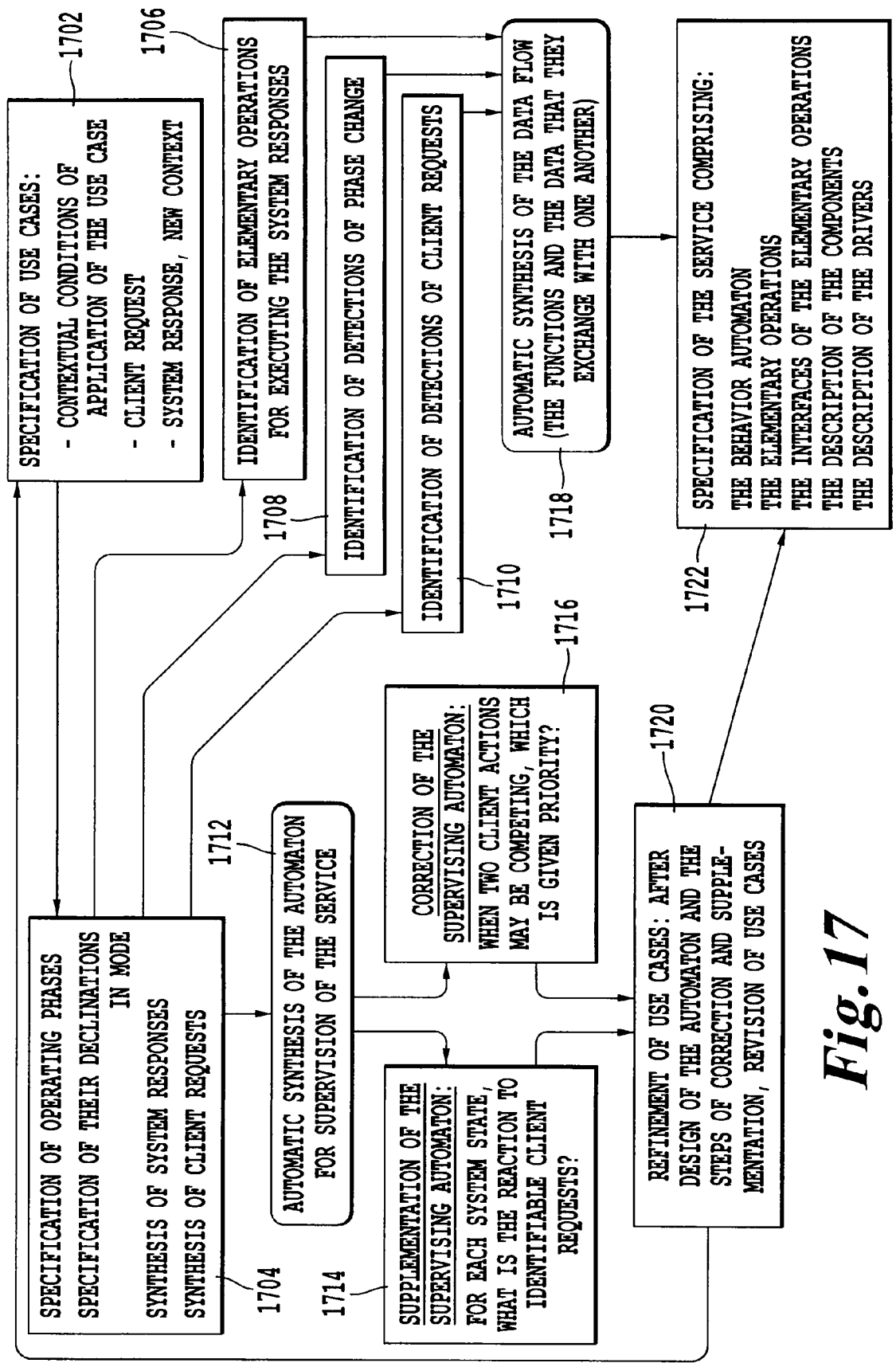
Figure 18:
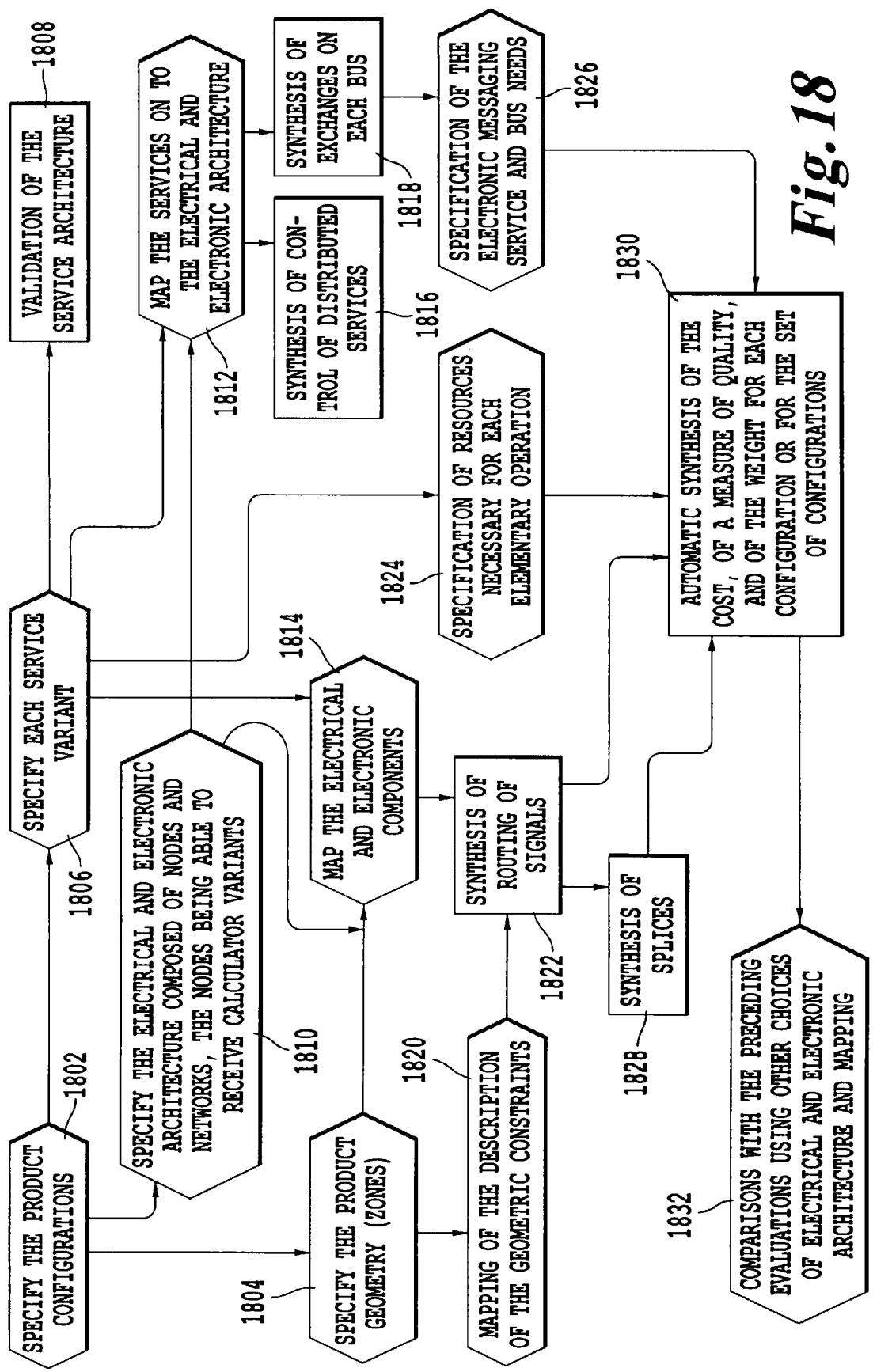

Other advantages, objectives and characteristics of the present invention will become evident from the description hereinafter with reference to the attached drawings, wherein:

FIG. 1 schematically represents the different steps of the method according to the invention, FIG. 2 is a view from above and in plan of the different zones of a motor vehicle, FIG. 3 is a schematic view of elements of description of zones, FIG. 4 shows validated routings in a door cutout zone of a vehicle, FIG. 5 shows an example of the cabling of a vehicle door cutout, FIGS. 6 to 16 represent screens used for the design of an electronic and data-processing system architecture, FIG. 17 represents steps implemented for specification of a service variant, and FIG. 18 represents steps implemented in a method according to the invention for design of a system architecture.

Figure 19:
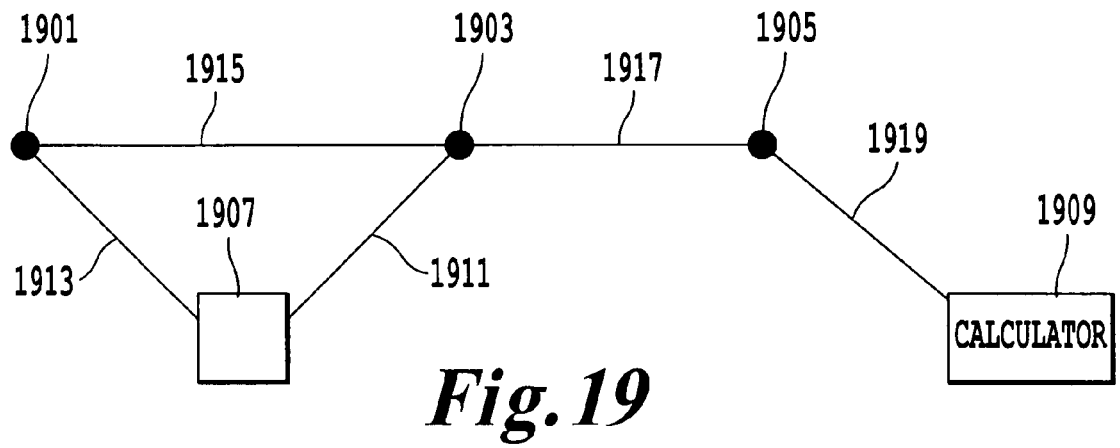

FIG. 19 represents a case in which it is wished to make a manual modification to a cabling generated automatically according to the invention, FIGS. 20a to d illustrate the different steps of manual modification of the routing, once it has been generated automatically.

Before detailing particular embodiments of different aspects of the present invention, explanations of the terminology used are given here:

- the terms "vehicle" and "product" are used without discrimination, the scope of the present invention not being limited to vehicles but the particular embodiments being detailed for a product comprising a vehicle.
- the terms "estimate" and "evaluation" are used without discrimination.
- for brevity, the term "tool" means "system architecture design tool".
- when, in the context of the description, the difference between an electronic control unit or a fuse and relay box is not important, the description will refer simply to calculator. When management of the diversity of calculators is being discussed, the description will refer to type of calculator for a generic calculator of an on-board network, such as the injection calculator of a motor vehicle, and to calculator variant for a particular instance of a type of calculator, for example this or that gasoline injection controller produced by this or that equipment manufacturer, always for a motor vehicle. When on-board networks are being discussed, the description will refer to network node in order to mention a type of calculator or to a calculator variant depending on the case, connected to a network, to remain consistent with the traditionally employed terminology.

The notion of component will generally refer to a sensor or actuator, as opposed to a calculator. In contrast, an electronic component will be not only an actuator or a sensor but also a calculator or another intelligent component, which in English is also referred to as "smart component". An electrical-electronic component will designate any type of component. In practice, these distinctions will be clear from the use context.

Finally, the description will refer simply to "response" in order to indicate a response to a user request.

FIG. 1 schematically represents the steps of the process followed to execute routing of the wires of the electrical and electronic architecture as well as the evaluation thereof. Certain links between certain of the steps are symbolized therein by arrows. For example, the arrow between steps 102 and 104 indicates that step 104 is executed after step 102. In contrast, there is no link between step 104 and step 106, which two steps can be executed in any order desired without detriment to the quality of the result.

Figure 13:
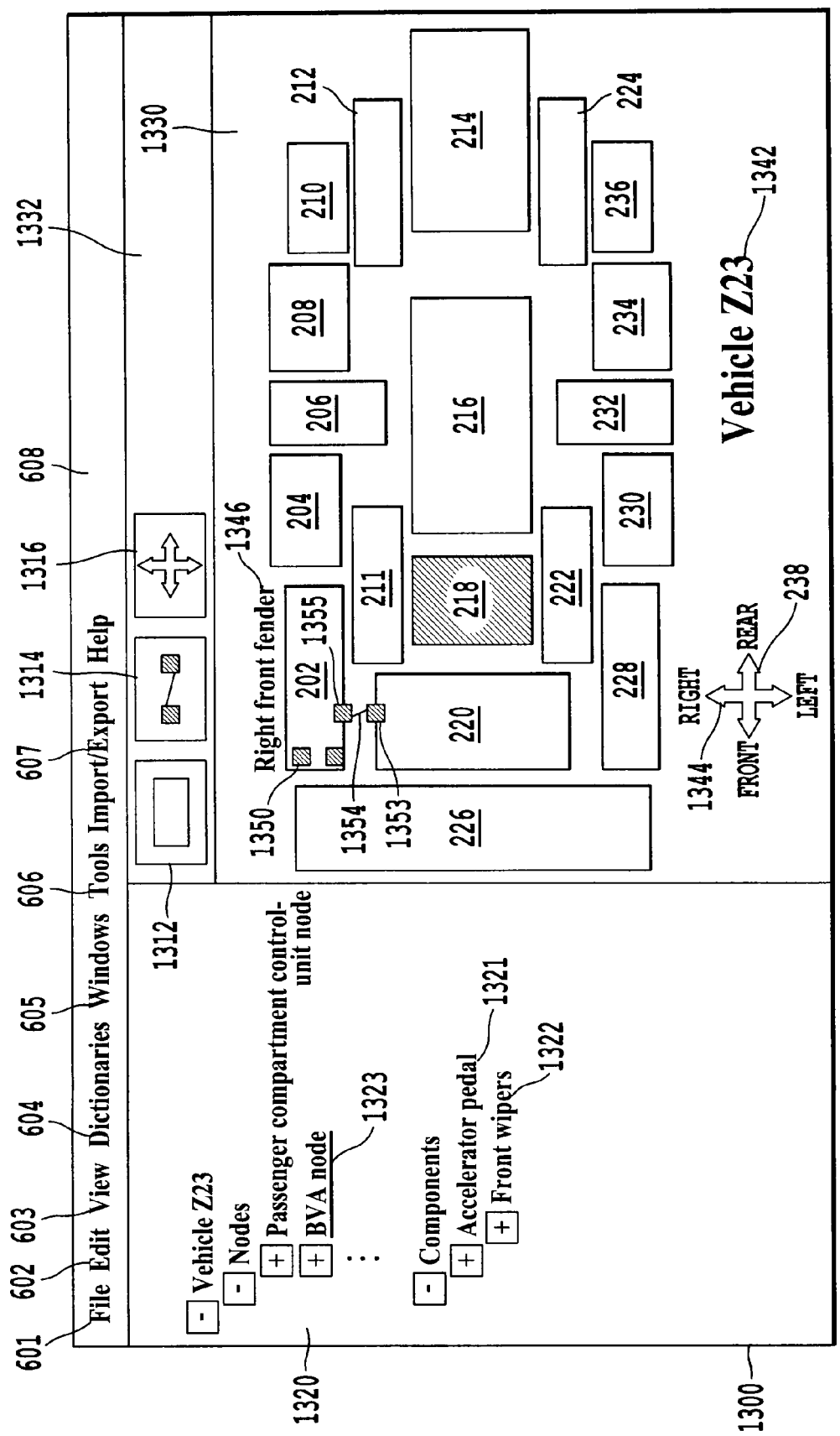
Figure 14:
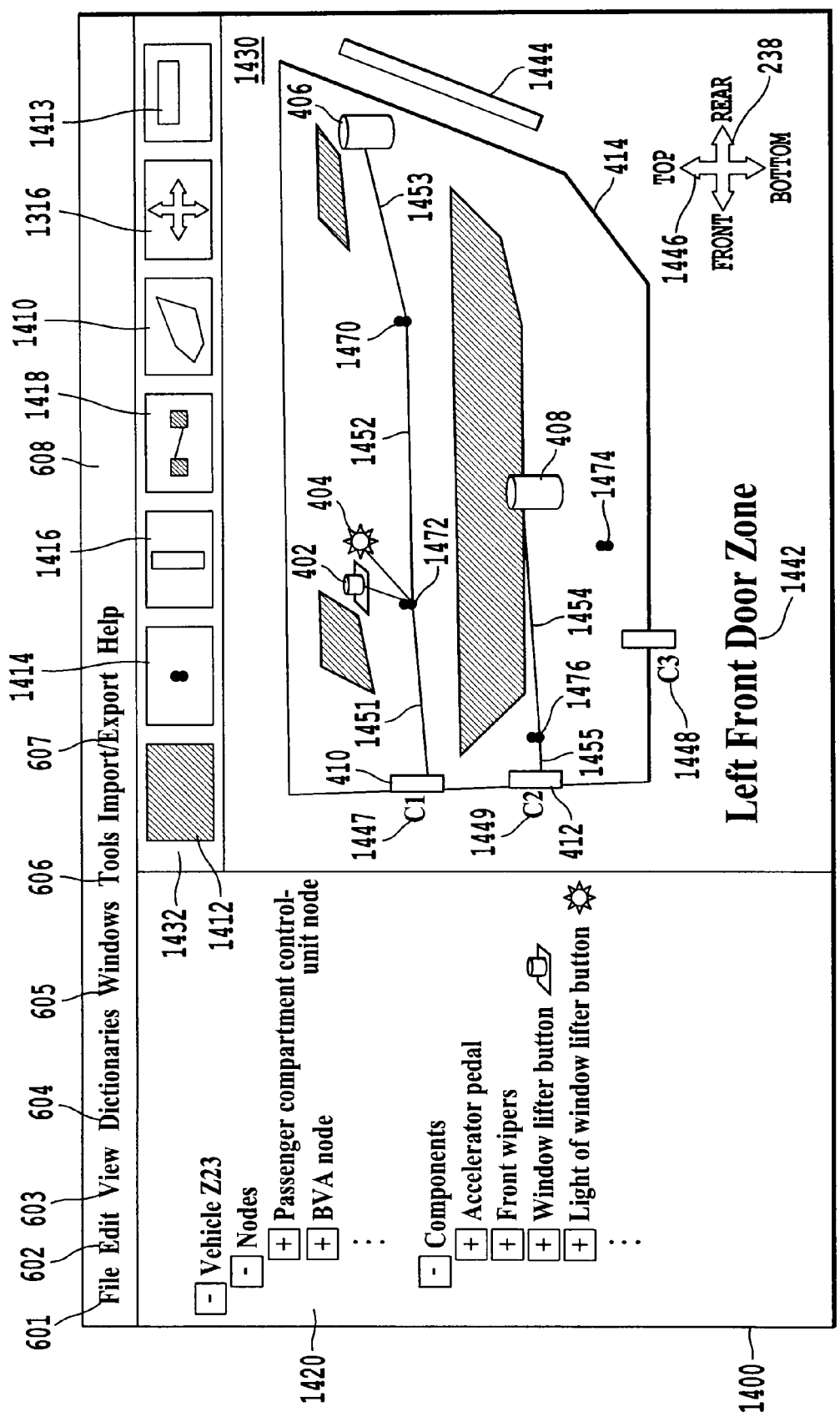

To effect routing of the wires and evaluation thereof, the method comprises:

a step 102, in the course of which there is specified the geometry of the vehicle in the form of zones, for example by using a computer that displays the screen illustrated in FIG. 13 and is provided with software with which it can execute the functions described with regard to FIG. 13; in parallel with this step 102, at least one of the following choices is made:

choice of electronic control units, choice of communication networks, choice of sensors and actuators, choice of fuse and relay boxes, choice of an electrical and electronic architecture and the characteristics of the electrical and electronic components are specified.

a step 104, in the course of which the "prohibited" sub-zones are mapped into the zones described in the course of step 102, as explained with regard to FIGS. 13 and 14;

a step 106, in the course of which routing points and connectors are mapped, in particular between the zones defined in the course of step 102;

a step 108, in the course of which the components are mapped;

a step 110, in the course of which the software that implements the first aspect of the present invention automatically effects a synthesis of the routing of the signals, an example of such a routing being presented in FIG. 5;

a step 112, in the course of which the software automatically effects a synthesis of the routing of the power, an example of such a routing being proposed in FIG. 5;

a step 114, in the course of which the software automatically effects a synthesis of the ground links, an example of such a routing being proposed in FIG. 5;

a step 116, in the course of which the software automatically effects an evaluation of the costs of the routing, on the basis of functions for estimation of the costs of connectors and wires as a function of their dimension and of functions for estimation of the costs of different electronic components and summing the costs of the elements composing the architecture;

a step 118, in the course of which the software automatically effects an evaluation of the quality of the routing, on the basis of functions for estimation of the quality of connectors and wires as a function of their dimension and of functions for estimation of the quality of different electronic components; and a step 120, in the course of which the software automatically effects an evaluation of the weight of the routing, on the basis of functions for estimation of the weight of connectors and wires as a function of their dimension and of functions for estimation of the weight of different electronic components.

Depending on the result of these evaluations, the sites of routing and connecting points and of electrical and electronic components are modified in steps 106 and 108 with a view to improvement, and the synthesis steps 110, 112 and 114 are repeated to proceed with a new evaluation and converge iteratively to an optimized solution.

When an optimized solution is determined, calculation of a technical specification of the cabling composed of the validated synthesized routing and of connectors is undertaken.

FIG. 2 schematically represents the division into zones of a product, in this case a 5-door motor vehicle with a tailgate. The different zones of the vehicle are represented in a view from above. These different zones comprise: a right front fender zone 202, a right front door zone 204, a right column zone 206, a right rear door zone 208, a right rear fender zone 210, a right front column zone 211, a right rear column zone 212, a tailgate zone 214, a roof zone 216, a cockpit zone 218, a hood zone 220, a left front column zone 222, a right rear column zone 224, a front face zone 226, a left front fender zone 228, a left front door zone 230, a left column zone 232, a right rear door zone 234, a left rear fender zone 236 and a floorboard zone 240.

In FIG. 2, these zones are represented together and oriented according to a "compass" 238, included by way of indication, which permits the person skilled in the art to navigate intuitively in each zone while knowing how it is situated relative to those surrounding it, both in the representation and in reality. Compass 238 indicates how the zones are situated relative to one another, but it does not apply to each zone in particular, For example, "right front fender" zone 202 and "right front door" zone 204 are positioned in such a way that it is possible to deduce therefrom that "right front fender" zone 202 is in front of "right front door" zone 204. Nevertheless, these two zones are vertical and, locally, will not be represented according to the orientations indicated by "compass" 238.

Similarly, it is seen in FIG. 2 that "right column" zone 206 is at right angles to "roof" zone 216, although "roof" zone 216 is horizontal and will be represented in a local view according to the orientations indicated by "compass" 238, whereas "right column" zone 206 is vertical. "Compass" 238 therefore serves to situate the zones relative to one another but does not necessarily apply to the description of the contents of each zone.

FIG. 3 schematically represents zone description elements and illustrates how there are mapped, onto a "floorboard horizontal zone" 318 corresponding in FIG. 2 to floorboard zone 240, a connecting point 302, a routing point 312, a connector mapped instead and in place of a routing point 304 or instead and in place of a connecting point 316, a prohibited zone 314, and components 306 and 308, which are sensors, actuators, electronic control unit or fuse and relay boxes.

A zone routing is executed, component 306 being routed to connecting point 302 via connector 304 and component 308 being routed to connector 316 via routing point 312. In addition, FIG. 3 illustrates the connections between zones schematically indicated by the broken line between, on the one hand, connecting point 302 of floorboard horizontal zone 318 and connecting point 320 of contiguous vertical zone 324 and, on the other hand, connector 316 of floorboard horizontal zone 318 and connector 322 of contiguous vertical zone 324. "Compass" 326 indicates how to orient floorboard horizontal zone 318, while "compass" 328 indicates how to orient contiguous vertical zone 324. It is noted that these two zones are perpendicular, floorboard horizontal zone 318 being inscribed in a horizontal plane while contiguous vertical zone 328 is inscribed in a vertical plane. When connecting points 302 and 320 are associated, they represent the same point in space, or in other words a point of physical contact between floorboard horizontal zone 318 and contiguous vertical zone 324. Similarly, connectors 312 and 316 are united by a standard mechanism of "male/female coupling" type; for example, connector 312 is a male connector and connector 316 is a female connector, and these two connectors are physically linked at a physical point of contact between floorboard horizontal zone 318 and contiguous vertical zone 324.

FIG. 4 schematically represents valid routings in a left front door zone 414 corresponding to left front door zone 230 illustrated in FIG. 2. Prohibited subzones 418, 420 and 422 are shaded, and components are represented, in particular a window lifter control button 402, an illuminating light 404 of the window lifter control button, a lock motor 406, a window lifter motor 408, and connectors 410 and 412. Reading of zone 414 is simplified by means of "compass" 416. In addition, routing points 451, 452, 457 and 458 have been mapped. It is noted that certain vertices of prohibited subzone 422 are specifically useful for the routings, or in other words electrical wires or links 454, 455 and 456.

FIG. 5 schematically represents a routing of a set of wires over two zones, on the one hand a left front door zone 414 and on the other hand a cockpit zone 510. Certain components are common to FIGS. 4 and 5. Others, especially in cockpit zone 510, are added: a ground point 504, an electronic control unit 506, a fuse and relay box 508 and connectors 502 and 512, corresponding respectively to connectors 410 and 412 of left front door zone 414. The links between the connectors of the two zones are symbolized by dotted lines in FIG. 5. In practice, connectors 502 and 410, for example, are united by a standard mechanism of the male/female coupling type as indicated with regard to FIG. 3.

A two-dimensional representation of the product is achieved as follows: the product is divided into zones, whose dimensions must be specified, in order to conform as well as possible to the geometry of the product under consideration. This representation is satisfactory in particular for a motor vehicle, inasmuch as the cabling must be largely fixed directly to sheet metal panels and therefore to a decomposition of the vehicle into plane zones, as detailed in FIG. 2.

Each represented zone is preferably vertical or horizontal. For example, the floorboard of a vehicle can be associated with a horizontal zone and a door cutout of a vehicle can be associated with a vertical zone. For an inclined tailgate, it is possible to choose one representation or the other. In addition, it is possible to indicate left and right, front and rear and top and bottom of the said zone. The objective of these orientations is in particular that the person skilled in the art can easily position himself in the transition from one zone to another, or from a global view in which all zones are represented to a local view in which a single zone, for example, is represented.

FIG. 2 represents a view from above of different zones of the upper part of a passenger compartment of a five-door (including the tailgate) automobile. The division into logical zones is specified, but the respective dimensions and shapes of the zones are not represented in FIG. 2. The zones are oriented in FIG. 2, since front, rear, left and right of the view from above are indicated. Certain parts such as the roof are horizontal, and others such as the doors are vertical.

Each zone can contain prohibited subzones, or in other words zones through which wires cannot be passed. For example, the window in the tailgate of a vehicle will correspond to a prohibited subzone.

For reasons of simplicity, the zones can be represented by simple geometric figures, such as polygons, or else more simply quadrilaterals. Each zone has its frame of reference and the prohibited subzones of a zone A are shapes inscribed in A, preferentially in the form of polygons or quadrilaterals.

FIG. 3 represents a zoom to a zone of the type of those described in FIG. 2. It is a zone inscribed in a horizontal plane, as indicated by compass 328. It is labeled "floorboard horizontal zone". At the center of the part, a shaded shape indicates a prohibited subzone 314. Similarly, the shaded shapes in FIGS. 4 and 5 indicate prohibited subzones 418, 420 and 422.

In addition, each zone is linked to the other zones by connecting points, which serve to specify the geometric links between the different zones and to specify sites where the wires can pass from one zone to the other. A connecting point between two zones is therefore represented on each of these zones. A connecting point can be a connector. In this case, it is a connector on the two zones that it links.

In FIG. 3 there is illustrated the link between two zones via connecting points. "Floorboard horizontal zone" 318 is linked to "contiguous vertical zone" 324 by two connectors 302/320 and 316/322. These two connectors are situated at equal distance from one another on each of the said zones.

The routing points are points proposed by the designer for grouping of wire in each zone, which make it possible in particular to group the wires in strands. Preferentially, all vertices of a prohibited subzone are routing points, in order that a solution of the routing problem always exists in a zone. By specification of the designer, a routing point can be a connector.

In FIG. 3, there are represented two routing points 304 and 312, one of which, 304, is in fact a connector.

A routing between two points (for example, between a sensor and an actuator) is composed of a sequence of routing or connecting points. The wire synthesized along a routing is imagined and represented as straight between two successive routing or connecting points.

A routing is said to be valid in a zone if, on the one hand, it does not cross any prohibited subzone and if, on the other hand, given two successive routing or connecting points A and B of the routing, then there does not exist a routing point C that can be reached without crossing a prohibited subzone and such that the lengths of segments AC and BC are shorter than the length of segment AB.

A routing crossing several zones via connecting points between zones is valid if it is valid in each zone.

The length of the routing of a wire is the sum of the distances between the successive routing or connecting points forming the routing. The routing is optimal if the routing length is minimal among all possible valid routings.

To find the optimal routing between two points, it is possible, for example, to enumerate all the valid routings that are possible between these two points and that do not contain a loop (meaning that it never passes twice through the same routing or connecting point) and to choose the shortest routing.

In FIG. 4, points 451, 452, 453, 454, 455, 456, 457 and 458 are routing points. Points 410 and 412 represent connecting points between zones containing connectors. It is noted that 454, 455 and 456 are also vertices of a prohibited subzone. The possible routings for routing lock motor 406 to connector 412 are numerous: there can be cited routings (406-451-452-458-412) and (406-454-455-456-457-458-412). In fact, routing (406-451-452-458-412) cannot be used, because it crosses a prohibited subzone. Finally, the shortest routing that meets all conditions is (406-454-455-456-458-412). In practice, the calculation of a routing is performed between two components rather than between a component and a connecting point that may or may not comprise a connector in a zone.

The electronic and electrical components that follow are mapped onto the different product zones. These components are:

the electronic control units: these are electronic components capable of controlling data signals; in other words, they are of low power and serve in particular to transport software data or data that can be interpreted by the software, in particular originating from a sensor or destined for an actuator;

the sensors and actuators;

the fuse and relay boxes: these are electronic components capable of controlling not only low-power signals but also high-power signals, which are described simply as power signals;

the sources: these are energy sources, typically a battery—a source can be regarded as equivalent to a particular fuse and relay box;

The electronic control units preferentially assure logical control of the components, while the boxes assure the relays of their supply and the sources assure supply of the assembly. As their name indicates, the fuse and relay boxes contain, for example, fuses protecting the different loads (energy-consuming components) positioned on the different wires linked to the said boxes, and they also preferentially contain relays permitting activation of loads that require power.

Preferentially, the different elements of the electrical and electronic architecture are represented by points, or in other words are associated with two coordinates in the frame of reference of the zone into which they are mapped. The ground points are also mapped. The ground points are such that a ground wire, connected to a ground point, is at zero electrical potential. The ground points are specified by the designer.

The electrical and electronic architecture is given by:
the choice of electronic control units,
the choice of communication networks,
the choice of sensors and actuators,
the choice of fuse and relay boxes,
the logical links of these different components between one another.

These links are in particular the connections of the electronic control units and fuse and relay boxes to the different communication networks. These links may also be explicit links between a sensor or actuator and an electronic control unit or a fuse and relay box. In particular, since a sensor, for example, can have a plurality of electrical links with its environment, such as a ground link, a power link and a link for information transmission, the said sensor can be simultaneously linked to ground, to a fuse and relay box and to an electronic control unit.

The routing of the set of wires is executed in steps for a given mapping of the different elements of the architecture.

(A) The routing of a data signal from an input-output of a component to an input-output of an electronic control unit is achieved as follows:

(a) If the allocation of the data signal of the component (sensor or actuator) is specified, meaning that the electronic control unit to which the component is linked for the said data signal has already been defined, then the routing is optimal between the sensor and the electronic control unit.

(b) If the allocation of the signal is not specified, then the component is preferentially allocated to the closest electronic control unit, or in other words (i) the optimal routing $C_i$ for joining the component to the electronic control unit $Calc_i$ is calculated by applying the preceding step (a) and (ii) the shortest routing and the corresponding electronic control unit or units are then selected, meaning $Calc_j$ such that Cj=min Ci.

(B) The routing of a power signal of an input-output from a component to an input-output of a fuse and relay box is executed as follows:

(a) If the allocation of the power signal of the component (sensor or actuator) is specified, meaning that the fuse and relay box to which the component is linked for the said power signal has already been defined, then the routing is optimal between the sensor and the fuse and relay box.

(b) If the allocation of the power signal is not specified, then the component is preferentially allocated to the closest fuse and relay box, or in other words (i) the optimal routing Ci for joining the component to the fuse and relay box $Calc_i$ is calculated by applying the preceding step (a) and (ii) the shortest routing and the corresponding fuse and relay box or boxes are then selected, meaning $Calc_j$ such that Cj=min Ci.

(C) As regards the routing of a ground signal from an input-output of a component, this component being a sensor, an actuator, an electronic control unit of a fuse and relay box, the component is preferentially allocated to the closest ground point, or in other words (i) the optimal routing Ci for reaching each ground $M_i$ is determined and (ii) the shortest routing or one of the shortest routings $M_j$ is then selected such that Cj=min Ci.

(D) Routing of a network between calculators

The topological characteristics of the network must be known: such a network is preferably organized as a star, line or ring depending on the cases.

For a controller area network (CAN), for example, the star or line topologies are possible. Preferentially, the designer will indicate his recommendation. The reasons for choosing a topology are extremely varied. For example, the star network may be preferred for reasons of operating safety because, in the event that the bus is cut, only one calculator is isolated, whereas, in the case of line topology, the network is cut in two and the consequences are a priori more serious.

For a chosen topology, a search is then made for the routings that minimize the distances between the calculators.

For a star topology:

(a) A contact point between the branches is chosen, (b) A search is made for the optimal routing of this point with each of the electronic control units or each of the fuse and relay boxes connected to the network, (c) The sum of the lengths of the said optimal routings is calculated, (d) The preceding three steps are applied for each of the existing contact points and (e) The contact point that minimizes the length of the network is selected.

For a line topology:

(a) A routing point permitting each electronic control unit or each fuse and relay box to be disconnected from the bus is chosen, the bus being itself formed by the entire sequence of the said routing points that do not cut the prohibited subzone, (b) The set of the said routing points permitting each electronic control unit or each fuse and relay box to be connected to the bus which minimizes the length of the network is determined, for example by successive trials.

(E) Routing of a power signal of a calculator C.

This is treated as the routing of a power signal from a sensor to a fuse and relay box.

In FIG. 5, the zone "left front door zone" 414 and its connection with "cockpit extract zone" 512 are represented.

The complete routing of the different components of the said zones is executed. The components are first linked to electronic control unit UCE 506. The different routings generated are therefore, by adopting the notations used to describe FIG. 4:

motor 406 to UCE 506: (406-451-452-410-506), motor 408 of the window lifter to UCE 506: (408-458-412-506), control button 402 of the window lifter to UCE 506: (402-452-410-506), light 404 of the control button of the window lifter to UCE 506: (404-452-410-506), and from UCE 506 to fuse and relay box BFR 508: (506-508).

The electrical characteristics of the different components can be specified: number of interface pins, nature of the pins (data, ground, power), allocation of data or power pins if they are specified, minimum operating voltage, mean current, ringing current, consumed power; this is done for each power wire leading out from the component.

The routing evolves consistently, since it is necessary to route each wire separately and to specify a pin for each connector involved in the routing of a new wire.

In FIG. 5, motors 406 and 408 can each have three wires, for data, power and ground respectively, and are therefore provided with three-pin connectors. In this case, the links to ground M 504 and to fuse and relay box BFR 508, which had not been expressed until now, appear in the form of new routings:

lock motor 406/pin 1 to UCE 506/pin 1 (data): (406/pin 1-451-452-410/pin 1-506/pin 1), window-lifter motor 408/pin 1 to UCE 506/pin 2 (data): (408/pin 1-458-412/pin 1-506/pin 2), lock motor 406/pin 2 to BFR 508/pin 1 (power): (406/pin 2-451-452-410/pin 2-508/pin 1), window-lifter L motor 408/pin 2 to BFR 508/pin 2 (power): (408/pin 2-458-412/pin 2-508/pin 2), lock motor 406/pin 3 to ground 504: (406-451-452-410/pin 3-504), and window-lifter motor 408/pin 3 to ground 504: (408-458-412/pin 3-504).

The pins are not marked for a link to ground, because this is preferentially a screwed connection or analogous means.

It is then possible to calculate the technical specification of the cabling composed of the following results:

the logical cabling plan: this is the description of the set of wire segments necessary to execute the electrical and electronic architecture. Each wire links one pin of one connector of a component to one pin of another connector of another component and, in addition, passes through a certain number of routing and connecting points as specified in the foregoing. The wire is logically defined by the datum of the two connectors and of the pins of each connector at the ends, or in other words at the level of the connected components, by the sequence of routing points as well as by the sequence of connector pins, in particular between zones being crossed. The logical cabling plan is the datum of the set of logical definitions of the wires of which it is composed.

the specification of the connectors: for each connector, the specification is composed of the number of connections corresponding to data wires, of the number of connections corresponding to power and of the number of connections corresponding to ground wires.

the specification of the interfaces of the electronic control units, of the fuse and relay boxes and of the sensors and actuators: it comprises descriptions of the connectors of these components, in the form of data, power and ground pins.

In FIG. 5, connector 410 now ensures five connections, of which three are data, one is power and one is ground.

The user may also wish to calculate or evaluate the cost of an electrical and electronic architecture, in particular to compare such architectures and to choose the least costly with equal service and quality.

Given a function of cost of the connectors, for example based on a nomogram that gives an estimate of the price of the connectors as a function of the number of data, power and ground connections, or based, for example, on a mean price assigned to each connection of a data, current or ground wire;

given an evaluation of the cost of the electronic components, sensors, actuators, electronic control units or fuse and relay boxes;

given a function of cost of wires based, for example, on their length and on their type, by taking, for example, a mean linear weight for the power and ground wires, a mean linear weight for the data wires and a cost per unit weight of the component in which the said wires are manufactured;

a cost evaluation for the electronic and electronic architecture under consideration is automatically deduced from the technical specification by summing the costs of all the electronic components, of all the connectors and of all the wires.

To estimate the cost of implementing an elementary operation, it is possible, for example, to proceed as follows: given a number N of assembler lines evaluated for each elementary operation mapped onto a calculator and an activation period P in seconds for each elementary operation, given a mean cost CI for execution of an instruction per second on a processor, given the memory space MEMO necessary for the data that the elementary operation exchanges with the other elementary operations and the drivers; given an estimate of the cost CRAM of a RAM bit and an estimate CROM of a ROM bit or Cflash of a flash memory bit; given the number of bits of a word, or in other words the characteristic of being an n-bit (eight, sixteen or thirty-two, for example) microcontroller, the cost of an operation is: (N/P)*CI+N*n*CROM+MEMO*n*CRAM.

On certain 32-bit microprocessors, certain instructions occupy 16 bits, which makes it possible in particular to save on memory. This characteristic may be taken into account by separating these two types of instructions if it is possible to evaluate a mix for the elementary operation under consideration, consuming half as much ROM for the 16-bit instructions.

It is to be noted that the cost CI of execution of one instruction per second on a processor may depend on the type of application being processed, since not all instructions take place in just as many cycles. For example, on a twenty MIPS (million instructions per second) processor, it is possible to achieve twenty million instructions for one cycle in one second, but only one million instructions for twenty cycles. Thus this evaluation is stipulated according to the mean number of cycles per instruction necessary for each type of application.

It is important to note that the mean cost of an instruction, of a RAM bit and of a flash bit on a microcontroller may, for example, be extrapolated from the observation of at least three microcontrollers (i) for which the cost ($C_i$) and the RAM ($R_i$), MIPS ($M_i$) and flash memory ($F_i$) characteristics and the number ($n_i$) of bits in a word are known. In fact, for each microcontroller, there is established the equation in the unknowns CI, CRAM, Cflash; and $$CI*M_i+CRAM*n_i*R_i+Cflash*n_i*F_i=C_i$$

Such a system of three equations has a unique solution, the different constants being non-zero. When numerous controllers are examined, this estimate can of course be refined.

It is to be noted that, if the elementary operation is the control automaton of a service, then the estimate of the number of lines of code is determined as a function of the number of states and of the number of transitions, and the activation period is determined as a function of the performance requirements on the different use cases.

In addition, the cost of the different hardware drivers can be evaluated as a function of their type (all-or-nothing, analog-digital, etc.) and of their electrical characteristics.

The user may also wish to evaluate the quality of an electrical and electronic architecture, in particular to compare such architectures and to choose that which presents the best quality level for identical service and cost.

The measure of quality is preferentially obtained by measuring the number of failures per million units per year of the entirety of the architecture, preferentially by means of a software routine.

To calculate this number
the software measures the quality of the set of connectors, whether they are connectors between zones or within zones or input/output connectors of the electronic components (sensors, actuators, electronic control units, fuse and relay boxes) by assigning, for example, a mean failure rate per connection, such as 10 ppm (failure per million units per year) and by multiplying this mean rate by the total number of connections in the system. To obtain a more precise evaluation, the software takes into account the means adjusted as a function of the type of connection: ground, power and data, the finest wires being the most fragile. For example, 4 ppm per connection is taken for power or ground wires on a pin and 6 ppm per connection is taken for data wires on a pin and, finally, an estimate of 4 ppm is used per portion of data wire between two connectors. In this case, by referring to FIG. 5 and the detail of the connections and wires presented in the description of FIG. 5, the following evaluation can be achieved for each section:

lock motor 406/pin 1 to UCE 506/pin 1 (data): (406/pin 1-451-452-410/pin 1-506/pin 1): 3*6 ppm+2*4 ppm, or in other words 26 ppm window-lifter motor 408/pin 1 to UCE 506/pin 2 (data): (408/pin 1-458-412/pin 1-506/pin 2): 3*6 ppm+2*4 ppm, or in other words 26 ppm lock motor 406/pin 2 to BFR 508/pin 1 (power): (406/pin 2-451-452-410/pin 2-508/pin 1): 3*4 ppm, or in other words 12 ppm window-lifter L motor 408/pin 2 to BFR 508/pin 2 (power): (408/pin 2-458-412/pin 2-508/pin 2): 3*4 ppm, or in other words 12 ppm lock motor 406/pin 3 to ground 504: (406-451-452-410/pin 3-504), or in other words 3*4 ppm motor of window lifter 408/pin 3 to ground 504: (408-458-412/pin 3-504), or in other words 3*4 ppm for a total of 100 ppm If a splice at 452 is now taken into account, then the ppm corresponding to the duplication of wires after the splice, in view of actuators 406 and 408, can be eliminated, or in other words 3*4 ppm. By taking a power splice into account, 88 ppm is found as the quality of the optimized routing. By taking a ground splice at the same routing point into account, it is possible to save another 12 ppm, thus ending with 76 ppm. Optimization over a cost estimate would consist in similar manner of eliminating the cost of the portions of wires and connector pins eliminated by virtue of the splice.

The tool measures the quality of the electronic components that is specified in a component database and that can be described as a function of the type of component or specifically for each component; for example, an evaluation of 100 ppm can be attached to all electronic control units.

The tool then adds the measurements of all components constituting the electrical and electronic architecture.

The user can also refine the routing strategy by integrating splices for the power wires and the ground wires. These splices can be used at the level of connectors or within a zone, preferentially at the level of a routing point.

Creating a ground splice consists in joining all (n) ground wires passing through a point, and in particular through a connecting point or a routing point. In this way, by working up to the closest ground, savings are achieved on the one hand in wires and on the other hand in connecting pins corresponding to the (n−1) wires removed.

Creating a power splice consists in joining the power wires that, on the one hand, pass through a common point, in particular through a connecting point or a routing point, and that, on the other hand, join the loads at a common fuse and relay box. For example, in FIG. 5, the supply wire of lock motor 406 and the supply wire of light 404 can be joined at the level of routing point 452 or else at the level of connector 410. Such splices serve to save on pins at the level of the connectors and the portions of wire eliminated in this way. Thus it is sought to minimize the length of the wires, and it will be chosen to create the splice at routing point 452 in order to save on the lengths of wire between 452 and 410. Point 452 is that which minimizes the lengths of wire for creation of the splice in the example of FIG. 5.

Creating a splice at the level of a connector is equivalent to linking, to one another, the connector pins corresponding to the wires that are wished to be joined.

The synthesis of the routing can then be improved by searching to determine whether one or more splices of ground wires or of power wires would permit the global cost of the architecture to be minimized. For that purpose it is necessary to input new data into the cost base of the unit components, in particular the cost of a splice as a function of the number of wires joined and the cost of a splice at the level of a connector as a function of the number of wires joined.

Figure 6:
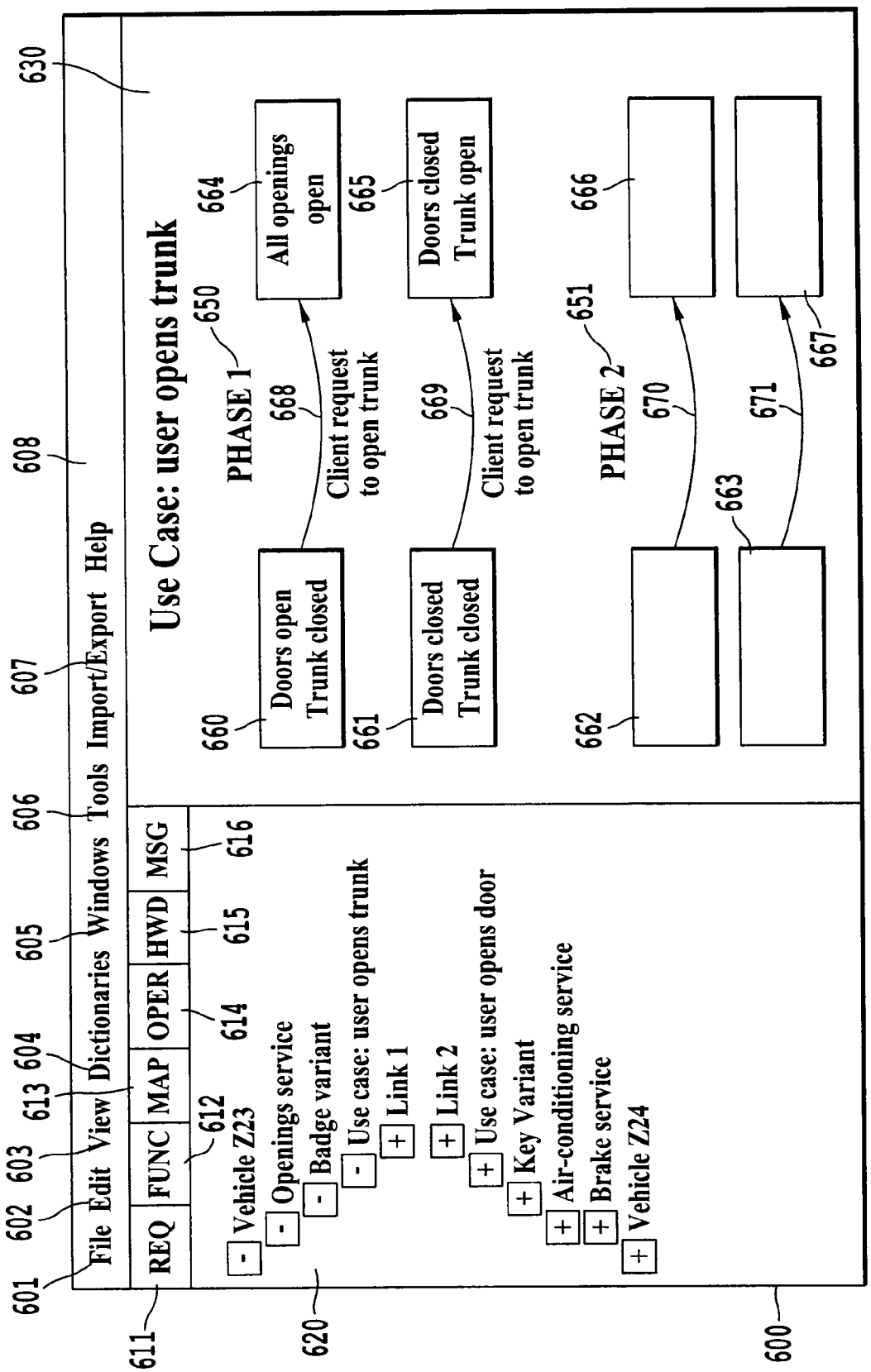

FIG. 6 and the following figures describe a system architecture design tool and a method for designing a specification of a hardware and software system by using this tool.

This tool is particularly suitable for cases of complex systems comprising a set of calculators that execute numerous services for the benefit of a user, each service presenting numerous use cases. For example, the electronic and data-processing systems of vehicles are particularly envisioned by this tool.

Services are defined by what the user wants (for example, activation of the air conditioning, of windshield wipers) or by what is proposed to him (such as passive safety, especially in the case of accidents). They are also defined by sensors and/or actuators that they activate. They each correspond to a hardware implementation in the form of sensor/software/actuator. The maker has room to maneuver within the definition of the internal architecture of the electronic/data-processing system, especially in the choice of on-board networks and of electronic boxes connected to these networks, and the design tool presented here makes it possible to design this architecture.

Starting from services, the design tool makes it possible to determine specifications rather than finished products. Nevertheless, this tool also determines the interfaces and the composition of the elements and their communication with the electronic/data-processing system.

In particular, this tool does not envision programming the calculators automatically, but managing cost/quality/time compromises for the specified system.

The design tool is implemented in the form of a software routine running on a personal computer and using a database and known resources (operating system and distribution on the network).

According to one aspect of the present invention:

each service represents a function performed for a user, a set of formalized use cases of each service is defined, each formalized use case comprising a context of origin, a user request, which may be implicit, and a system response corresponding to a change of its state, and the system is organized and specified to effect the response, when it detects that the request has been sent in the context of origin.

With this objective, according to one aspect of the present invention, the method comprises a step of design, for each service, of a control automaton of the service that is intended to be implemented by the system of hardware and software components and that represents the behavior of this system. This design step comprises, for each service, a step of definition of a formalized use case of the service, specified by a context, a user request to the system and a system response corresponding to a change of its state and, in iterative manner, until all use cases of the service have been treated:

a step of addition of a formalized use case of the service, specified by an initial context or situation of the system, a user request to the system and a system response corresponding to a change of its state, and, in iterative manner, for each already constructed state, the program searches whether it is compatible with the context of the added formalized use case and, if yes, there is constructed a new system state connected to the said state already constructed by the request of the added formalized use case, the new state taking into account the already constructed state and its modification by the response of the added formalized use case.

In this way, there is synthesized, for the service, the control automaton of the service that is composed of the set of pairs of states connected by the requests forming the transitions of the said automaton.

The context represents at least one mode (or parameter) of operation of the system, the modes being transverse to the services and beyond the direct control of the services, for example a mode representing an available energy level (low battery, on battery, in course of starting, engine turning, for example), another mode representing a type of system user (designer, manufacturer, vehicle owner, vehicle operator or passenger, after-sales service, automobile repair shop, for example) and another mode representing an accident or non-accident state of a vehicle. It must be noted that, although starting the engine is one of the services of the vehicle, the change of available energy level (linked to driving of the alternator by the engine) is not directly under the control of this service.

In the embodiment described here, every context fits into a life phase of the system composed of a set of combinations of modes of operation of the vehicle, the declination in mode of the phases thus being transverse to the services. Ultimately a context will correspond to a set of pairs (phase, system state), each state being in fact characterized by the response of the system when it is accessed.

For example, the use case "in the context in which the vehicle is latched, the user presses his unlatching badge and the vehicle becomes unlatched" is applied to the states "vehicle locked" in the phases "engine running" and "engine stopped", if these two phases have been identified as pertinent by other formalized use cases of the "unlocking" service. Each phase corresponds to a set of combinations of modes in which the behavior of the service is uniform, meaning in which the same states and the same client requests are observed, or in other words the same client requests and the same system responses starting from a given state.

The table below defines a set of phases for a given vehicle.

| ENERGY | USER | VEHICLE STATE | PHASE |
|---|---|---|---|
| battery low | designer | vehicle not in accident state | phase 1 |
| battery low | designer | vehicle in accident state | phase 2 |
| battery low | manufacturer | vehicle not in accident state | phase 1 |
| battery low | manufacturer | vehicle in accident state | phase 2 |
| battery low | owner | vehicle not in accident state | phase 3 |
| battery low | owner | vehicle in accident state | phase 2 |
| battery low | operator | vehicle not in accident state | phase 1 |
| battery low | operator | vehicle in accident state | phase 2 |
| battery low | after-sales service | vehicle not in accident state | phase 4 |
| battery low | after-sales service | vehicle in accident state | phase 5 |
| battery low | repair shop | vehicle not in accident state | phase 4 |
| battery low | repair shop | vehicle in accident state | phase 5 |
| battery normal | designer | vehicle not in accident state | phase 6 |
| battery normal | designer | vehicle in accident state | phase 2 |
| battery normal | manufacturer | vehicle not in accident state | phase 6 |
| battery normal | manufacturer | vehicle in accident state | phase 2 |
| battery normal | owner | vehicle not in accident state | phase 7 |
| battery normal | owner | vehicle in accident state | phase 2 |
| battery normal | operator | vehicle not in accident state | phase 6 |
| battery normal | operator | vehicle in accident state | phase 2 |
| battery normal | after-sales service | vehicle not in accident state | phase 4 |
| battery normal | after-sales service | vehicle in accident state | phase 5 |
| battery normal | repair shop | vehicle not in accident state | phase 4 |
| battery normal | repair shop | vehicle in accident state | phase 5 |
| starting | designer | vehicle not in accident state | phase 8 |
| starting | designer | vehicle in accident state | phase 9 |

In this table, all triplets of modes of operation are placed in correspondence with phases, each phase representing a set of combinations of possible values of modes of operation. If the behavior of the vehicle is always the same, a single phase is defined in the table, otherwise several phases are differentiated.

The set of formalized use cases represents all responses or absences of response of the system in all phases of the system.

The tool permits a step of supplementation, in the course of which, for each response, or in other words a state of the system, all client requests that have not yet been processed are envisioned and the designer is asked if processing of the request must be effected in the state corresponding to this request. Only the client requests can have an action on the service.

The design tool also permits a correction step in the course of which, if, in a same departure step, two states of the control automaton of the service are connected by different requests, then the necessity of defining a priority among the system responses is determined and this priority is incorporated as an attribute of the outputs of the state. Priority information typically comes after design of the formalized use cases. It is possible, for mechanical or other reasons, that two potentially concurrent requests can in fact never be honored simultaneously. In this case it is necessary to wait for a more advanced design step to be certain that it is not necessary to specify a priority, unless this can be guaranteed directly (example: opening a door and closing the same door cannot be achieved simultaneously). In addition, if two identical requests lead to different states, an incompatibility must be corrected and one of the requests must be suppressed and consequently the corresponding use case must be clarified.

It is observed that a change of context is taken into account by the system in the following manner:
- each change of context is a change of state that is the object of a formalized use case (CUF);
- the responses to changes of context are defined as formalized use cases;
- changes of context are defined as requests of formalized use cases.

If one service influences another (for example, the same indicator is shared by two services, such as the automatic radio and navigation system), a service is added for the overlapping portion, in such a way as to resolve the conflicts between the services. The objective of this service will be to arbitrate, when two concurrent actions are being applied to a given component by two services, which of the services has priority or if a specific action corresponding to this particular case must be taken. Such a service is typically specified not on the basis of use cases but instead by identification of the states of two services in which the reactions leading to conflict (relative to one or more given components) are identified.

The control automaton of the service is achieved by programming at least one control calculator of the corresponding service.

The tool comprises different pages accessible by clicking on tabs. These pages are described with regard to FIGS. 6 to 16. For clarity, the tab titles and elements of lists selected by the designer are underlined and bolded in FIGS. 6 to 16.

As illustrated in FIG. 6, user interface 600 of this software tool comprises:
- drop-down menus 601 to 608,
- six horizontal tabs 611 to 616,
- a hierarchical list zone 620 and
- a graphical zone 630.

Drop-down menus 601 to 608 are represented by their titles "File", "Edit", "View", "Dictionaries", "Windows", "Tools", "Import/Export" and "Help". By clicking on one of these titles with the left button of the mouse, a drop-down menu appears with options participating in implementation of the method (open, edit, save, close file, cut, copy, paste selected elements, view modes, glossary, tools, import or export files, help, etc.). While he is working on the design of an electronic and data-processing system architecture for a vehicle, the designer does not necessarily have to use these drop-down menus 601 to 608.

Regardless of the tab selected from among tabs 611 to 616, the design tool shows a screen comprising a hierarchical list part (at the left in FIGS. 6 to 16) representing a hierarchical description and a graphical part (at the right in FIGS. 6 to 16) giving, as a function of a selection, by means of a pointing device (in the rest of the description, a mouse), of an element of the hierarchical list, a synthetic view concerning the selected element.

It is important to note here that, for at least one user interface of the design tool, or in other words for at least one tab, a hierarchical level of the hierarchical list represents services. In the embodiment illustrated in the figures, the first three tabs 611 to 613 present this characteristic.

Using a mouse (not illustrated), the user can make "pop-up" menus appear in one of the list or graphical zones by clicking on one of the left or right buttons of the mouse.

To design the architecture and the specifications of the system, the user successively selects horizontal tabs 611 to 616 by clicking above, knowing that one of the properties of the design tool is that the user can select the tabs in any order that he wishes.

The horizontal tabs have the following titles:
"Requirements", tab 611,
"Feature description", tab 612,
"Feature architecture", tab 613,
"Operational architecture", tab 614,
"Hardware architecture", tab 615,
"Frame description", tab 616.

These tabs represent, in this order, several steps of the method that is the object of the present invention:

These titles appear in full when the corresponding tabs are selected and in abbreviated form ("REQ" 611, "FUNC" 612, "MAP" 613, "OPER" 614, "HWD" 615 and "MSG" 616, respectively) the rest of the time.

To design the architecture of a system, the designer first selects tab 611 "Requirements" and sees the screen illustrated in FIG. 6. At the left there is seen hierarchical list zone 620, which contains part of a list in which the five highest levels of hierarchy are as follows:

---
vehicle name
   services
      service variants
         use cases
            link between states
---

As is known in the art of file finding in an individual computer environment, for example of the PC type, the elements of lower hierarchical level may or may not be visible. For example, when the list apparently contains only vehicle names, by clicking with the left button of the mouse on a vehicle name, the list of services proposed for this vehicle will appear. By selecting a service, the list of service variants relating thereto is made to appear and so on.

By clicking with the right button of the mouse on a displayed element, it is possible to edit the list of immediately lower hierarchy, or in other words to add, modify or delete a use case by clicking on a use variant, for example. This editing is accomplished by means of a menu that pops up on being clicked and that contains, for example, the options "add", "remove", "properties" and "show differences" (an option making it possible to compare two elements of the same hierarchical level, including those on two different vehicles).

In the design tool, a use case is defined by an initial phase (such as an available energy level) that is transverse relative to the vehicle, an initial state (such as the position of actuators), a demand or request, a final phase and a final state.

For example, in the "access" service, which concerns the openings of the vehicle, there is added a new use case (CU) concerning what must be done following a serious accident. For this new use case, there is defined a name "after a crash" and a text description "regardless of the initial context of the vehicle, the ignition being on, if a crash is detected, then all accesses must be unlatched". The name and description are called "properties" of the new use case.

FIG. 6 represents the interface when the use case "User opens trunk" is selected.

When an element of the hierarchical list is selected by left clicking with the mouse, a synthetic representation of this element is seen in graphical part 630.

Depending on the level of the selected element of the hierarchical list, there can be seen in graphical zone 630:

---
| | |
|---|---|
| vehicle name: | the list of services |
| services: | the list of service variants |
| service variants: | the list of use cases |
| use case: | the different embodiments of the use case by a set of state transitions in the different phases of the service. Incidentally, this is the selection that is presented in graphical part 630 |
| link between states: | performance requirements relative to the different elementary operations that are achieved in the arrival state (see example described above). |
---

For example, by left clicking on a service variant, there is displayed in the graphical part a list of use cases together with their description in a text, each paragraph corresponding to a use case. By left clicking on a formalized use case, there is displayed, in vertical succession and under headers 650 and 651 indicating the phases in question, "phase 1" and "phase 2", initial states 660 to 663 and terminal states 664 to 667, represented by rectangles and connected by links 668 to 671. On these links there appears the name of the client request that causes the change from the initial state to the final state.

It is seen that, to make a use case "formalized", the use case is selected by right clicking and, in the pop-up menu, choosing "link definition" to put links in place, each link being defined in one phase and between two states of the vehicle (such as "doors closed, trunk closed" and "doors closed, trunk closed, one door open"). To this end, a contextual menu contains four zones, "initial phase", "initial state", "final phase" and "final state", which make it possible to select, among all already defined phases or among all already defined states, those which represent the use case. With this contextual menu, and by virtue of buttons, it is possible to add states and phases in the proposed lists of states and phases. In working to define a use case, there are added phases that are specific to the service in question, while the modes are for all services.

For example, the "brake" service contains four phases:
emergency braking,
braking,
brake failure and
normal brake operation ("brake nominal phase").

For example, for the "air-conditioning" service, two phases are defined, one for low available energy levels, for which ventilation is effected without cooling of the ventilated air, too energy-consuming, and the other for the case of engine running, the air-conditioning being effected with cooling of the ventilated air.

The operating algorithm of a service is represented by rectangular blocks, representing states, and by arrows, representing an action or absence of action that causes a transition between states. By convention, the arrows leading out from one state exit the block representing that state at one of its right or left vertical faces, while the arrows reach the states at one of the upper or lower horizontal faces of the corresponding block.

A transition represents a client request. For example, clicking on an open-trunk badge causes a change from the "all closed" state, in which all openings of the vehicle are closed, to a "doors closed/trunk open" state. For each state, there is defined in this way a set of elementary operations that must function or be executed in the said state. The set of states and transitions forms a control automaton associated with the service.

It is evident that the states can be regarded as "client feelings", the transitions being the requests of the client, which may be implicit. It is understood that the phases are attributes of the states, although two states that are identical except for their phases (phases "before ignition" and "after ignition", for example) are considered as two independent states.

It is also evident that the vehicle cannot be in two states simultaneously for the same service and that, if two services are not independent (such as automatic radio and guidance system using the same indicator), there is added an arbitration service, invoked on request of at least one of the services in question, which will determine how the system will behave when the two services are using the same resources.

For example, to describe a link definition whose logic is:

"regardless of the initial context of the vehicle, the ignition being on, if a crash is detected, then all accesses must be unlatched", then if the doors have already been unlatched it is not necessary to unlatch them;

there is selected the phase "ignition on" and the initial state "vehicle latched by the passenger-compartment button" and there is selected the link to the final state "emergency unlatch" passing through the transition or request "crash detected". This is repeated for all initial states except "all openings open" and only for the phase "ignition on".

As soon as a link has been added and validated, a graphic appears in the right part: two rectangles, above which there appear the names of their respective phases ("ignition on" and "crash") and a curved link, with the name of the transition under the link. The use case then becomes a formalized use case ("CUF").

When a state is added with regard to a new use case, it is necessary to check whether it is useful in the other use cases.

For example, if the "childproof latch" use case is added, making it possible to prevent children from being able to open the rear doors, it is necessary to add the corresponding state in the description of the "crash" use case.

By processing all the use cases of all the variants of a given service, there has been created a control automaton of the service that appears in graphical zone 630 when the service is selected after the "FUNC" tab has been clicked.

When the "Requirements" tab is selected, as illustrated in FIG. 6, no vertical tab appears at the side in graphical zone 630.

Figure 7:
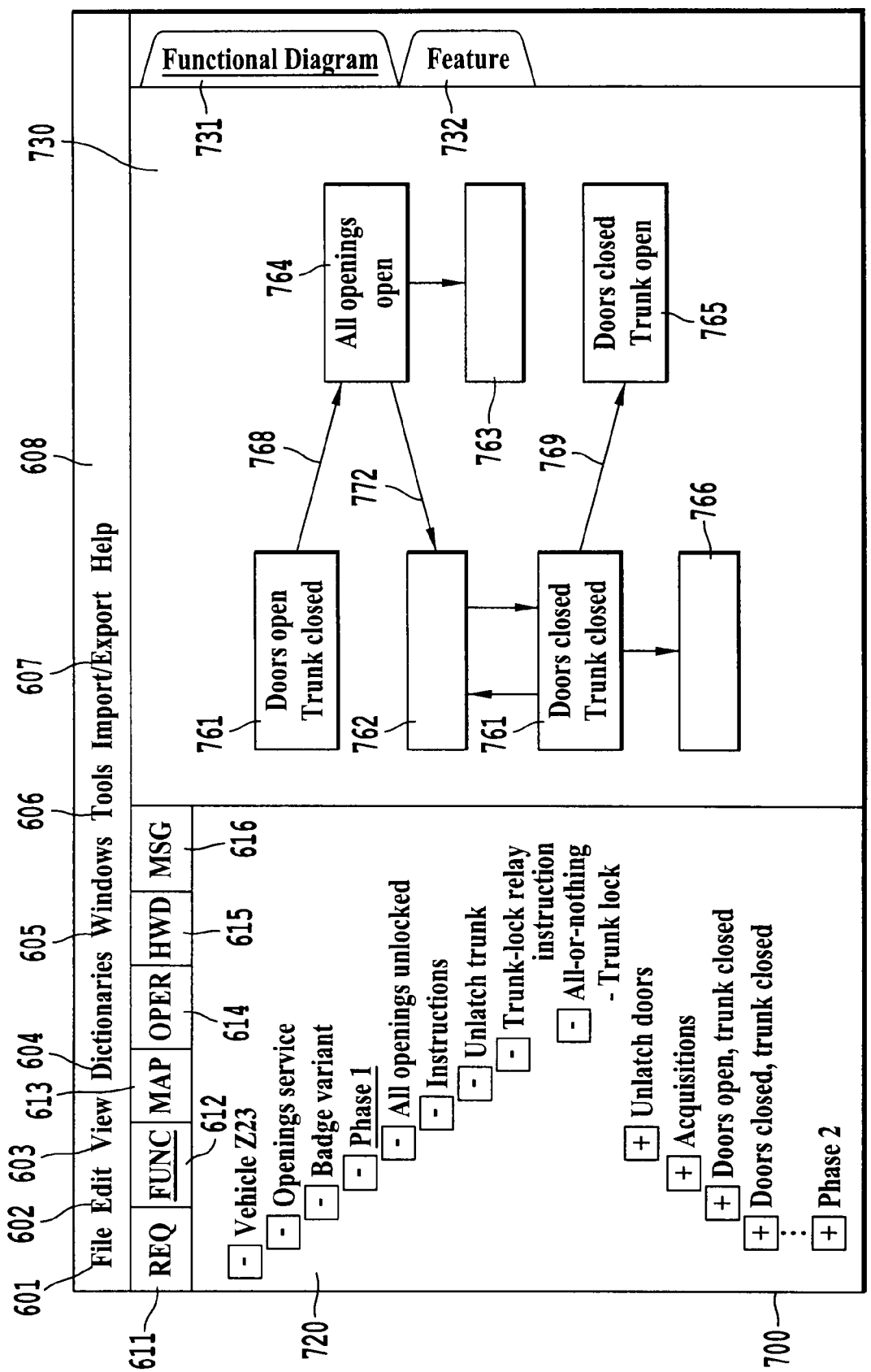

The designer then selects the "FUNC" or "feature description" tab. FIG. 7 illustrates an image of the user interface that is then displayed on the screen of the design station.

In FIG. 7, user interface 700 of this software tool then comprises:

drop-down menus 601 to 608, six horizontal tabs 611 to 616, a hierarchical list zone 720, a graphical zone 730, and vertical tabs 731 and 732.

Vertical tabs 731 and 732 are respectively named "functional diagram" and "feature" and are attached to graphical zone 730. They are used to select a content to be displayed in this graphical zone 730, as explained hereinafter.

At the left, hierarchical list 720 contains part of the list in which the ten highest levels of hierarchy are as follows:

```
vehicle name
    services
        service variants
            phase
                state
                    group of elementary operations
                        elementary operation
                            datum
                                driver
                                    component.
```

The highest three levels of hierarchy are identical to those of list 620 and in particular contain the services. Selection of one of the components of the hierarchical list by left clicking causes, together with the "feature" tab 732 selected, the set of elements of the list of immediately lower level to appear in graphical part 730, sometimes with a control flow between the components if the mouse is used to point to and click on a service variant (the phases appear in the left part linked to one another by client requests corresponding to phase transitions) or on a phase (the phase states appear in the left part, linked to one another by the "client requests").

When an item in hierarchical list 720 is clicked on with the right button, the tool makes it possible in particular to add or remove elements in the hierarchical level immediately below. By clicking on one of the items phase, state or group of elementary operations, it is also possible to add an elementary operation transversely in respectively the said phase, or in other words in the set of states of the said phase, while indicating in which group of elementary operations the said elementary operation is being added, in the said state, in particular indicating in which group of elementary operations the said elementary operation in the said state is being added, and in the said group of elementary operations. By right clicking on the phase item of hierarchical list 720, it is possible to add a phase transition, in which case the tool asks for the arrival phase, the client request corresponding to the transition and the departure and arrival states for the phase transition. By right clicking on the state item of hierarchical list 720, it is possible to add a state transition, the tool then asking what is the arrival state of the transition and what is the corresponding client request.

More generally, by clicking on a level of hierarchical list 720, it is possible to add or remove an element of the immediately lower level.

Still in the context in which the tabs "FUNC" 612 and "Feature" 732 have been selected, if a state is pointed to and clicked on, there is then obtained in the right part, in graphical zone 730, the groups of elementary operations, represented as the nodes of an oriented graph, each arrow representing the data flow between the departure group of elementary operations and the arrival group of elementary operations. This data flow is defined relative to the data flow between elementary operations, inasmuch as any datum that appears is in fact produced by one or more elementary operations of the departure group of elementary operations and consumed by one or more elementary operations of the arrival group of elementary operations.

Still in the context in which the tabs "FUNC" 612 and "Feature" 732 have been selected, if an elementary operation is pointed to and clicked on, there is seen in graphical zone 730 the set of other elementary operations and components (sensors, actuators) with which the elementary operation exchanges information. Once again, this is an oriented graph, and, on each link, there can be found the set of data exchanged between the elementary operation that has been pointed to and the elementary operation or the component that is receiving or sending at the other end according to the direction of the arrow of the oriented graph. The selected elementary operation is characterized by a specific color or by a specific location (center of the screen, red color), so that it can be easily distinguished from other elementary operations and from sensors and actuators. Similarly, the elementary operations other than that clicked on in hierarchical list 720 are distinguished from components by taking on a different color.

Still in the context in which the tabs "FUNC" 612 and "Feature" 732 have been selected, if the given level, or in other words the eighth level of the hierarchy presented in the foregoing, is now pointed to and clicked on, there appears in the right part of the screen, in graphical zone 730, a graph with the selected datum at the center of the graph and, surrounding this datum, the elementary operations that produce this datum (on the left) or that consume it (on the right) and possibly the sensor or sensors that produce this datum or the actuator or actuators that consume it. Preferably the consumers are placed on the right and the producers on the left. It is natural for there to be a plurality of consumers for one datum. It may be normal that the same datum is produced by a plurality of elementary operations, for example if they are not functioning in the same phases.

Depending on the level of the selected element of the hierarchical list, there is seen in graphical zone 730, when "feature" tab 732 is selected:

| | |
|---|---|
| vehicle name: | the oriented graph whose nodes are variants of envelope service and the arrows are the data flows between these service variants. Conditions are imposed on this graph by the choice of a configuration, or in other words the choice of a service variant per service. This is represented in FIG. 15. |
| services: | the list of service variants and, for each, the envelope view of the type of scheme 830. |
| service variants: | envelope view of the type of scheme illustrated in figure |
| phase: | envelope view of the type of scheme illustrated in FIG. 8 for the elementary operations of the phase, restricting the other services to mode combinations of the phase |
| state: | envelope view of the type of scheme illustrated in FIG. 8 for the elementary operations of the state, restricting the other services to mode combinations of the phase in which the state is specified. |
| group of elementary operations: | as when the "functional diagram" tab is selected |
| elementary operation: | a graph with, at the center, the selected elementary operation and, around it, the sensors, actuators and other elementary operations of the architecture in its entirety to which it is linked, the edges of the graph being data flows between the nodes. |
| datum: | the elementary operations, sensors or actuators to which the datum is directly linked are displayed in a graph. The sensors or elementary operations that produce the datum appear on the right, while the actuators or elementary operations that consume the datum are placed on the left of the datum. The arrows indicate the direction of movement of the datum (from the producer to the consumer). |
| driver: | the characteristics of the driver, of the input/output type, analog/digital type, all-or-nothing type, its electrical characteristics. |
| sensor/actuator: | a graph with, at the center, the selected sensor or actuator and, around it, the elementary operations of the architecture in its entirety to which it is linked, the edges of the graph being data flows between the nodes. |

By selecting a service at the second hierarchical level, when "functional diagram" tab 731 is selected, there is seen in graphical part 730 the corresponding automaton, together with the states (or operational situations) and the phase transitions only. In FIG. 7, there is seen an automaton corresponding to the "badge" variant of the "openings" service: states 761 to 766 and transitions 768, 769 and 772. By clicking with the left button on an arrow representing a transition, a contextual menu appears that describes all the requests that lead to this transition. Generally a single request causes this transition: for example the "ignition_on" request, which corresponds to turning on the ignition, for example with the ignition key, brings about a change from the "ignition not on" phase to the "ignition on" phase, although several requests originating from formalized use cases may link two states. For example, in a very simplified version of the unlocking service, it is possible that the vehicle locked and vehicle unlocked states are linked by the following client requests: "request for latching by badge" and "request for latching of the openings in the vehicle by control button". Nevertheless, it will have been possible to formulate two different formalized use cases, one for remote unlatching and the other for unlatching inside the vehicle.

The fourth level of hierarchy concerns the phases. When a phase is selected and when "functional diagram" tab 731 is selected, there is seen in graphical zone 730, under the name of the phase, the names of the states corresponding thereto, in rectangles.

By clicking on the transition between two states, it is possible to select an elementary operation in order to specify implementation thereof, or in other words execution of the client request corresponding to this transition: this elementary operation will then have to take as argument the set of data-processing data originating from sensors, actuators or incidentally other services necessary for the data-processing calculation that will be executed to decide whether or not the client request is detected. In this way there are accessed software translations of requests originating from phase transitions.

For each state, by means of a contextual menu that appears when the state is clicked on with the right button, there are defined which elementary operations must be activated (sensing, actuator instructions, control rules and their interfaces specified in other tools such as Matlab/Simulink, Statemate). They are grouped together according to different logics or practices of the designer.

By clicking with the right button on a phase in the fourth level of the hierarchy, there is made to appear a contextual menu that, among other capabilities, makes it possible to link the phase to the modes (in a contextual menu there is seen a list of modes, such as energy, client, vehicle state, with check boxes for associating the phase with mode combinations). For example, the "crash" phase is specified in modes in which it is valid.

By selecting an element of the fifth level ("state"), still with "functional diagram" tab 731 selected, there is seen in graphical zone 730 the part of the automaton concerning the selected state and the transitions (or requests) that join the selected state and other states. In a state there can be added elementary operations: sequence of operations to be performed (acquisitions, instructions, control rules, algorithms). The state is right-clicked on and "add" is chosen: the selection is made in a list of elementary operations (technical library).

It is then possible to create, if necessary, a new elementary operation, with which input and output data will have to be associated later on.

At the sixth level of hierarchy, the elementary operations are organized in groups to facilitate navigation. The groups of operations contain the same elementary operations for all horizontal tabs 611 to 616.

When an elementary operation is selected in the seventh level of hierarchy, there is seen, in graphical zone 730, the data flow, or in other words the data exchanged by this operation (data in the input and output rectangles). If a group of elementary operations is selected in the sixth, there is seen, in graphical zone 730, the data flow between the elementary operations that it contains. If a state is selected in the fifth level of hierarchy, there is seen, in graphical part 730, the data flow between the groups of elementary operations that it contains. For each of the fifth to the seventh levels, if a link is selected in the graphical part by clicking on the left button, there is seen, in a contextual menu, a list of exchanged data. By selecting one, it is possible to modify it (see hereinafter).

When a datum is selected in the eighth level of hierarchy, there is seen, in graphical zone 730, all the elementary operations that consume it and those that produce it, including those outside the state, service or phase.

The elements of the ninth and tenth levels of hierarchy ("driver" and "component") are furthermore known and derive from the library of the vehicle maker, from equipment manufacturers or from suppliers.

To obtain a difference between the interfaces and controls of service variants on two different vehicles, for example, the service in question is selected by right-clicking in list 720, and the "show differences" option is selected in a contextual menu. In a contextual dialog box, there is then selected the service variant of another vehicle that is to be compared with the already selected service variant. There then appears, in a contextual dialog box, a hierarchical list: Phase/State/Group of elementary operations/Elementary operations/Data/Drivers/Components of the two selected services, together with, at the different levels of the said hierarchical list that is selected, a "+" sign when only the service variant selected in first place contains the elements of the selected level, a "−" sign when only the service variant selected in second place contains the elements of the selected level, a "!" sign if a difference exists at a level lower than the selected level, and no particular sign if the two hierarchical lists of the service variants being compared are identical at this level.

Depending on the level of the selected element of the hierarchical list, there is seen in graphical zone 730, when "functional diagram" tab 731 is selected:

| | |
|---|---|
| vehicle name: | list of services |
| services: | list of service variants, |
| service variants: | the graph whose nodes are the phases and the oriented arrows are the client requests for phase change, |
| phase: | the set of states in a scheme such as that represented in FIG. 7, |
| state: | the data flow of groups of elementary operations executed in the state, |
| group of elementary operations: | the data flow of elementary operations in the group of elementary operations, |
| elementary operation: | a graph with, at the center, the selected elementary operation and, around it, those sensors, actuators and other elementary operations of the architecture in its entirety to which it is linked, the edges of the graph being data flows between the nodes. |
| datum: | defined previously |
| driver: | defined previously |
| component: | defined previously |

Figure 8:
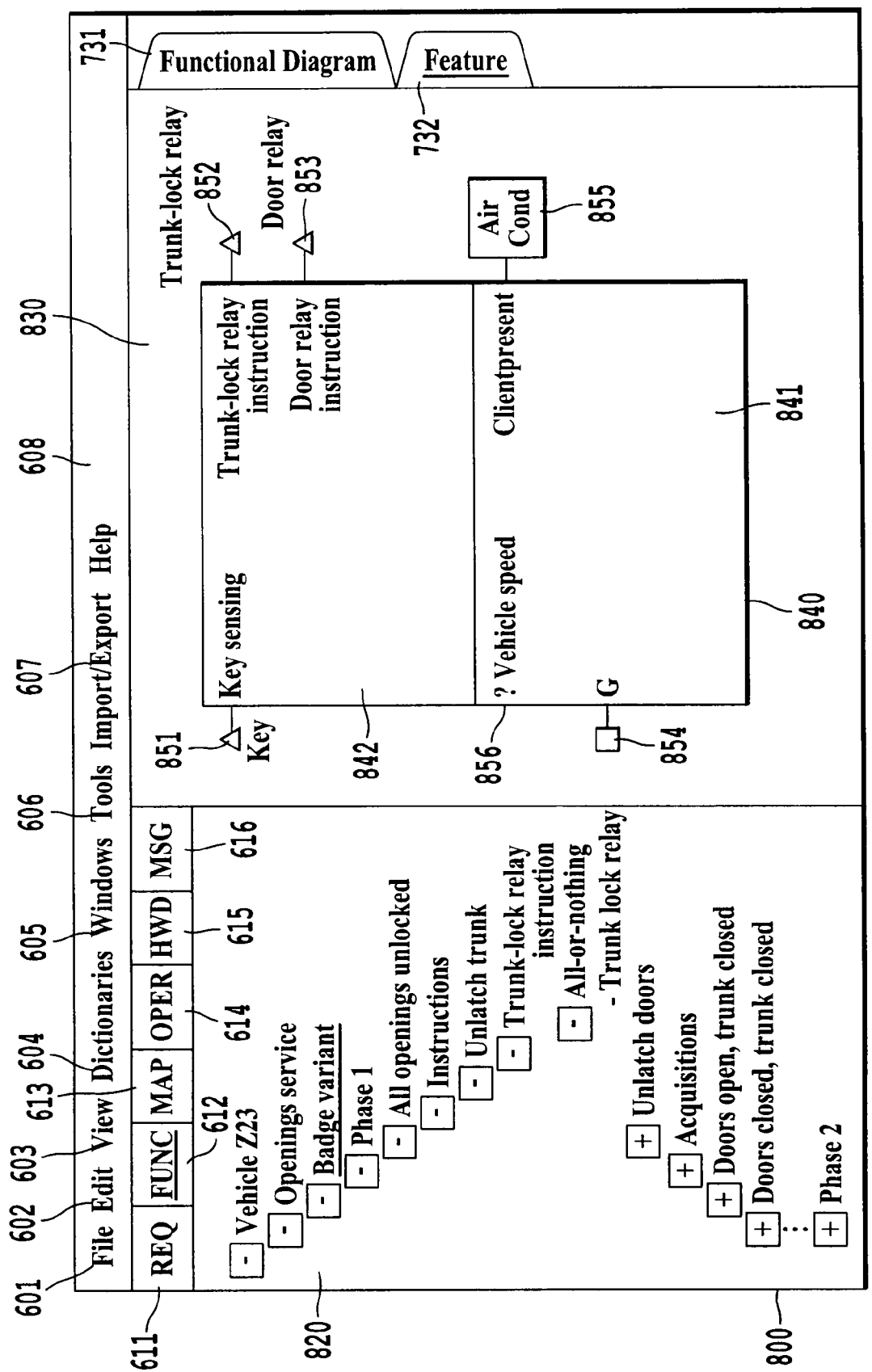

To go to the following step of the design of the architecture of the electronic and data-processing system of hardware and software components, the designer then selects "feature" tab 732. One of the screens that corresponds to this selection is illustrated in FIG. 8. In this screen, whose text part 720 is identical to that illustrated in FIG. 7, if a service variant is selected (third level of hierarchy), there is observed in graphical zone 830 an envelope 840 of the service variant.

This envelope 840 is represented in the form of a rectangle, divided horizontally into two rectangular parts. The upper part is connected at the left to representations of sensors 851 that supply it with data, and at the right to actuators 852 and 853, to which the service variant supplies data. The lower part is connected at the left to entering data 856 and 854 and at the right to exiting data 855. The data that merely pass through the variant without being used (or consumed) are not represented.

If an entering datum is clicked on with the left button, there is observed, in a contextual menu, all sources of the selected datum, in terms of elementary operations.

In this representation of envelope 840, there is used a formalism that permits a synthetic view of problems to be settled: an exclamation point indicates a supposed conflict (for example, in the case in which, at the output, several services are trying to deliver the same datum), which implies settling an arbitration problem; a question mark opposite an entering datum for which no element has yet been defined to produce the said services.

This envelope representation 840 gives a synthetic view that is very practical for the user of the design tool. If a datum, a sensor or an actuator is clicked on in the envelope representation, there is obtained a functional view indicating the operational elements that produce the datum and those that consume it. If one of these elementary operations is selected or clicked on, then there is seen in a new screen the list of calculator variants onto which this elementary operation is mapped. This display is implemented in a new window, which appears at the time of double clicking. By clicking on a sensor or an actuator, there is obtained the list of service variants that exploit this component as well as the list of calculator variants to which the component is allocated. Return to normal is effected by closing the windows created in this way.

In addition, the services with which the selected service exchanges data appear directly in boxes such as 855 directly associated with the input and output data of the service. When several services consume or produce a datum, then this is not the name of one of the services displayed but is the sequence "...", in which case it is necessary to click on the box similar to 855 to see the list of services displayed in a new window.

When a datum is produced or consumed by an elementary operation that is not allocated to a service, then a specific icon 854 is seen to appear, associated with the datum. Under certain circumstances, for example when the description of elementary operations has been recovered from a calculator but these elementary operations are not linked to a service, this type of notation makes it possible to know that the elementary operation producing datum G in our example has indeed been defined and mapped.

To go to the following step of design of the architecture of the electronic and data-processing system of hardware and software components, the designer then selects "MAP" or "feature architecture" tab 613. One of the screens corresponding to this selection is illustrated in FIG. 9.

Figure 9:
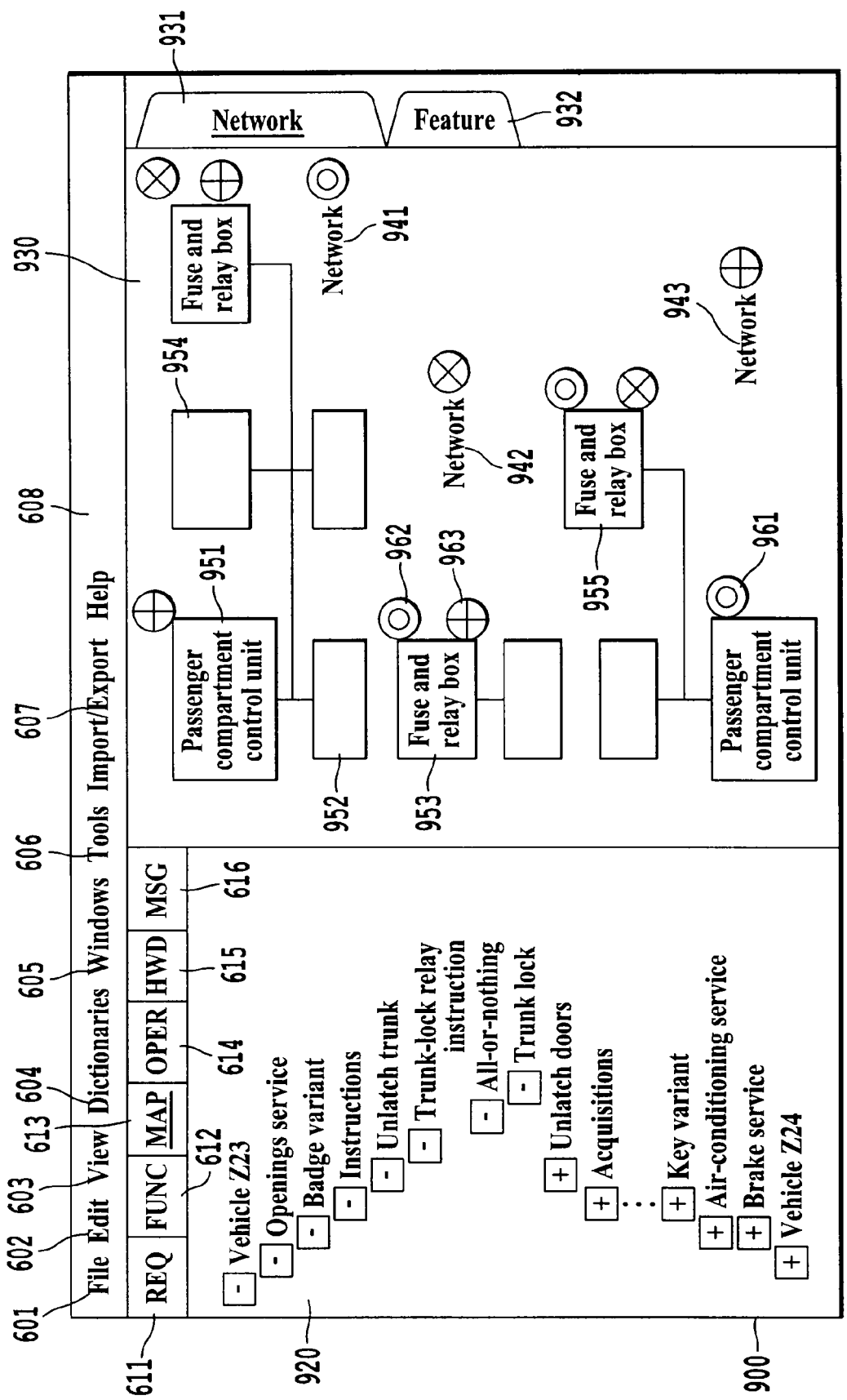

As is evident in FIG. 9, user interface 900 of this software tool then comprises:

drop-down menus 601 to 608,
six horizontal tabs 611 to 616,
a hierarchical list zone 920,
a graphical zone 930, and
vertical tabs 931 and 932.

Vertical tabs 931 and 932 are respectively named "networks" and "feature" and are attached to graphical zone 930. They are used to select a content to be displayed in this graphical zone 930, as explained hereinafter.

At the left, there is seen hierarchical list 920, which contains part of the list in which the seven highest levels of hierarchy are as follows:

```
vehicle name
   services
      service variants
         group of elementary operations
            elementary operation
               data
                  driver
                     sensor/actuator
```

The highest three levels of hierarchy are identical to those of hierarchical lists 620 and 720 and in particular contain the services. Selection of one of the components of the hierarchical list by left clicking causes, together with the "network" tab 931, selected, the set of networks 941 to 943 of calculators 951 to 955 to appear in graphical part 930, as a synthetic representation in which, for the selected element, the distribution thereof over the calculators and data flows concerning it on the networks can be observed.

Depending on the level of the selected element of the hierarchical list, the set of networks (the nodes and the different networks) is observed in graphical zone 930, when "network" tab 931 is active.

Each network is represented together with all calculators connected thereto, the network possessing a specific color, represented here by stickers, labels or patches 961 to 963 marked with "+", "x" or "o" signs. Calculators present on two networks—calculators 951 and 955—are endowed with "sticker(s)" on each network to which they are connected, each "sticker" having the color, represented here by the sign, corresponding to each other network to which the calculator in question is directly connected. The stickers therefore give a three-dimensional view without complexity of representation.

By clicking with the right button on a network, there is observed, in a dialog box, the list of data being transported on the said network. The icons representing the data, which are followed by their name in clear text, appear in green on a white background if the datum in question is not placed in a frame circulating on this network, in blue on a white background if the data is placed in a frame and in blue on a gray background if the datum is not being used by any calculator, whether this calculator is directly on the network or is accessible via bridge calculators between the network and other networks.

These views permit an estimate of the bus load in the mean time between two transmissions of the same datum. This mean time is estimated, for example, by taking into account the communication protocol used on the network under consideration and displayed in the contextual and performance window of the said protocol, for example the load level that saturates the network (on the basis of 30% load for a CAN, it is found that the most critical frames cannot arrive in the desired time because of the arbitration mechanism, which delays the transmission of a frame if the sending of another frame of higher or equal priority has already been requested), and the share of the data flow that results from protocol management (50% for a CAN, typically because the protocol management data (arbitration, CRC, etc.) represent practically as many bits on average as the data effectively transported by a frame).

The data flow is calculated per mode, and the highest load is taken in the mode in which it appears. This aspect is motivated by the fact that, for example, in diagnostic mode, certain frames corresponding to a client mode are inhibited and therefore need not be taken into account in the load calculation. Reciprocally, the load calculation during operation for the final client does not have to take diagnostic frames into account. A frame is emitted in a given mode if and only if at least one of its data is exchanged between two elementary operations that are active in this said mode.

With "network" tab 931 selected, the tool user can effect mapping of a service variant or of a group of elementary operations, or else mapping of an elementary operation selected in the zone of list 920, onto one or more calculators represented in graphical part 930, by the well known "drag and drop" function (which can be translated into French by "shift and release"). To this end, when a service variant or a service is clicked on with the right button, a contextual menu appears and proposes the different types of mapping.

If an elementary operation exists in several service variants, for example the elementary operation "Unlatch trunk", which in hierarchical list 920 in FIG. 9 is linked to both the "badge variant" and the "key variant", then the fact of mapping this elementary operation, for example onto calculator 953 of the BRF type, at the moment of mapping of the "badge variant" service, will also map this elementary operation for the "key variant" service and, even if the "key variant" service is subsequently mapped onto the calculator of UCH type, only the elementary operations not yet mapped will be mapped onto the calculator of UCH [passenger-compartment control unit] type, the "Unlatch trunk" elementary operation remaining mapped onto the calculator of BFR type. The situation would be the same with a group of elementary operations of a service variant other than the "badge variant", if it were to contain the "Unlatch door" elementary operation and be mapped, for example onto the calculator of UCH type. In this way, the elementary operations shared among several services are mapped only one time. In addition, once an elementary operation is mapped, its mapping can be canceled and replaced by another type of calculator by clicking in a menu obtained by selecting the said elementary operation by right clicking.

The different types of mapping include, in particular, mapping onto a single calculator, master-slave mapping and distributed mapping. In the master-slave type of mapping, the "control" part of the service sends instruction messages on at least one network to instruct each slave, and the tool automatically adds these instruction messages in or outside already defined frames (see hereinafter). To be able to map the master and slave when the master-slave type of mapping is selected, an elementary operation, representing the control automaton of the service, is automatically added in relationship with the service variant under consideration. It is called "elementary control operation". Thereafter, by drag and drop operations, the service variant or a group of elementary operations or one elementary operation and in particular the elementary control operation are mapped onto a calculator variant. There are as many slaves as there are nodes onto which the elementary control operation is not mapped and onto which at least one elementary operation of the service is mapped. The node onto which the elementary control operation of the service is mapped becomes the master node.

The first step before mapping as master and slave is to synthesize the control operation. For this purpose, it is considered that this operation consumes all the data that permit calculation of the control automaton of the service. For example, if a transition is conditional upon a Boolean datum "a" being set to unity, where "a" is the result of an elementary operation, then the elementary control operation in the case of a master-slave mapping will in particular have "a" as input datum.

The distributed type of mapping means that elementary operations of the same service are distributed onto a plurality of calculators and that, in addition, the control automaton of the service is synthesized on each of the said calculators.

Thus, on each node onto which at least one elementary operation of the service has been mapped, there is automatically added, at the instant of mapping, an elementary control operation that represents the control automaton of the service. This elementary control operation is the same as that which would have been synthesized automatically for mapping of the master-slave type.

For each mapping of a service, a mapping dialog box appears to ask if the elementary operations, the sensors and actuators in question must be mapped simultaneously and onto the same calculator. If the decision is made to map the service together with the actuators and/or sensors in question, the design tool connects them to the calculator. If the elementary operations, the sensors and/or the actuators are not mapped onto the same calculator as the rest of the service, the design tool adds the data necessary for good operation of the service inside or outside already defined frames (see hereinafter).

If, at the instant of mapping onto a node, or in other words onto a type of calculator, several calculator variants implement this type of calculator, then a dialog box appears to ask onto which of these said calculator variants the selected component must be mapped.

Figure 10:
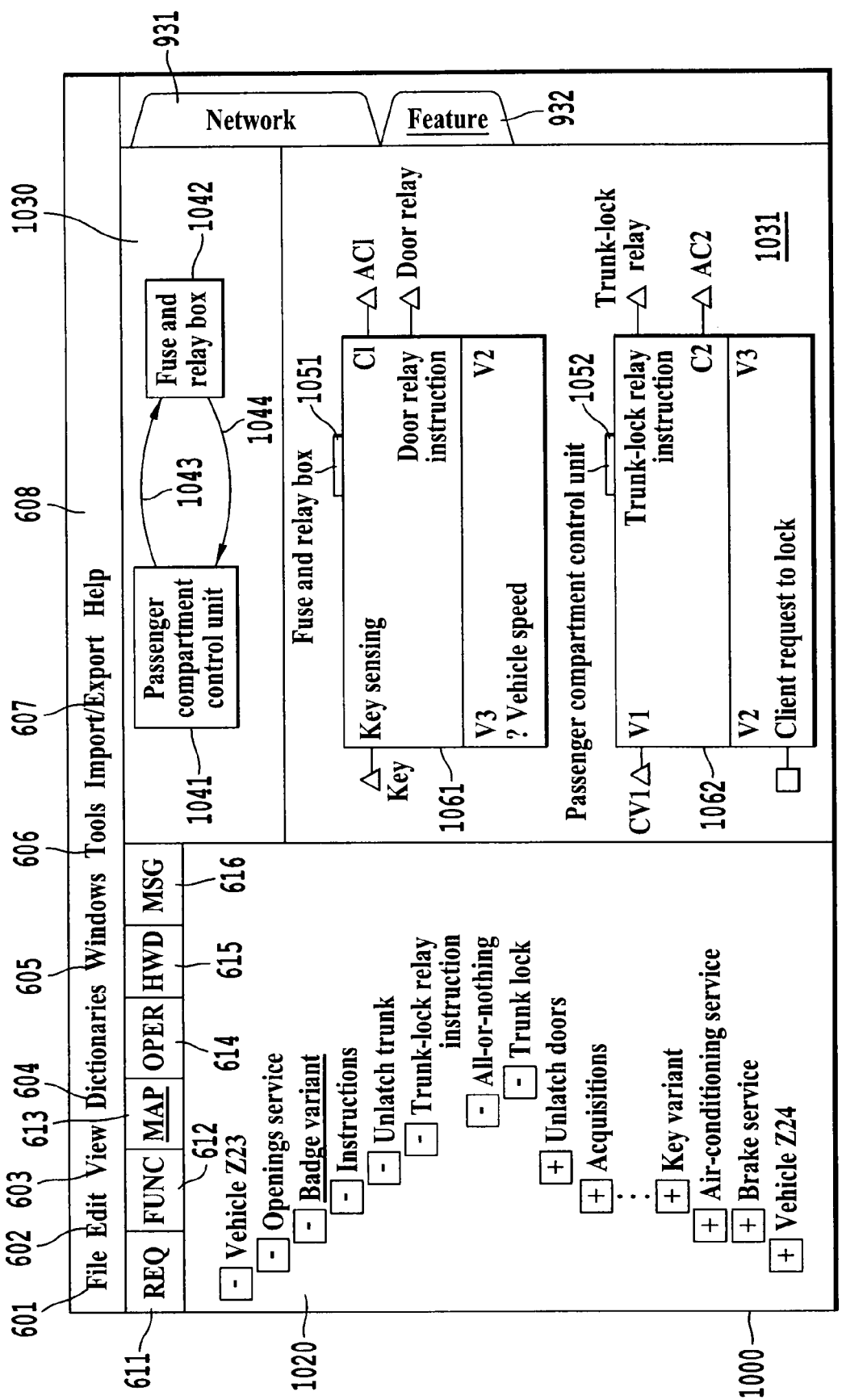

As illustrated in FIG. 10, if "feature" tab 932 is selected and a service variant is selected (second level of hierarchy), there is seen, in graphical zone 1030, positioned one below the other, all envelopes 1061 and 1062 of calculator types containing at least one elementary operation of the selected service. Only those input and/or output data of elementary operations of the selected service variant that are contained in these types of calculators are displayed, thus making it possible to see, for the said service, the state of progress of mapping and the state of internal and external exchanges of the service variant within the electrical and electronic architecture. If data such as V2 or V3 are produced or consumed by other service variants, then this is indicated with the same conventions as in zone 841 in FIG. 8.

Also evident in graphical zone 1030 are the same two types of calculators 1041 and 1042, corresponding respectively to 1062 and 1061, on which is installed the selected service variant, as well as the data flows that they exchange. By clicking on one of the arrows 1043 and 1044 representing these data flows, there are seen the exchanged data in a dialog box (not illustrated). In these boxes there would be seen the data V2 and V3, which are the only exchanges, internal to the service, between the calculators of the UCH and BFR type.

Figure 12:
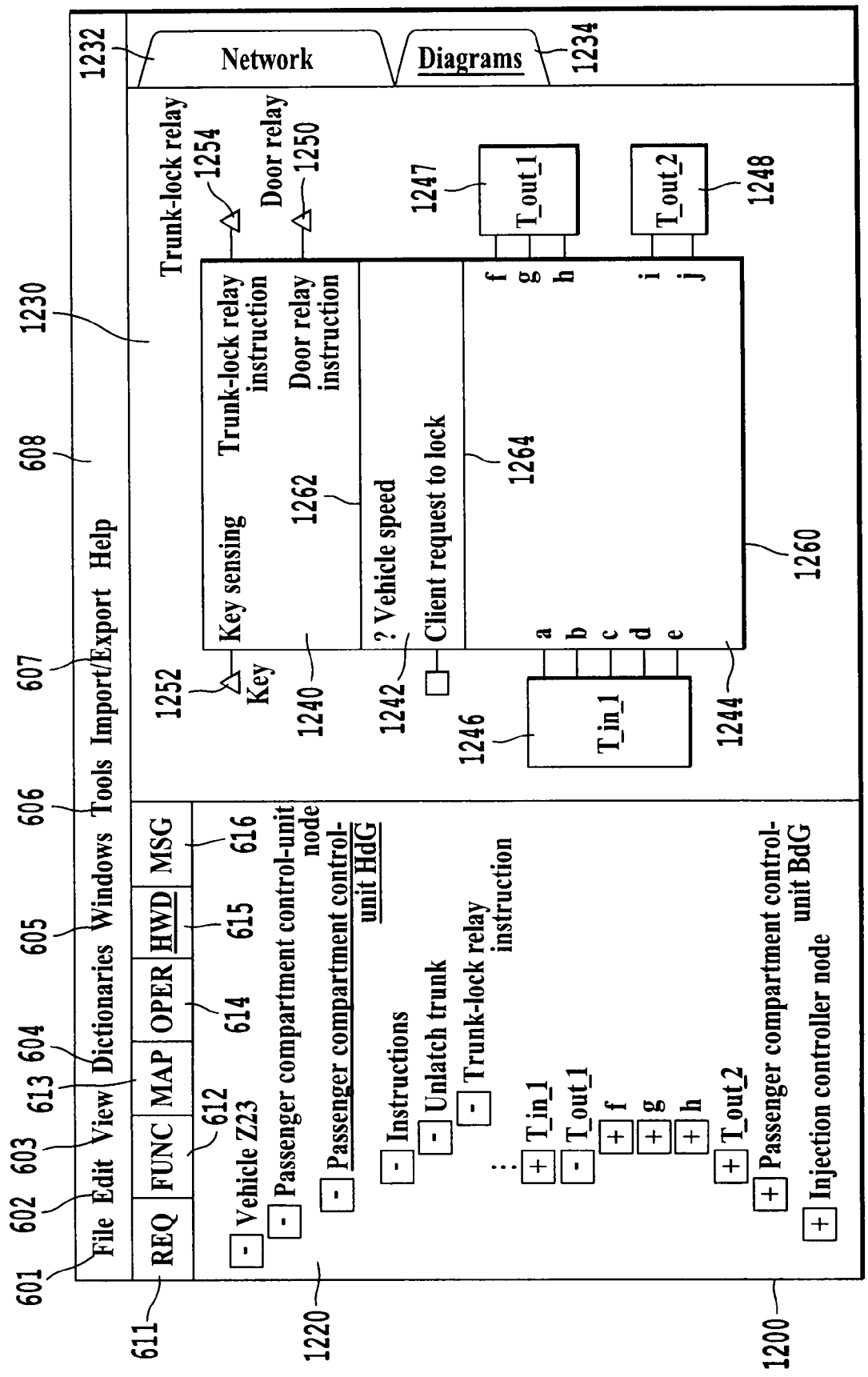

If data frames were being exchanged, they would be represented in envelopes 1061 and 1062 in the manner of the representation in zone 1244 of FIG. 12.

These graphical representations are updated following evolutions of the mapping of elementary operations of this service variant.

If "feature" tab 932 is selected and an element of one of the fourth to sixth levels of hierarchy is selected, the data flows are seen in graphical zone 1030 (see "Func" tab 612 hereinabove), albeit for all states together (hierarchical list 820 no longer contains a level representing the states).

The first three tabs, 614 to 616, concern the hardware with diversity-type management, or in other words different variants of hardware implementation of the system.

Figure 11:
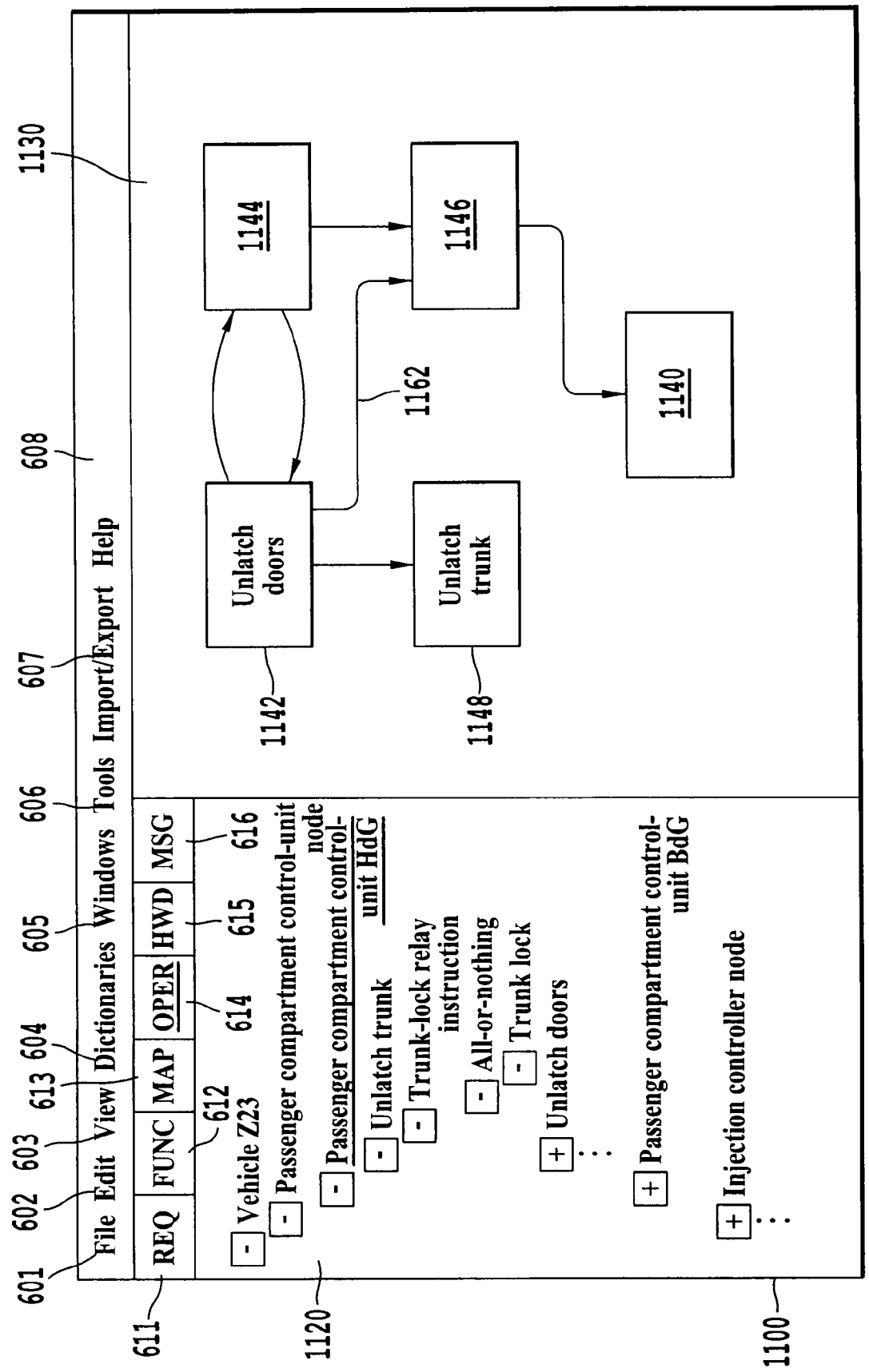

When the designer selects "operational architecture" or "OPER" tab 614, he accesses a description of the elementary operations of each calculator. FIG. 11 shows a user interface that is displayed when "OPER" tab 614 is selected.

As is evident in FIG. 11, user interface 1100 of the software tool then comprises:

drop-down menus 601 to 608, six horizontal tabs 611 to 616, a hierarchical list zone 1120, and a graphical zone 1130.

At the left, there is seen hierarchical list 1120, which contains part of the list in which the six highest levels of hierarchy are as follows:

--- vehicle name
  calculator type
    calculator variant
      service
        elementary operation
          data
            driver
              sensor or actuator

---

Depending on the level of the element selected in the hierarchical list, there are seen in graphical zone 1130:

calculator type The data flow between the different nodes of the network, regardless of whether this flow is implemented in frames or networks of all kinds. If an elementary operation mapped onto a node consumes a datum produced by another elementary operation on another node, then the exchanged datum appears in the data flow represented graphically by an arrow directed from the node in which the data are produced toward the node in which the data are consumed.

calculator variant The oriented graph, in which the nodes are the elementary operations mapped onto the calculator variants, 1140, 1142, 1144, 1146, 1148 and the arrows, such as 1162, are data flows between these elementary operations.

elementary operation The links to the sensors and actuators linked to the selected elementary operation and installed on the calculator.

data The elementary operations, sensors or actuators to which the datum is directly linked are displayed in a graph. The sensors or elementary operations that produce the datum appear to the right, while the actuators or elementary operations that consume the datum are positioned to the left of the datum. The arrows indicate the direction of movement of the datum (from the producer to the consumer).

Driver the characteristics of the driver, input/output type, analog-digital type, all-or-nothing type, its electrical characteristics.

Sensor/actuator a graph with, at the center, the selected sensor or actuator and, around it, those elementary operations of the architecture in its entirety to which it is linked, the edges of the graph being data flows between the nodes.

FIG. 12 shows a user interface that is displayed when "hwd" or "hardware architecture" tab 615 is selected.

As is evident in FIG. 12, user interface 1200 of the software tool then comprises:

drop-down menus 601 to 608,
six horizontal tabs 611 to 616,
a hierarchical list zone 1220,
a graphical zone 1230, and
vertical tabs 1232 and 1234.

At the left, there is seen hierarchical list 1220, which contains part of the list in which the six highest levels of hierarchy are as follows:

--- vehicle name
  calculator type
    calculator variant
      frames
        datum in the frame
        sensor/actuator
        data
        driver

---

Depending on the level of the element selected in the hierarchical list, there are seen in graphical zone 1230, when "networks" tab 1232 is selected:
  vehicle name the networks of this vehicle architecture
  calculator type the networks to which this type of calculator is connected, represented in FIG. 16
  calculator variant the networks to which this calculator variant is connected
    frames or the network to which this frame belongs
    datum in the network frame to which this datum belongs (via the frame) sensor/actuator the type of calculator to which this component is connected and the networks on which this type of calculator is connected.
  Data None
  Driver None and, when "Diagrams" tab 1234 is selected:
  vehicle name None
  calculator type A graph whose nodes are the calculator types and whose arrows are the frame flows, the arrows being oriented from the sender node to the receiver node.
  calculator variant display as defined in FIG. 12 by the contour 1260 divided into three parts 1240, 1242 and 1244 by two horizontal lines 1262 and 1264. In zone 1240, the links of the calculator variant to sensors or actuators are displayed, the links to the sensors 1252 being displayed on one side and the links to the actuators 1250, 1254 being displayed on the other side. In the diagram, in the case of acquisition of information originating from a sensor 1252, the datum appears inside contour 1260, while the name of the sensor, "Key", appears outside the contour. In this way, the designer can easily distinguish the names of the data of the application software installed on the calculator variant, the names of the different sensors and actuators and, in addition, the link of the sensors/actuators to the software data is clear. In zone 1244 there are represented the electronic messaging system interface of the selected calculator variant. This electronic messaging system interface is composed of message frames consumed or produced on the various networks to which the selected calculator variant is connected. The consumed frames are represented by one side of the zone and the output frames are represented by the other side. For example, T_in_1, is an input frame 1246, and T_out_1 and T_out_2 are sent frames 1247 and 1248 respectively. Only the data effectively consumed and produced by at least one elementary operation on the selected calculator variant are represented in zone 1244 in correspondence with the different frames. For example, if a site for a datum "n" is reserved in T_in_1, and if the datum "n" is not consumed by any elementary operation on the selected calculator variant, then "n" does not appear in zone 1244. Reciprocally, the datum "a" that appears in correspondence with T_in_1 is therefore consumed by an elementary operation mapped onto the selected calculator variant. Finally, in zone 1242, there are found those input and output data of the selected calculator that are linked neither to sensors/actuators nor to frames and that nevertheless originate from or are destined for other nodes. The conventions of zone 841 are used for this zone 1242. Finally, the data that merely pass through the selected calculator variant, which then acts as a bridge between networks, are accessible in the form of a list by selecting menu tab 603. The separation of the data into two categories, not yet assigned and already assigned, provides a coherent view of what has been done and what remains to be done.

Frames None
  datum in the frame elementary operations and/or sensors/actuators that are producers or consumers inside the selected calculator variant.
  sensor/actuator a rectangular contour (not illustrated) separated into two parts, the upper part being used to indicate the data produced by the sensor/actuator by means of a driver and used on calculators other that the calculator to which the component is allocated, the lower parts being used to represent the data produced by means of a driver and used on the calculator to which the component is allocated. The data received by the component are on the left of the contour, while the sent data are on the right of the contour. Such a datum-calculator link is represented in a manner similar to data-service link 855 in FIG. 8, apart from the fact that, if the same datum is, for example, sent to a plurality of calculators, then it will be repeated a plurality of times, which is an alternative to a display of the type " . . . ", with a box on which it would be necessary to click in order to access different calculator variants that are other than that to which the component is allocated and that are using the datum.
  data of a sensor or actuator elementary operations and/or sensors/actuators that are producers or consumers inside the selected calculator variant.
  Driver as for the datum, see above.

When "networks" tab 1232 is selected, the hardware architecture and the mapping of calculators onto networks is seen in graphical part 1230.

Each network is represented together with all calculators connected thereto, the network possessing a specific color, represented here by stickers marked with "+", "x" and "o" signs as in FIG. 9. Calculators present on two networks are endowed with "sticker(s)" on each network to which they are connected, each "sticker" having the color, represented here by "+", "x" or "o" signs, of other networks to which the calculator in question is directly connected. The stickers therefore give a three-dimensional view without complexity of representation.

By clicking with the right button on a network, there appears, in a contextual dialog box, the list of data circulating on the said network. In this dialog box, different colors indicate the data that are not allocated in a frame, those that are allocated and are being effectively transported in a frame, and those that are allocated but are not being effectively transported because, for example, they are not produced.

The data circulating on a network are visible in a dialog box by clicking with the right button on the network in question, "networks" tab 1232 or 1232 being active. This dialog box uses colors to indicate mapping of the data in a frame and the use of the data, as explained hereinabove with regard to FIG. 9.

When tab 616 is selected (screen not illustrated), if a datum is selected by clicking on the left button, a pop-up menu makes it possible to reach a contextual dialog box that provides information on the said datum, especially the dimension (a Boolean value with a size of one bit), the extreme values, a default value and the maximum age of the datum, or in other words the time after sensing, at the end of which the datum can be regarded as obsolete, etc.

When "msg" tab 616 is selected, there is obtained, in the right part, a screen analogous to that of FIG. 16 when tab 1232 of FIG. 16 is selected. There is then seen, in the right part of the screen, for each vehicle, all the frames being transported by at least one network and, in the left part of the screen, a representation of different networks, as in zone 1630 in FIG. 16. By clicking on a frame, only the network on which the frame is circulating is displayed. By clicking on one of tabs 1652, 1654, 1656, 1658, only the frames circulating on the corresponding network are displayed in the left part of the screen. When tab 1231 is selected and a frame is clicked on, a presentation of the frame appears in the right part of the screen, showing the essential information of the frame, in particular its size, its period, the type of network then the list of data for which space is allocated as well as the coordinates of this space in the form of byte number and most significant bit and size, then the list of calculator variants that are producers and consumers for each datum.

In the graphical zone corresponding to the selection of tab 616, by clicking with the left button on a calculator, there is seen, by means of a pop-up menu giving a choice between frame and data, in a contextual dialog box, the data or frames consumed or produced by the selected calculator.

FIG. 13 represents a screen 1300 for acquisition and visual display of a product named "vehicle Z23", for which it is desired to construct an electrical and electronic architecture. This screen can be accessed from any of the screens of FIGS. 6 to 12 by a selection in tools menu 606.

In hierarchical list 1320, there is seen a list containing the following first three levels of hierarchy:

---
vehicle name
   groups of nodes and components
      nodes and components
---

The graphical part at the right of the screen contains an upper zone in which three buttons 1312, 1314 and 1316 are represented. The different zones of the vehicle onto which the system components can be mapped appear in the lower right graphical part of the screen, or in subscreen 1330. These vehicle zones are represented by rectangles 202, 204, 206, . . . , 236, 240. To add a zone, the user must first select "place this rectangle" button 1312, which corresponds to a new zone of the vehicle, by clicking on subscreen 1330. He can then change the dimensions of the said rectangle, for example by clicking on one of the corners of the rectangle then dragging this corner as desired, while the opposite corner of the said rectangle remains in place. He can then drag the rectangle as desired in subscreen 1330, in order to make the arrangement of the respective zones understandable for all users. In the case of a motor vehicle, for example, it would make no sense to position the zone representing the right rear door and the zone representing the left front door side by side.

The name of product 1342 is repeated at the bottom of subscreen 1330.

It is noted that the nodes and components defined for the design tool appear in hierarchical list 1320. In fact, this hierarchical list is used once the different components have been mapped: selecting a particular node or calculator makes it possible to locate in which zone of the vehicle it is mapped, this zone automatically changing in appearance in subscreen 1330. For example, when accelerator pedal 1321 is selected in the hierarchical list, cockpit zone 218 changes appearance.

In addition, the components that have not yet been mapped also have a particular appearance, examples being BVA node 1323 or front wiper motor 1322.

By selecting button 1316, it is possible to add an orientable compass 1344 in subscreen 1330, for the purposes of legibility for all users. It is left to the user to indicate which of the axes (left, right), (top, bottom), (front, rear) are to be used and which directions they are to have. In FIG. 13, for the case of a motor vehicle whose zones are represented in a view from above, the orientation permits the person skilled in the art to recognize certain of these zones, such as roof 216, then, step by step, all of the zones represented. In order to make this division into zones more legible, it is possible to name the zones. As an example, this is the case of the right front fender named fender AVD 1346.

FIG. 14 represents a local view of one of the vehicle zones represented in FIG. 13 in subscreen 1330 of screen 1300. This is accessed, for example, by selecting the said zone in subscreen 1330 then double clicking.

In subscreen 1330, it is possible to stipulate the dimensions of the said zone by selecting button 1410 then selecting one of the vertices of the said zone and moving it as desired, while the other vertices remain unchanged. Selecting a contour point of the zone other than a vertex makes it possible to define a new vertex.

A prohibited subzone can be specified by selecting a button 1412 then placing the zone where it is wished to map the prohibited subzone. The prohibited subzone is then mapped in the form of a rectangle having the default dimensions. The exact dimensioning of the subzone is then applied, as for the vehicle zone, by selecting a button 1410 then selecting one of the vertices of the selected prohibited subzone, or by adding a vertex by selecting a contour point other than a vertex.

The routing points are mapped onto the zone by first selecting a button 1414 then selecting the location of the zone in which it is wished to map the said routing point. The connecting points of the zone are mapped by first selecting button 1416 then selecting the location of the zone in which it is wished to map the said connecting point.

As in FIG. 14, a compass can be positioned beside the zone by selecting button 1316, then oriented.

A recommended routing pathway can be mapped by selecting a button 1418 then selecting an initial component or routing point or connecting point, then a final component or routing point or connecting point.

The components and calculators are mapped onto the zone by clicking and dragging from hierarchical list 1420. They can be associated with icons, by means of which they can be located and recognized more quickly.

All elements of the vehicle zone represented can be moved and adjusted by clicking and dragging. Finally, a "ruler" element can be placed in the window to facilitate dimensioning of the different zones. For that purpose, a button 1413 is selected then the location of the zone in which it is desired to position the ruler is selected. By selecting one of the ends of ruler 1444, it is possible to lengthen or shorten it. While this operation is being performed, the real length of the ruler is displayed, for example in millimeters.

It is possible to rotate the ruler around one of its vertices by known means. Positioning the ruler along one of the sides of the zone makes it possible to know the length thereof and if necessary to change its dimensioning.

Still with the objective of the most faithful representation possible, it is possible to make a background grid appear in subscreen 1430, so that the zone can be represented true to scale. As an example, the background grid can be composed of parallel and regular horizontal and vertical lines, dividing the space into squares of 20 mm by 20 mm on a scale of 1:1.

For convenience of use, it is possible by known means referred to as zooms to enlarge and shrink the vehicle zone represented, or in other words to change the scale of the figure to adapt it to the part of subscreen 1430. The zone and all elements positioned on the screen then change in scale.

Once the operation of mapping of connecting points onto different zones has been effected, it is possible to return to the view presented in FIG. 13 in order to link the connecting points of the different vehicle zones corresponding to one another in subscreen 1330. In a certain display mode, which is accessible via "View" menu 603, there appear the connecting points specified in zone 202, for example. This zone contains three connecting points 1350, 1351, 1355. As for zone 220, it contains one connecting point 1353 for the time being. To indicate, for example, that connecting points 1355 and 1353 correspond to one another, or in other words that they in fact represent the same point in space, it is possible, for example, to select button 1314 then to select connecting point 1355 then to select connecting point 1353. A graphical link 1354 is then automatically generated. If desired, "View" menu 603 can be reselected to hide all connecting points and their links.

It is possible to name the connecting points, as is done, for example, for connecting point 1448, "C3". In this case, the name of the connecting point is repeated in subscreen 1330, if the option to display names of connecting points is activated.

The routing algorithm is executed by selecting the "Synthesize cabling" option in "Edit" menu 602. It is then possible to view the result. In FIG. 14, segments 1451 to 1455 have been synthesized. By clicking on each of these segments, there is obtained the list of component-component or component-connector or connector-component links or wires that are inscribed in each of these segments.

For example, if engine 406 possesses a three-pin connector, one of low power for control, one of high power for supply and the third for ground, the following list is obtained:

Engine-1-control datum of engine 406
Engine-2-supply of engine 406
Engine-3-ground of engine 406

If these three pins are associated respectively with three pins of connector 1447, C1, the following list is seen:

C1-3-control datum of engine 406
C1-5-supply of engine 406
C1-1-ground of engine 406

Then, by clicking on link 1452, it is seen in the display that, on the segment between routing points 1470 and 1472, there circulate the following reference links:

Engine-1-control datum of engine 406; C1-3-control datum of engine 406
Engine-2-supply of engine 406; C1-5-supply of engine 406
Engine-3-ground of engine 406; C1-1-ground of engine 406

FIG. 15 represents the screen that appears when "Vehicle Z23" is selected and "Func" tab 612 is selected. There is then obtained in graphical part 1530, at the right of the screen, a graph whose nodes are service variants and whose arrows are data flows exchanged between the service variants. Such a data flow represented by an arrow between a departure service variant and an arrival service variant is defined by the set of data that are produced by at least one elementary operation of the departure service variant, that are not produced by any elementary operation of the arrival service variant but that are consumed by at least one elementary operation of the arrival service variant.

The inter-service data flow such as represented in FIG. 15 is generated for a choice of a service variant for each service corresponding to a configuration. For the person skilled in the art, these data flows make it possible to flag the data for which precautions are to be taken during development. In fact, the data between services and their characteristics must be validated for each service that consumes or produces them, in contrast to the data intrinsic to a service, the perfecting of which data is derived solely from the said service.

In the screen illustrated in FIG. 15, it is possible to represent the integrality of the exchanges between all services of the product or the exchanges of a subset of services, by copying the said subset of services into a product architecture for example created for the occasion, and by considering the corresponding graph in graphical part 1530.

FIG. 16 represents a screen that appears by selecting "HWD" tab 615, "Network" tab 1232 and UCH node 1621 in hierarchical list 1220. There then appears, in graphical part 1630, a network view that follows the same conventions as the view described in graphical part 830 illustrated in FIG. 8. Only the networks on which UCH node 1621 is present are then displayed, in contrast to what is represented in FIG. 8, where all networks are displayed. Tabs in a zone 1640 make it possible to select the different networks of architecture 1654, 1656, 1658. Selecting "all" tab 1652 makes it possible to display all networks in graphical part 1630 and cancels the selection of UCH node 1621.

By clicking on a given network, there is obtained the set of data circulating on that network, while distinguishing in particular those that are not stocked in frames, those that are stocked and are present, those that are stocked and are absent.

The method for designing a specification of a service variant is detailed in FIG. 17.

Steps 1712 and 1714 are syntheses effected automatically for the tool, while the other steps are assisted by virtue of the ergonomics of the tool but are left to the initiative of the designer.

During design of the specification of a service variant, the use cases are first specified (step 1702). Once the use cases have been specified, there are identified the operating phases, the client requests which are the transitions, and the system responses which are the states (step 1704). The phases are defined preferentially by their decomposition into transverse modes, as is presented in FIG. 7. Preferentially, two phases should not share a combination of transverse modes. It is then possible to synthesize a first automaton describing the supervision of the service, such as detailed in FIG. 7. The starting point for that purpose is the association of use cases with triplets (departure state, client request, arrival state) as proposed by the user.

From these first three steps, supported by the REQ tab of the tool, a control automaton of the service is automatically synthesized for all use cases of the service (step 1712).

This is followed by the steps of correction (step 1714), and completion (step 1716), which make it possible to perfect the automaton and enrich the use cases (step 1720) as a function of new situations, identified in particular during the completion step (step 1716).

In parallel with the steps of developing the control automaton of the service (steps 1712, 1714 and 1716), there are specified the elementary operations executed in each of the states of the control automaton of the service (step 1706).

Similarly, certain elementary operations executing phase transitions are identified (step 1708), as well as elementary operations executing client requests (step 1710). The execution of a phase or state transition by an elementary operation is represented preferentially by an elementary operation whose result is a Boolean which, when it has the Boolean value of "true", results in activation of the said transition. In equivalent manner, but for more generality, it is possible to specify that the transition operates for a particular value of one of the outputs of the elementary operation that executes it.

When steps 1706, 1708 and 1710 are partly or completely executed, the data flow between the elementary operations specified in the course of these steps is synthesized (step 1718).

It is then possible to synthesize a model of the specified service variant (step 1722), by supplementing, with the description of sensors and actuators preferentially attached to the service and of corresponding drivers, particularly the automaton synthesized in the course of step 1712 and the different elementary operations attached thereto.

FIG. 18 describes a method for designing an electrical and electronic architecture that makes it possible to understand not only the interactions between the different steps of the method described in the invention but also the different views proposed by the tool.

As the starting point, a specification of the configurations of the product is specified by the user (step 1802). It indicates the different configurations, characterized in particular by a set of service variants and a set of calculator variants. For each configuration, there is indicated a percentage corresponding to the ratio of the number of products containing the said configuration divided by the total number of products. Once this step has been executed, a specification of each service variant is produced (step 1806), in particular by applying the method described in FIG. 17. It is then possible to proceed automatically to validations of the service architecture (step 1808—described later). For a set of configurations specified in the course of step 1802, there is specified a set of nodes and of networks connecting them and, for each node, a set of calculator variants (step 1810). In addition, the product geometry is specified (step 1804). Once steps 1806 and 1810 have been partly or completely executed, it is possible to map the services onto the different nodes (step 1812). There is then automatically executed a synthesis of the control of the services (step 1816) as well as the synthesis of the exchanges, in particular on the different data buses (step 1818). On the basis of exchanges on the buses (step 1818), it is possible to specify an electronic messaging system or to generate it automatically (step 1826), for example by means of the method described in French Patent Application No. 01-05713 of 27 Apr. 2001, which is incorporated here by reference.

In addition, the different calculator variants specified in the course of step 1810, and the different sensors and actuators, in particular those attached to the service variants specified in the course of step 1806, are mapped onto the geometric description of the vehicle (step 1814). The routing points, connecting points, connectors and prohibited zones are mapped similarly (step 1820).

On the basis of mapping of the different electrical and electronic components (step 1814) and of the description of the geometric constraints (step 1820), there is synthesized the routing of the signals, in particular those for data, power or links to ground (step 1822).

In addition, the characteristics of the different elementary operations are specified in terms of code volume, necessary random-access memory space and CPU consumption (step 1824). Given the routing (step 1822) on the one hand and the specification of the resources necessary for execution of the software components that execute the elementary operations (step 1824) on the other hand, there is deduced an estimate of the cost of the system on the basis of the cost of the electrical architecture (sensors, actuators, wires, connectors) and the cost related to the types of inputs-outputs and to the choice of processors imposed by mapping (step 1830). This synthesis (step 1830) is executed by taking into account in particular the optimization imposed by splices on the power and ground wires (step 1828). Finally, once all these steps have been executed, the evaluated architecture can be compared with other architectures, in particular by a cost, quality or weight criterion, and especially by a cost criterion that in particular consolidates the quality and weight criteria (step 1832).

In order to achieve a consolidated quality estimate, several steps must be executed:
- automatically calculating a measure of quality for execution of one elementary operation and for execution of a set of elementary operations on a calculator, given a measure of quality for each type of input-output, for each type of wire (power, ground, data) and given a measure of quality for execution of an instruction on a calculator, for an access to random-access memory and for an access to flash memory,
- automatically calculating the quality of the routing
- taking into account a measure of the quality of the sensors and actuators
- automatically deducing the quality of the electrical and electronic architecture The operations of validation and support therefor by traceability means are not described in FIG. 18, nor is control of operating safety, but they supplement this figure recapitulating the global method.

As regards the configurations, it is possible to distinguish:
- the basic services, which may be required by law or are commonplace in vehicles (lighting, windshield wipers, etc.),
- the basic services with variants, such as motor function in a vehicle, which may be based on a gasoline or diesel internal combustion engine, on an electric motor or on a hybrid motor, for example, with a different implementation in each case,
- the services that will not necessarily be integrated into all products and that can be characterized as optional. An example is air conditioning in an automobile.

The service is configured by selection of a set of service variants (optional or otherwise). The optional services of the configuration are those that are not always present.

For a given configuration, the installation proportion of optional services will be given in particular as a percentage.

For a given product, different configurations will be envisioned.

Considering all of the configurations, the respective percentage of each configuration will be given, for example in the form of a percentage.

Taking an automobile as an example, a distinction is made between the luxury, comfort and "eco" (for "economic") configurations with, for example, an air-conditioning service in 100% of the luxury configuration, 40% of the comfort configuration and 0% of the eco configuration. The luxury, comfort and eco configurations will potentially represent respectively 20%, 50% and 30%.

The configurations planned for a product have an impact on the choice of hardware architecture of the product. For example, air conditioning with a low installation proportion (10%) will be reason to implement this air conditioning by means of a specific calculator, whereas, if the air conditioning is present 100% of the time, there will be a tendency to integrate the software and the corresponding hardware interfaces in a calculator that combines numerous other services. It is in fact costly to multiply the number of electronic calculators, and in practice it is desirable to integrate as many services as possible in order to lower the costs.

The configurations are also used to make the choices of cabling, the foregoing example of air conditioning readily demonstrating this, since the cabling for a specific calculator will have a cost different from that of the cabling for a non-optional calculator. The choice of an optimal electrical-electronic architecture is therefore made preferentially as a function of a pre-defined set of configurations.

The configurations are also used to manage the diversity, by making it possible to limit the available combinations of options for each design.

They also represent an intermediate element that makes it possible to simplify the validations, as will be seen hereinafter.

Via the step of mapping of services onto calculators, it is possible to deduce the calculator configurations associated with a service configuration. These are in particular calculators that contain at least one elementary operation of at least one service of the service configuration. The optional character of the calculator is also deduced; a calculator containing in particular elementary operations attached solely to optional services will potentially be optional.

Nevertheless, configurations of calculators and hardware components can be defined, in particular if the mapping step is not yet executed.

When a configuration is specified as being composed of a service configuration and a calculator configuration, it is assumed that every service of the service configuration is indeed entirely mapped onto the calculator configuration and that, reciprocally, the elementary operations originating from services that are not in the service configuration are deactivated on the said calculator configuration.

A constraint associated with the configurations is integrated into the choice of an optimal routing. A component in which at least one variant is absent from at least one configuration is said to be optional. The economically optimal routing is, for example, that which satisfies the following constraints:

1) it is not possible to link a component (sensor, actuator) to an optional node in such a way that there exists at least one configuration in which the node is absent and the component is present. Thus, in the search for the routing of the said component, the nodes that do not satisfy the foregoing criterion are not considered.

2) it is not possible to connect into a power splice two wires that would not be present in the same configurations.

3) under the foregoing assumption 1), when the routing of a wire originating from an optional component C is synthesized and when the optimal routing ends at a node $N_n$ such that there exists at least one configuration in which node $N_n$ is present and component C is absent, then an attempt is made to synthesize at least one other routing by considering all the nodes other than $N_n$ that satisfy condition 1). The routing then links the component to a new node $N_{n+1}$. This operation is iterated until there is found a node $N_p$ such that $N_p$ is the last node traversed that satisfies 1). For the set of routings synthesized in this way (the last being routing $N_p$), there is applied the cost calculation weighted by the installation proportion of the different components, meaning that a component that is present in 40% of the configurations will have a cost weighted by 0.4. The routing that minimizes the cost is the economically optimal routing for the set of configurations.

For example, it is possible to allocate the air-conditioning compressor to the air-conditioning node (optional, and installed specifically for the air-conditioning service) or to the passenger-compartment calculator node (always present). The connection to the air-conditioning node costs two euros, for example by integrating the cost of one euro for the connector of the calculator for the connection to the compressor and to the other components, and the cost of one euro for the wires, compared with one euro for the passenger compartment controller. If the installation proportion of air conditioning exceeds 50%, then it is necessary to route the compressor to the passenger-compartment controller node, otherwise to the air-conditioning node. For example, with an installation proportion of 40% and for one hundred units, the routing to the passenger-compartment node costs 1*100*1 euros, equaling one hundred euros, whereas the routing to the air-conditioning node costs 0.40*100*2 euros, equaling eighty euros.

Knowledge of the relative costs of the drivers as a function of the number of units makes it possible to refine the economic estimate. If a driver of PWM type (pulse width modulation) costs 1 euro for a series of 40,000 units but only 0.5 euro for a series of 100,000 units, then for a series of 100,000 units and an air-conditioning installation proportion of 40%, the cost of the driver on the air-conditioning calculator will be 1 euro, whereas the cost of the driver on the UCH calculator will be 0.5 euro, and the economic equation becomes 100+100*0.5 euros, equaling 150 euros for the UCH and 80+0.4*100*1 euros, or 120 euros for the scenario of routing on an air-conditioning calculator. It is therefore always of interest to choose the "air-conditioning calculator" scenario.

If there is now estimated an installation cost, calculated as a function of

- a cost of installing a strand necessary for implementation of the air conditioning on the cockpit zone, for example,
- a cost of installing a connector necessary for implementation of the air conditioning on a boundary of the cockpit zone or on the cockpit zone,
- a cost of installing the air-conditioning and/or passenger-compartment calculator on the cockpit zone or another zone specified by the designer,
- a cost of installing sensors or actuators necessary for implementation of the air conditioning on a zone and
- a cost of connecting the different actuator connections necessary for implementation of the air conditioning between zones or in a zone, then, given an evaluation of 1 euro for the optional air-conditioning calculator and of 2 euros for the passenger-compartment calculator and assuming an installation proportion of 40% for the air-conditioning service, the option of routing on the air-conditioning calculator comes to 120 euros+0.4*100*1+1*100*2 euros, or 360 euros. whereas the cost of routing on the passenger-compartment calculator is 150 euros+1*100*2 euros, or 350 euros.

Suddenly the air-conditioning calculator is no longer justified. Let us further refine our analysis.

For both the air-conditioning calculator and the passenger-compartment calculator, let us assume a quality impact of 100 ppm (failures per million) over 3 years, a typical warranty period. In addition, let us estimate the mean cost of replacing the calculator as 200 euros and let us assign an installation/removal cost of 50 euros for the zone in which the air-conditioning calculator is located and of 10 euros for the zone in which the passenger-compartment calculator has been placed. Let us also suppose that the quality defects associated with the cablings are identical and equal to 100 ppm for the two scenarios, but that the repair cost is negligible except for removal. For simplicity, it is assumed that the majority of the cabling under consideration is located in a 50-euro zone, just as the air-conditioning calculator. The unit cost for replacement of the calculator is then 100*200/1,000,000, or 0.04 euro, to which there must be added 0.01 euro for the air-conditioning calculator and 0.002 euro for the air-conditioning calculator. The cost of repair of the cabling is 0.01 euro per defect over the entire cabling that is present only when the air-conditioning option is chosen. Our consolidated unit cost integrating the quality defects is therefore now 360+0.4*100*((0.04+0.01) (calculator)+0.01 (cabling)) euro, or 362.4 euros, whereas the scenario with passenger-compartment calculator now costs 350+0.4*100*0.01, or 350.4 euros, if there is taken into account the fact that the quality costs associated with the passenger-compartment calculator are present identically in both scenarios and that the cabling specific to the air-conditioning option is installed only when the air-conditioning option is chosen. Let us note in passing that the number of ppm of the scenario with the air-conditioning calculator is 0.4*(100+100), or 80 ppm, whereas the number of ppm of the scenario without the air-conditioning calculator is 0.4*100, or 40 ppm, after subtraction of the ppm associated with the passenger-compartment calculator, a value that is constant in both scenarios. At the quality level, the scenario without air-conditioning calculator is therefore preferable.

If the weight impact is now taken into account and the consolidated cost of a load of one kilogram is estimated as 1 euro then, given on the one hand a weight of 300 grams for the air-conditioning calculator and of 100 grams for the routing, to the air-conditioning calculator, of actuators specific to the air conditioning, and on the other hand an extra weight of 150 grams for the passenger-compartment calculator and of 150 grams for the routing, to the passenger-compartment calculator, of actuators specific to the air conditioning, it is now found that the cost of the scenario with the air-conditioning calculator, again per one hundred units, is 362.4+0.4*100*0.4 (400 grams)*1 (cost per kilogram) euros, or 378.4 euros and 350.4+0.4*100*0.3 (300 grams)*1+ 0.6*100*0.150*1, or 363.3 euros, for the scenario with passenger-compartment calculator. In passing, it has been seen that the hypothesis with the air-conditioning calculator involved an extra weight of 400 grams, whereas that for mapping the air conditioning onto the passenger-compartment calculator is 300 grams when the air conditioning is installed. As a weighted mean, the weight of the scenario with the air-conditioning calculator is 0.4 (installation proportion) *0.4 (kilograms), or 160 grams, whereas the weight of the option without air-conditioning calculator is 0.4 (installation proportion of air conditioning)*0.3 (300 grams)+0.6 (without air conditioning)*0.150 (surplus calculator weight), equaling a marginal weight of 129 grams, and it is this last cabling that is optimal as regards weight.

To conclude, it is still necessary to take into account the cost of execution of the elementary operations of the air-conditioning service in each of the scenarios, which cost must be consolidated in the piece cost of the calculators. Let us suppose that the elementary operations of air conditioning necessitate 1 MIPS and that the marginal cost of MIPS in a processor is entered in a nomogram and that it gives 2 euros for 1 MIPS and 10 euros for 20 MIPS and 9.6 euros for 19 MIPS. Let us also suppose that, independently of the air-conditioning service, the passenger-compartment calculator reserves 19 MIPS for execution of elementary operations.

Finally, let us adopt the hypothesis of a linear cost of 1 euro per 2 kilobytes of RAM and a linear cost of 4 euros per megabyte of flash memory. Finally, the elementary operations of the air-conditioning service necessitate 2 K of RAM and 100 K of flash memory. In this case, the consolidated balance per 100 vehicles for the two scenarios becomes: 378.4+0.4*100*(2+1+0.1*4) euros, or 514.4 euros for the scenario with an air-conditioning calculator, whereas, in the case in which the code is executed entirely on the passenger-compartment calculator, the cost becomes: 363.3+1*100* ((10−9.6)+1+0.1*4) euros, or 543.3 euros.

In the final analysis, therefore, the unit consolidated cost of the solution with air-conditioning calculator is 5.14 euros, whereas the cost of the solution without air-conditioning calculator is 5.43 euros per unit, assuming a series of 100,000 vehicles and an air-conditioning installation proportion of 40%.

The system architecture design tool described in the foregoing makes it possible to achieve a plurality of validations throughout the design process. There are distinguished functional validation, which consists in verifying that every datum consumed by an elementary operation must be produced by an elementary operation independently of the link of the elementary operations to the different services. This step can be executed once the functional architecture has filled in the REQ and FUNC windows, which are accessible via tabs 611 and 612.

Functional validation after mapping, which consists in verifying that every datum consumed by an elementary operation must be produced by an elementary operation, and, in addition, that a pathway that may be composed of intermediate networks and nodes exists between the producer and the consumer. This step can be executed once mapping of the services has been executed completely or partly in the MAP window, which is accessible via tab 613.

Functional validation and validation of the electronic messaging system, which consists in verifying that every datum consumed by an elementary operation must be produced by an elementary operation, and, in addition, that a pathway that may be composed of intermediate networks and nodes exists between the producer and the consumer, and, in addition, for at least one pathway, sites in the frames are provided for transporting the datum from the producer to the consumer. This step can be executed when the data frames have been executed, partly or completely by means of the HWD and MSG windows, which are accessible via tabs 615 and 616.

Validation of the architecture of the services per configuration and/or per mode, which consists in applying the three foregoing validations on the one hand for each configuration of the product and on the other hand for each transverse mode of the product.

For example, for a configuration whose only options and choices of calculator are air conditioning present or not present and gasoline or diesel control, the validations must therefore be applied to the four resultant variants: gasoline with or without air conditioning, and diesel with or without air conditioning. As regards validation for a given mode, the configuration being fixed, each type of validation can be reproduced except for the subset of elementary operations that are potentially active when the engine is stopped.

These validations are accessible via a user menu (not illustrated), which can be accessed by clicking on Tools tab 606 shown in particular in FIG. 6. In this user menu, it is possible to choose on the one hand one of the three validations— functional validation, functional validation after mapping, and functional validation and validation of the electronic messaging system—and on the other hand the perimeter to be adopted for these validations, the subset of calculator variants and/or of service variants, the mode or set of modes, and/or the configuration or set of configurations on which these validations must be executed.

All of these validations are executed automatically on the basis of data specified in the system architecture design tool.

Given a use case, a performance constraint is imposed on this use case as well as on certain of the elementary operations executed in the arrival state of the said use case, and the fact that this performance constraint is satisfied is validated for a mapping of different elementary operations.

As an example, let us take the use case that we will call CRASH: "In an engine running context, if a crash is detected, then the vehicle must undergo emergency unlocking". To implement this case, a "crash detected" request is specified. It is executed by an elementary operation that senses the value given by an accelerometer "A". This value is "a". The acceleration-sensing software driver corresponds to the program "P1". In this case, the arrival state of the CRASH use case is for example, a state that we will call "Emergency unlock". In this state, the elementary operation of "unlock doors" is executed. It corresponds to a datum "d" set to 1, which controls via a software driver P2 that controls door locks Vi. If a performance constraint of 100 ms is imposed on execution of the CRASH use case, this means:

that the accelerometer has detected a crash value "a"
that the value of "a" has been refreshed by executing driver P1
that entry into the emergency unlock state has been executed
that datum "d" has been set to 1
that software P2 has been executed
that locks Vi have operated all in less than 100 ms. Some of these steps are parallel and others are sequential.

If, in addition, the accelerometer is now mapped onto an airbag calculator and control of the locks is mapped onto another calculator, such as the passenger-compartment calculator, and these two calculators are connected by a CAN bus on which datum "a" is transported by a frame T, then the constraint of 100 ms now means:

that the accelerometer has detected a crash value "a"
that the value of "a" has been refreshed by executing driver P1
that the value of "a" has been written into the CAN driver of the airbag calculator in order to send frame T
that frame T has circulated on the bus
that frame T has been read and the value of "a" has been extracted by the CAN driver of the passenger-compartment calculator
that entry into the emergency unlock state has been executed
that datum "d" has been set to 1
that software P2 has been executed
that locks Vi have operated all in less than 100 ms. On the basis of this list, performance requirements for execution of each of these steps must be established. For example, it may be proposed that frame T be sent every 20 ms, leaving 80 ms of execution time for the other operations, which are executed sequentially before or after the frame has been sent. If this hypothesis proves too difficult to maintain, the transmission time of T will be shortened to 10 ms, for example. In contrast, if it is seen that the network via which T is transported is very loaded, it will be attempted to impose a requirement that T be sent every 30 ms and that all operations that must take place before or after T has been sent be executed in less than 70 ms.

Reciprocally, if performance requirements were imposed on these diverse operations, it is possible to verify that the sum of these operations indeed comes to less than 100 ms. Finally, if certain requirements are specified but not others, the time remaining for execution of all the operations on which no constraint has been imposed is deduced from the already specified requirements.

If a search is made for an anomaly related to execution of the CRASH use case, it means that priority can be given to searching for the causes among the different components that execute the CRASH use case, such as:

the accelerometer has detected a crash value "a"
the value of "a" has been refreshed by executing driver P1
entry into the emergency unlock state has been executed
datum "d" has been set to 1
software P2 has been executed
locks Vi have operated In this way there can be automatically synthesized the list of elementary operations, of executions of drivers, writes and reads in frames, of taking information into account by sensors and actuators and of frame transfer on a network, and in particular there can be described all the operations to be effected during execution of a use case, in order to know exactly in which set of objects to search for the cause of a defect detected during execution of the CRASH use case.

Once mapping has been executed, the elementary operations that must be operational can be automatically identified in each transverse mode t. When at least one elementary operation is functioning on a calculator, this means that the calculator must be initialized, even partly, in the corresponding mode. When no elementary operation is being executed in a given transverse mode on a calculator, that means that it can be deactivated.

In certain cases, the cabling generated automatically by our inventive method is not that which is desired. For reasons of simplicity of the topology of the cabling or in order to facilitate grouping of wires in strands, it may be necessary to increase the length of certain wires in non-optimal manner, albeit without having to repeat everything. This is a matter of a perfecting step. A typical case is described in FIG. 19, where routing points (1901), 1903, 1904 were mapped into an undefined zone in order to permit synthesis of the cabling, in particular between component 1907 and calculator 1909. The automatically generated routing made it possible to identify the pathway composed of segments 1911, 1917 and 1919. Other components are directly allocated to 1901, and the system designer wishes to allocate component 1907 to routing point 1901 and eliminate segment 1911 by passing his wires via pathway 1913 followed by 1915. To solve this problem, the routing can be modified manually once the routing has been generated.

Figure 20A:
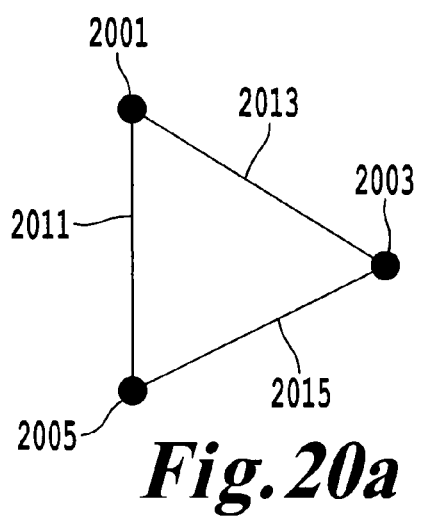
Figure 20B:
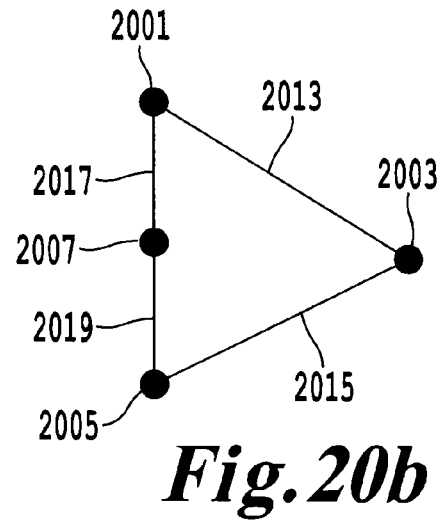
Figure 20C:
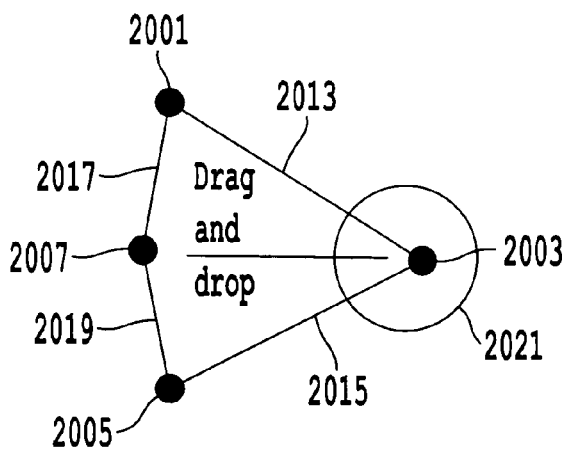

FIGS. 20a to d illustrate the different steps of manual modification of the routing. In FIG. 20a, the routing of a cabling passes through points 2001 and 2005 as well as segment 2011. The user wishes to make this cabling pass via routing point 2003 and no longer to pass via segment 2011, but instead via segments 2013 and 2015. The first step, illustrated in FIG. 20b, is to create a routing point 2007 on segment 2011. That can be executed according to data-processing means by clicking on segment 2011 in a "manual modification of the cabling" mode of operation, which can be activated, for example, by clicking in a drop-down menu during selection of segment 2011. When routing point 2007 appears, segment 2011 is divided into two segments 2017 and 2019. Then, as illustrated in FIG. 20c, routing point 2007 is dragged until it reaches zone 2021, close to point 2003. Upon reaching the said zone, point 2007 coincides with point 2003. In one implementation of the method by means of a data-processing tool, it is possible, for example, to select point 2007 and to drag it by moving the mouse into zone 2021, while keeping it selected. Zone 2021 is typically a circle centered on point 2003, with a radius shorter than half the shortest distance from a routing point with routing point 2003.

Figure 20D:
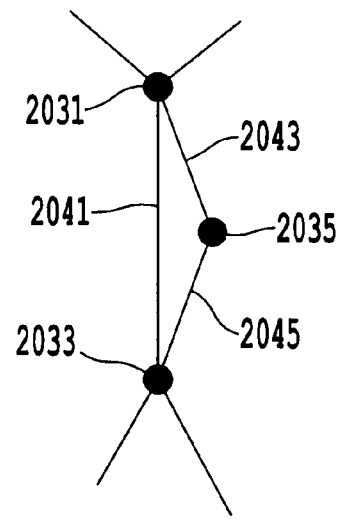

By proceeding in this way, it is possible in certain circumstances to arrive at a situation in which a routing point becomes useless. FIG. 20d illustrates such a case, in which point 2035 becomes superfluous and it is then desired to make it disappear and to make the cabling pass via segment 2041 and in addition via segments 2043 and 2045. Using a data-processing means, this can be implemented by selecting point 2003 which it is wished to eliminate, by adopting a "manual modification of the cabling" mode of operation that can be activated, for example by clicking in a drop-down menu during selection of point 2003, then pressing the "delete" key of the keyboard, or by selecting an "erase" item in a drop-down menu that is accessible during selection of point 2003.

It will be noted at this stage that a pathway can be completely modified iteratively by applying the succession of operations 20a, 20b, 20c and 20d several times. These steps are applied in the case in which the new routing point is a connecting point between zones. In this case, the cabling that passed via another connecting point between zones must be modified more consistently. In such a case, the cabling is generated automatically, starting from the zone. In addition, the modification does not necessarily concern all the wires present in a segment. In FIG. 20c, for example, it may be that it is desired that certain wires passing via segments 2017 and 2019 be deviated via segments 2013 and 2015 and not others. Such modifications may be necessary for reasons of fault tolerance, when two redundant signals are made to pass via different pathways in order that these two signals are not effected by the same event, such as cut of a bundle during a collision. If routing point 2003 is a connector, it is necessary to add as many connecting pins via this connector as there are added wires during manual modification of the cabling.

In contrast to European Patent 0696775A1, a 2-D topology is not a prerequisite in the present invention. A 2-D topology is a result of the method of the present invention, and consequently it can be used, for example, as an input of such systems. Also, according to the present invention, the pathways are generated automatically. It is evident that the design method and corresponding tool permit "top down" approaches, by following the tabs in order, as explained in the description, as well as "bottom up" approaches, or in other words by following any specification order desired by the designer, including by selecting the tabs in the order inverse to that explained in the description.

It will also be understood that the procedure of the present invention can be executed in the form of a computer program and stored in the memory of a computer. It will be possible to produce manufactured articles in which it will be possible to store such computer programs.

The invention claimed is:

1. A method for synthesizing a routing for an electrical and electronic architecture of at least one part of a product including electrical wires and electrical and electronic components, the method comprising:

representing a geometry of the product, divided into different zones, in two dimensions;

mapping routing points for routing of said electrical wires into the different zones, wherein each zone includes a plurality of said routing points;

mapping connecting points between the different zones, wherein each zone includes at least one of said connecting points;

mapping said electrical and electronic components into the different zones, wherein each zone includes a plurality of said electrical and electronic components;

undertaking a routing synthesis as a function of the geometry of the different zones and of the positions of the routing points, of the connecting points, and of the components;

undertaking an evaluation of the routing on a basis of quality and/or cost of said routing; and depending on a result of the evaluation, modifying sites of the routing points, of the connecting points, and/or of the electrical and electronic components, and repeating the routing synthesis and evaluation.

2. A method according to claim 1, wherein at least one connecting point corresponds, in the product, to one connector and/or at least one routing point corresponds, in the product, to one connector.

3. A method according to claim 1, wherein, before the mapping electrical and electronic components, at least one of following choices is made:

choice of electronic control units, choice of communication networks, choice of sensors and actuators, choice of fuse and relay boxes, choice of an electrical and electronic architecture.

4. A method according to claim 1, wherein, before undertaking the routing synthesis, characteristics are specified for the electrical and electronic components.

5. A method according to claim 1, wherein, after synthesis of the routing, cabling composed of the synthesized routing and of connectors is visually displayed.

6. A method according to claim 1, further comprising validating one routing among those evaluated, and calculating a technical specification for cabling composed of the validated synthesized routing and of connectors, and calculating a cabling cost and/or calculating a measure of quality.

7. A method according to claim 1, wherein the product is a vehicle and the different zones of the vehicle contain at least one of the following zones:

a zone of a front face, a zone of a hood, a zone of an instrument panel, a zone of a roof, a zone of a trunk and tailgate, above and below the foregoing zones, a zone of a right front fender and of a left front fender, a zone of a right front door and of a left front door, a zone of a right column and of a left column, a zone of a right rear door and of a left rear door, a zone of a right rear fender and of a left rear fender, between the zone of the instrument panel and those of the right front fender and of the left front fender, the zones of the right front column and of the left front column, between the zone of the trunk and those of the right rear fender and of the left rear fender, the zones of the right rear column and of the left rear column, a zone above a floorboard, and a zone below the floorboard.

8. A method according to claim 1, wherein, for each electronic component, data pins associated with drivers and data, power pins corresponding to a supply, and ground pins are specified, and routing of data wires originating from data pins to the electronic components are automatically synthesized.

9. A method according to claim 1, wherein, for an automatically generated cabling, the cabling is manually modified such that:
   a) an end segment of routing points A and B is selected;
   b) a new routing point C is added to the segment;
   c) the new routing point C is associated with an existing routing point D via which a user preferentially wishes to make the cabling pass;
   d) the initially selected segment is deleted and segments AD and DB are generated if they do not already exist, and the initial routing AB is replaced by the routing AD and DB; and
   e) the automatically generated cabling is modified by iterating a)-d).

10. A method according to claim 9, wherein a subset of wires passing via the segment AB is selected in a).

11. A manufactured article comprising:
   a computer storage means having a computer program for designing a specification of a hardware and software system,
   the program comprises a code for execution of the method defined in claim 1.

12. A method according to claim 1, wherein said product is a vehicle, wherein said step of representing is performed by dividing said vehicles in different zones of said vehicles; and wherein said electronic and electrical components include electronic control units, sensors, actuators, fuse boxes, relay boxes, and energy sources for said vehicle.

13. A method according to claim 12, further comprising defining prohibited subzones in each of said different zones, and said mapping of said routing points is performed such that said electrical wires are not routed through said prohibited subzones.

14. A method according to claim 13, wherein vertices of said prohibited subzones are routing points.

15. A method according to claim 13, further comprising validating a routing between a first routing or connecting point A and a second routing or connecting point B if said routing does not cross any prohibited subzone and if there does not exist a routing point C that can be reached without crossing a prohibited subzone and such that the lengths of segments AC and BC are shorted than the length of segment AB.

16. A method according to claim 15, further comprising enumerating all validated routings and selecting a shortest routing.

17. A method according to claim 1, wherein said undertaking of said evaluation of the routing is performed by evaluating a cost of said electrical and electronic architecture.

18. A device for synthesizing a wiring for an electrical and electronic architecture of at least one part of a product including electrical wires and electrical and electronic components, the device comprising:
   means for representing, in two dimensions, a geometry of the product, divided into different zones;
   means for mapping, into the different zones, routing points for routing of said electrical wires, wherein each zone includes a plurality of said routing points;
   means for mapping connecting points between the different zones, wherein each zone includes at least one of said connecting points;
   means for mapping said electrical and electronic components into the different zones, wherein each zone includes a plurality of said electrical and electronic components;
   means for synthesizing a routing as a function of the geometry of the different zones and of the positions of the routing points, of the connecting points, and of the components;
   means for evaluating the routing on a basis of quality and/or cost of said routing; and
   means for modifying sites of the routing points, of connecting points, and/or of electrical and electronic components.

19. A device according to claim 18, wherein the two-dimensional representation of the zones onto which the components are mapped comprises a global view of all of the zones and means for adding or removing zones.

20. A device according to claim 19, wherein, when a zone is selected in the global view of all zones, a local view of the zone appears, in which local view geometric characteristics of the zone can be specified.

21. A device according to claim 20, wherein the local view of a zone is edited by clicking and dragging, by an icon of a tool, routing points, connecting points, prohibited subzones, and/or ground points.

22. A device according to claim 18, wherein a routing point or a connecting point between zones can be transformed to a connector by clicking on an attribute of the routing or connecting point.

23. A device according to claim 18, wherein siting of different electronic components is specified by clicking and dragging a representation of the components in a hierarchical list.

24. A device according to claim 18, wherein the routing of different electronic components is automatically synthesized.

25. A device according to claim 18, wherein, for each electronic component, data pins associated with drivers, themselves associated with data, power pins corresponding to a supply, and ground pins are specified, and the routing of wires corresponding to the wires to the electronic component control units are automatically synthesized.

26. A device according to claim 18, wherein, if an electronic component is connected to a calculator in a system architecture design tool, then, during synthesis of the routing, data pins of the electronic component are connected to the calculator.

27. A device according to claim 18, wherein a cost of an electrical and electronic architecture is calculated automatically as a function of at least one function or evaluation.

28. A device according to claim 27, wherein the function or evaluation comprises:
   a cost function of the connectors, based on a nomogram that shows an estimate of the price of the connectors as a function of a number of data, power, and ground connections, or based on a mean price assigned to each connection of a data, current, or ground wire;
   an evaluation of the cost of the electronic components; or
   a function of the cost of the wires based on their length and type, or taking a mean linear weight for power and ground wires, a mean linear weight for data wires, and a cost per unit mass of the component in which the wires are manufactured.

29. A device according to claim 18, wherein, given a mean cost for software and hardware drivers of different drivers and given a cost of implementation of an elementary operation, a cost of an electronic component of a complete electrical and electronic architecture is automatically estimated.

30. A device according to claim 18, wherein, given a synthesized routing and measures of quality for the connectors and portions of wire of different zones, a measure of quality of an electrical and electronic architecture is automatically estimated.

31. A device according to claim 18, wherein, given a measure of quality of the different electronic components mapped into the different zones, the quality of an electrical and electronic architecture is automatically estimated.

32. A device according to claim 18, wherein
given a measure of quality for each type of inputs/outputs and for each type of wire, and given a measure of quality for execution of an instruction on a calculator, for access to random-access memory and for access to flash memory,
a measure of quality for execution of an elementary operation and for execution of a set of elementary operations on a calculator is automatically calculated.

33. A device according to claim 18, wherein, in each zone, routing points that are candidates for grouping power and ground wires into splices are automatically determined, and that which minimizes the wire length in the zone is automatically chosen.

34. A device according to claim 33, wherein the splices are taken into account in cost and quality evaluations.

35. A device according to claim 18, providing a system representation tool, the system comprising:
electronic components, each connected to at least one bus, and the tool representing, for each bus, components that are connected directly to the bus and, for components directly connected to at least two buses, for each of the at least two buses, associated with the component, an identifier of each other bus to which the component is directly connected.

36. A device according to claim 18, further comprising:
means for manual modification of an automatically generated cabling, the means for manual modification of the cabling comprising:
a) means for inputting a selection of an end segment of routing points A and B;
b) means for adding a new routing point C to the segment;
c) means for associating the new routing point C with an existing routing point D via which a user preferentially wishes to make the cabling pass; and
d) means for deleting the initially selected segment and the segments AD and DB and for generating the routings AD and DB if they do not already exist, the initial routing AB being replaced by the routing AD and DB.

* * * * *